(12) United States Patent
Kawano et al.

(10) Patent No.: US 8,624,690 B2
(45) Date of Patent: Jan. 7, 2014

(54) SURFACE ACOUSTIC WAVE DEVICE, OSCILLATOR, MODULE APPARATUS

(75) Inventors: Shuichi Kawano, Suwa (JP); Masashi Fujioka, Minowa (JP)

(73) Assignee: Seiko Epson Corporation (JP)

( * ) Notice: Subject to any disclaimer, the term of this patent is extended or adjusted under 35 U.S.C. 154(b) by 413 days.

(21) Appl. No.: 12/977,525

(22) Filed: Dec. 23, 2010

(65) Prior Publication Data

US 2011/0156840 A1   Jun. 30, 2011

(30) Foreign Application Priority Data

Dec. 28, 2009 (JP) .................. 2009-297056
Feb. 12, 2010 (JP) .................. 2010-028615
Feb. 24, 2010 (JP) .................. 2010-038404

(51) Int. Cl.
*H03H 9/64* (2006.01)
*H03H 9/25* (2006.01)
*H03B 5/32* (2006.01)

(52) U.S. Cl.
USPC .............. 333/193; 310/313 B; 331/107 A

(58) Field of Classification Search
USPC ............ 333/193–196, 133, 150–155; 310/313 R, 346; 331/107 A
See application file for complete search history.

(56) References Cited

U.S. PATENT DOCUMENTS

| | | | |
|---|---|---|---|
| 4,511,816 A * | 4/1985 | Mikoshiba et al. | 310/313 A |
| 5,401,544 A | 3/1995 | Nakahata et al. | |
| 5,446,329 A * | 8/1995 | Nakahata et al. | 310/313 A |
| 6,183,555 B1 * | 2/2001 | Shibata et al. | 117/98 |
| 6,534,895 B2 * | 3/2003 | Kadota et al. | 310/313 A |
| 6,593,679 B2 * | 7/2003 | Higuchi et al. | 310/313 A |
| 6,848,295 B2 * | 2/2005 | Auner et al. | 73/24.06 |
| 7,439,539 B2 | 10/2008 | Jeoung et al. | |
| 7,439,649 B2 | 10/2008 | Fujii et al. | |
| 2002/0070636 A1 | 6/2002 | Shibata et al. | |

FOREIGN PATENT DOCUMENTS

| | | | |
|---|---|---|---|
| JP | 55-068723 | * | 5/1980 |
| JP | 05-327398 | | 12/1993 |
| JP | 08-130435 | | 5/1996 |
| JP | 08-316779 | | 11/1996 |
| JP | 10-135773 | | 5/1998 |
| JP | 10-178330 | | 6/1998 |
| JP | 2001-196896 | * | 7/2001 |
| JP | 2002-152000 A | | 5/2002 |
| JP | 2002-237737 A | | 8/2002 |
| JP | 04-109709 B1 | | 7/2008 |
| JP | 2008-244523 A | | 10/2008 |

OTHER PUBLICATIONS

F. Zhong et al.; "AlN Acoustic Wave Sensors Using Excimer Laser Micromachining Techniques"; 2001 Materials Research Society Symposium, vol. 639, pp. G11.28.1-G11.28.6, 2001.*

H. Okano et al.; "Preparation of Aluminum Nitride Thin Films by Reactive Sputtering and Their Applications to GHz-Band Surface Acoustic Wave Devices"; Applied Physics Letters, vol. 64, No. 2, Jan. 10, 1994, pp. 166-168.*

* cited by examiner

*Primary Examiner* — Barbara Summons
(74) *Attorney, Agent, or Firm* — Harness, Dickey & Pierce, P.L.C.

(57) ABSTRACT

A surface acoustic wave device includes: a sapphire substrate having a C-plane main surface; an aluminum nitride film which is formed on the main surface of the sapphire substrate; comb-like electrodes which are formed on the surface of the aluminum nitride film to excite surface acoustic waves; and a silicon dioxide film which covers the comb-like electrodes and the surface of the aluminum nitride film.

18 Claims, 31 Drawing Sheets

SURFACE ACOUSTIC WAVE DEVICE, OSCILLATOR, MODULE APPARATUS

BACKGROUND

1. Technical Field

The present invention relates to a surface acoustic wave device using a C-plane sapphire substrate, an oscillator, and a module apparatus.

2. Related Art

A surface acoustic wave device which uses surface acoustic waves propagating on the surface of a piezoelectric film is used in a band-pass filter for a communication instrument, a resonator serving as a reference clock, or the like because of a unique transmission band, reduction in size, and a small number of components. When a surface acoustic wave device is used in a filter or a resonator, it is necessary that a frequency temperature coefficient (TCF) or a delay time temperature coefficient (TCD) representing temperature dependency or an electromechanical coupling coefficient ($K^2$) representing performance of electromechanical conversion is satisfactory.

A surface acoustic wave device has been suggested in which comb-like electrodes (IDT) are formed on an insulating substrate, such as glass, a piezoelectric film is formed to cover the surfaces of the comb-like electrodes, and a protective film is formed to cover the piezoelectric film (for example, see JP-A-10-178330).

A surface acoustic wave device has also been suggested in which a comb-like electrode is formed on a C-plane sapphire substrate and a piezoelectric film is formed to cover the surface of the comb-like electrode (for example, see JP-A-10-135773 and JP-A-8-130435).

In the surface acoustic wave device described in JP-A-10-178330, the insulating substrate, such as glass, is used as a substrate, and the comb-like electrodes, the piezoelectric film, and the protective film are formed on the insulating substrate in the form of a laminate, preventing penetration of moisture or foreign substances from entering and preventing deterioration or degeneration of the piezoelectric film due to an external atmosphere. However, if the material or the film thickness of the protective film is not sufficiently taken into consideration, the acoustic speed of surface acoustic waves, the electromechanical coupling coefficient, and temperature characteristics are changed, making it very difficult to obtain satisfactory characteristics.

In the surface acoustic wave devices described in JP-A-10-135773 and JP-A-8-130435, the comb-like electrode made of an aluminum-based alloy is formed on the sapphire substrate, and a zinc oxide (ZnO) film is formed to cover the comb-like electrode, improving stress migration resistance. In such a configuration, if the film thickness of the zinc oxide film is not sufficiently taken into consideration, the acoustic speed of surface acoustic waves, the electromechanical coupling coefficient, and temperature characteristics are changed, making it very difficult to obtain satisfactory characteristics.

When a zinc oxide is used for the piezoelectric film on the C-plane sapphire substrate, there is a great difference between the acoustic speed of the sapphire substrate and the acoustic speed of the zinc oxide, and the difference in the acoustic speed causes frequency fluctuation.

SUMMARY

Application Example 1

This application example of the invention provides a surface acoustic wave device. The surface acoustic wave device includes a sapphire substrate having a C-plane main surface, an aluminum nitride film which is formed on the main surface of the sapphire substrate, comb-like electrodes which are formed on the surface of the aluminum nitride film to excite surface acoustic waves, and a silicon dioxide film which covers the comb-like electrodes and the surface of the aluminum nitride film.

With this application example, since the sapphire substrate having a C-plane main surface (hereinafter, also referred to as a C-plane sapphire substrate) is used as a substrate, a high acoustic speed is obtained compared to a case where quartz, glass, or the like is used as a substrate. That is, it is possible to realize a high-frequency device.

The aluminum nitride film and the silicon dioxide film are set to have different signs of delay time temperature coefficients (TCD), making it possible to obtain satisfactory frequency temperature characteristics.

The aluminum nitride has an electromechanical coupling coefficient ($K^2$) greater than the sapphire substrate, and when the aluminum nitride is formed on the sapphire substrate, the crystallinity of the aluminum nitride is satisfactory. Therefore, it is possible to further increase the electromechanical coupling coefficient and to increase the excitation efficiency of surface acoustic waves.

The acoustic speed of the C-plane sapphire substrate is substantially the same as the acoustic speed of the aluminum nitride, such that it is possible to suppress frequency fluctuation due to the difference in the acoustic speed.

The silicon dioxide and the aluminum nitride have different signs of delay time temperature coefficients (TCD), making it possible to obtain satisfactory frequency temperature characteristics.

Application Example 2

In the surface acoustic wave device according to the application example of the invention, it is preferred that the surface acoustic waves which are excited by the comb-like electrodes are first-order Sezawa waves.

In this application example, the first-order mode is used from among the high-order modes of Rayleigh waves. When the first-order mode is used, the aluminum nitride film can be reduced in film thickness. Therefore, it is possible to suppress variations in the film thickness distribution, making it easy to suppress variations in the acoustic speed (frequency).

Application Example 3

In the surface acoustic wave device according to the application example of the invention, it is preferred that, when the thickness of the aluminum nitride film is ta, the thickness of the silicon dioxide film is ts, and the wavelength of the surface acoustic waves is $\lambda$, and when the relationship between the normalized film thickness of the aluminum nitride film expressed by KH—AlN=$(2\pi/\lambda)\cdot$ta and the normalized film thickness of the silicon dioxide film expressed by KH—SiO$_2$=$(2\pi/\lambda)\cdot$ts is represented in the following coordinates, KH—AlN and KH—SiO$_2$ within an area defined by connecting the coordinates in order of the coordinate 1 to the coordinate 13 and connecting the coordinate 13 and the coordinate 1 are used.

coordinate 1 (KH—SiO$_2$,KH—AlN)=(2.00,0.88)
coordinate 2 (KH—SiO$_2$,KH—AlN)=(2.50,1.13)
coordinate 3 (KH—SiO$_2$,KH—AlN)=(2.76,1.42)
coordinate 4 (KH—SiO$_2$,KH—AlN)=(2.77,1.75)
coordinate 5 (KH—SiO$_2$,KH—AlN)=(2.60,3.00)
coordinate 6 (KH—SiO$_2$,KH—AlN)=(2.57,4.00)

coordinate 7 (KH—SiO$_2$,KH—AlN)=(2.60,5.00)
coordinate 8 (KH—SiO$_2$,KH—AlN)=(2.74,5.96)
coordinate 9 (KH—SiO$_2$,KH—AlN)=(2.80,6.83)
coordinate 10 (KH—SiO$_2$,KH—AlN)=(2.80,7.83)
coordinate 11 (KH—SiO$_2$,KH—AlN)=(2.82,8.67)
coordinate 12 (KH—SiO$_2$,KH—AlN)=(2.82,10.00)
coordinate 13 (KH—SiO$_2$,KH—AlN)=(2.00,10.00)

Within this area, the conditions in which the electromechanical coupling coefficient K$^2$ necessary for exciting the surface acoustic waves is equal to or greater than 0.1% and the acoustic speed is equal to or higher than 5600 m/s can be satisfied.

Application Example 4

In the surface acoustic wave device according to the application example of the invention, it is preferred that, when the thickness of the aluminum nitride film is ta, the thickness of the silicon dioxide film is ts, and the wavelength of the surface acoustic waves is λ, and when the relationship between the normalized film thickness of the aluminum nitride film expressed by KH—AlN=(2π/λ)·ta and the normalized film thickness of the silicon dioxide film expressed by KH—SiO$_2$=(2π/λ)·ts is represented in the following coordinates, KH—AlN and KH—SiO$_2$ within an area defined by connecting the coordinates in order of the coordinate 1 to the coordinate 16 and connecting the coordinate 16 and the coordinate 1 are used.

coordinate 1 (KH—SiO$_2$,KH—AlN)=(2.00,2.25)
coordinate 2 (KH—SiO$_2$,KH—AlN)=(2.10,1.75)
coordinate 3 (KH—SiO$_2$,KH—AlN)=(2.17,0.96)
coordinate 4 (KH—SiO$_2$,KH—AlN)=(2.50,1.13)
coordinate 5 (KH—SiO$_2$,KH—AlN)=(2.76,1.42)
coordinate 6 (KH—SiO$_2$,KH—AlN)=(2.77,1.75)
coordinate 7 (KH—SiO$_2$,KH—AlN)=(2.60,3.00)
coordinate 8 (KH—SiO$_2$,KH—AlN)=(2.57,4.00)
coordinate 9 (KH—SiO$_2$,KH—AlN)=(2.60,4.67)
coordinate 10 (KH—SiO$_2$,KH—AlN)=(2.51,5.00)
coordinate 11 (KH—SiO$_2$,KH—AlN)=(2.51,5.33)
coordinate 12 (KH—SiO$_2$,KH—AlN)=(2.61,5.92)
coordinate 13 (KH—SiO$_2$,KH—AlN)=(2.61,7.00)
coordinate 14 (KH—SiO$_2$,KH—AlN)=(2.46,7.83)
coordinate 15 (KH—SiO$_2$,KH—AlN)=(2.45,10.00)
coordinate 16 (KH—SiO$_2$,KH—AlN)=(2.00,10.00)

Within this area, the delay time temperature coefficient (TCD) in a range of −20 ppm/° C. to +20 ppm/° C. can be obtained. That is, the conditions in which a satisfactory frequency temperature coefficient (TCF) representing temperature dependency is obtained and the electromechanical coupling coefficient K$^2$ is equal to or greater than 0.1% can be satisfied.

A high acoustic speed equal to or higher than 5650 m/s can be realized. Therefore, it is appropriate to an oscillator in a high frequency band.

Application Example 5

In the surface acoustic wave device according to the application example of the invention, it is preferred that, when the thickness of the aluminum nitride film is ta, the thickness of the silicon dioxide film is ts, and the wavelength of the surface acoustic waves is λ, and when the relationship between the normalized film thickness of the aluminum nitride film expressed by KH—AlN=(2π/λ)·ta and the normalized film thickness of the silicon dioxide film expressed by KH—SiO$_2$=(2π/λ)·ts is represented in the following coordinates, KH—AlN and KH—SiO$_2$ within an area defined by connecting the coordinates in order of the coordinate 1 to the coordinate 8 and connecting the coordinate 8 and the coordinate 1 are used.

coordinate 1 (KH—SiO$_2$,KH—AlN)=(2.00,3.46)
coordinate 2 (KH—SiO$_2$,KH—AlN)=(2.27,2.00)
coordinate 3 (KH—SiO$_2$,KH—AlN)=(2.50,1.13)
coordinate 4 (KH—SiO$_2$,KH—AlN)=(2.76,1.42)
coordinate 5 (KH—SiO$_2$,KH—AlN)=(2.77,1.75)
coordinate 6 (KH—SiO$_2$,KH—AlN)=(2.62,2.83)
coordinate 7 (KH—SiO$_2$,KH—AlN)=(2.41,3.50)
coordinate 8 (KH—SiO$_2$,KH—AlN)=(2.00,5.92)

Within this area, the conditions in which the delay time temperature coefficient (TCD) is in a range of −10 ppm/° C. to +10 ppm/° C. and the electromechanical coupling coefficient K$^2$ is equal to or greater than 0.1% can be satisfied.

A high acoustic speed equal to or higher than 5650 m/s can be realized. Therefore, it is appropriate to an oscillator in a high frequency band.

Application Example 6

In the surface acoustic wave device according to the application example of the invention, it is preferred that, when the thickness of the aluminum nitride film is ta, the thickness of the silicon dioxide film is ts, and the wavelength of the surface acoustic waves is λ, and when the relationship between the normalized film thickness of the aluminum nitride film expressed by KH—AlN=(2π/λ)·ta and the normalized film thickness of the silicon dioxide film expressed by KH—SiO$_2$=(2π/λ)·ts is represented in the following coordinates, KH—AlN and KH—SiO$_2$ within an area defined by connecting the coordinates in order of the coordinate 1 to the coordinate 9 and connecting the coordinate 9 and the coordinate 1 are used.

coordinate 1 (KH—SiO$_2$,KH—AlN)=(2.00,3.96)
coordinate 2 (KH—SiO$_2$,KH—AlN)=(2.39,2.00)
coordinate 3 (KH—SiO$_2$,KH—AlN)=(2.64,1.33)
coordinate 4 (KH—SiO$_2$,KH—AlN)=(2.76,1.42)
coordinate 5 (KH—SiO$_2$,KH—AlN)=(2.77,1.75)
coordinate 6 (KH—SiO$_2$,KH—AlN)=(2.72,2.13)
coordinate 7 (KH—SiO$_2$,KH—AlN)=(2.50,2.58)
coordinate 8 (KH—SiO$_2$,KH—AlN)=(2.28,3.58)
coordinate 9 (KH—SiO$_2$,KH—AlN)=(2.00,5.13)

Within this area, the conditions in which the delay time temperature coefficient (TCD) is in a range of −5 ppm/° C. to +5 ppm/° C. and the electromechanical coupling coefficient K$^2$ is equal to or greater than 0.1% can be satisfied.

A high acoustic speed equal to or higher than 5650 m/s can be realized. Therefore, it is appropriate to an oscillator in a high frequency band.

Application Example 7

In the surface acoustic wave device according to the application example of the invention, it is preferred that the surface acoustic waves which are excited by the comb-like electrodes are the second-order mode of Sezawa waves.

With this application example, since the sapphire substrate having a C-plane main surface (hereinafter, also referred to as a C-plane sapphire substrate) is used as a substrate, a high acoustic speed is obtained compared to a case where quartz, glass, or the like is used as a substrate. That is, it is possible to realize a high-frequency device.

The aluminum nitride film and the silicon dioxide film are set to have different signs of delay time temperature coefficients (TCD), making it possible to obtain satisfactory frequency temperature characteristics.

The aluminum nitride has an electromechanical coupling coefficient ($K^2$) greater than the sapphire substrate, and when the aluminum nitride is formed on the sapphire substrate, the crystallinity of the aluminum nitride is satisfactory. Therefore, it is possible to further increase the electromechanical coupling coefficient and to increase the excitation efficiency of surface acoustic waves.

The acoustic speed of the C-plane sapphire substrate is substantially the same as the acoustic speed of the aluminum nitride, such that it is possible to suppress frequency fluctuation due to the difference in the acoustic speed.

The second-order mode of Sezawa waves are easily generated when the film thickness of the aluminum nitride film is large compared to a case where the first-order mode of Sezawa waves is used. Therefore, high stability can be achieved against variations in the film thickness and a higher acoustic speed can be obtained.

Application Example 8

In the surface acoustic wave device according to the application example of the invention, it is preferred that, when the thickness of the aluminum nitride film is ta, the thickness of the silicon dioxide film is ts, and the wavelength of the surface acoustic waves is λ, and when the relationship between the normalized film thickness of the aluminum nitride film expressed by KH—AlN=$(2\pi/\lambda)$·ta and the normalized film thickness of the silicon dioxide film expressed by KH—SiO$_2$=$(2\pi/\lambda)$·ts is represented in the following coordinates, KH—AlN and KH—SiO$_2$ within an area defined by connecting the coordinates in order of the coordinate 1 to the coordinate 13 and connecting the coordinate 13 and the coordinate 1 are used.

coordinate 1 (KH—SiO$_2$,KH—AlN)=(4.50,1.00)
coordinate 2 (KH—SiO$_2$,KH—AlN)=(5.00,1.00)
coordinate 3 (KH—SiO$_2$,KH—AlN)=(5.41,1.17)
coordinate 4 (KH—SiO$_2$,KH—AlN)=(5.72,1.50)
coordinate 5 (KH—SiO$_2$,KH—AlN)=(5.72,1.79)
coordinate 6 (KH—SiO$_2$,KH—AlN)=(5.50,3.00)
coordinate 7 (KH—SiO$_2$,KH—AlN)=(5.44,3.67)
coordinate 8 (KH—SiO$_2$,KH—AlN)=(5.44,4.54)
coordinate 9 (KH—SiO$_2$,KH—AlN)=(5.57,6.75)
coordinate 10 (KH—SiO$_2$,KH—AlN)=(5.57,7.38)
coordinate 11 (KH—SiO$_2$,KH—AlN)=(5.63,8.63)
coordinate 12 (KH—SiO$_2$,KH—AlN)=(5.66,10.00)
coordinate 13 (KH—SiO$_2$,KH—AlN)=(4.50,10.00)

Within this area, the electromechanical coupling coefficient $K^2$ necessary for exciting the surface acoustic waves is equal to or greater than 0.1%, and a high acoustic speed equal to or higher than 5650 m/s can be realized.

Application Example 9

In the surface acoustic wave device according to the application example of the invention, it is preferred that, when the thickness of the aluminum nitride film is ta, the thickness of the silicon dioxide film is ts, and the wavelength of the surface acoustic waves is λ, and when the relationship between the normalized film thickness of the aluminum nitride film expressed by KH—AlN=$(2\pi/\lambda)$·ta and the normalized film thickness of the silicon dioxide film expressed by KH—SiO$_2$=$(2\pi/\lambda)$·ts is represented in the following coordinates, KH—AlN and KH—SiO$_2$ within an area defined by connecting the coordinates in order of the coordinate 1 to the coordinate 16 and connecting the coordinate 16 and the coordinate 1 are used.

coordinate 1 (KH—SiO$_2$,KH—AlN)=(4.50,2.33)
coordinate 2 (KH—SiO$_2$,KH—AlN)=(4.77,1.83)
coordinate 3 (KH—SiO$_2$,KH—AlN)=(5.00,1.54)
coordinate 4 (KH—SiO$_2$,KH—AlN)=(5.21,1.08)
coordinate 5 (KH—SiO$_2$,KH—AlN)=(5.41,1.17)
coordinate 6 (KH—SiO$_2$,KH—AlN)=(5.72,1.50)
coordinate 7 (KH—SiO$_2$,KH—AlN)=(5.72,1.79)
coordinate 8 (KH—SiO$_2$,KH—AlN)=(5.50,3.00)
coordinate 9 (KH—SiO$_2$,KH—AlN)=(5.44,3.67)
coordinate 10 (KH—SiO$_2$,KH—AlN)=(5.44,4.54)
coordinate 11 (KH—SiO$_2$,KH—AlN)=(5.52,6.00)
coordinate 12 (KH—SiO$_2$,KH—AlN)=(5.39,6.67)
coordinate 13 (KH—SiO$_2$,KH—AlN)=(5.39,7.08)
coordinate 14 (KH—SiO$_2$,KH—AlN)=(5.15,7.83)
coordinate 15 (KH—SiO$_2$,KH—AlN)=(4.91,10.00)
coordinate 16 (KH—SiO$_2$,KH—AlN)=(4.50,10.00)

Within this area, the conditions in which the delay time temperature coefficient (TCD) is in a range of −20 ppm/° C. to +20 ppm/° C. and the electromechanical coupling coefficient $K^2$ is equal to or greater than 0.1% can be satisfied.

A high acoustic speed equal to or higher than 5650 m/s can be realized. Therefore, it is appropriate to an oscillator in a high frequency band.

Application Example 10

In the surface acoustic wave device according to the application example of the invention, it is preferred that, when the thickness of the aluminum nitride film is ta, the thickness of the silicon dioxide film is ts, and the wavelength of the surface acoustic waves is λ, and when the relationship between the normalized film thickness of the aluminum nitride film expressed by KH—AlN=$(2\pi/\lambda)$·ta and the normalized film thickness of the silicon dioxide film expressed by KH—SiO$_2$=$(2\pi/\lambda)$·ts is represented in the following coordinates, KH—AlN and KH—SiO$_2$ within an area defined by connecting the coordinates in order of the coordinate 1 to the coordinate 10 and connecting the coordinate 10 and the coordinate 1 are used.

coordinate 1 (KH—SiO$_2$,KH—AlN)=(4.50,3.33)
coordinate 2 (KH—SiO$_2$,KH—AlN)=(4.84,2.71)
coordinate 3 (KH—SiO$_2$,KH—AlN)=(5.65,1.48)
coordinate 4 (KH—SiO$_2$,KH—AlN)=(5.72,1.50)
coordinate 5 (KH—SiO$_2$,KH—AlN)=(5.72,1.79)
coordinate 6 (KH—SiO$_2$,KH—AlN)=(5.50,3.00)
coordinate 7 (KH—SiO$_2$,KH—AlN)=(5.44,3.67)
coordinate 8 (KH—SiO$_2$,KH—AlN)=(5.00,4.42)
coordinate 9 (KH—SiO$_2$,KH—AlN)=(4.66,5.17)
coordinate 10 (KH—SiO$_2$,KH—AlN)=(4.50,5.38)

Within this area, the conditions in which the delay time temperature coefficient (TCD) is in a range of −10 ppm/° C. to +10 ppm/° C. and the electromechanical coupling coefficient $K^2$ is equal to or greater than 0.1% can be satisfied.

A high acoustic speed equal to or higher than 5650 m/s can be realized. Therefore, it is appropriate to an oscillator in a high frequency band.

Application Example 11

In the surface acoustic wave device according to the application example of the invention, it is preferred that, when the thickness of the aluminum nitride film is ta, the thickness of the silicon dioxide film is ts, and the wavelength of the surface acoustic waves is λ, and when the relationship between the normalized film thickness of the aluminum nitride film expressed by KH—AlN=$(2\pi/\lambda)\cdot ta$ and the normalized film thickness of the silicon dioxide film expressed by KH—SiO$_2$=$(2\pi/\lambda)\cdot ts$ is represented in the following coordinates, KH—AlN and KH—SiO$_2$ within an area defined by connecting the coordinates in order of the coordinate 1 to the coordinate 6 and connecting the coordinate 6 and the coordinate 1 are used.

coordinate 1 (KH—SiO$_2$,KH—AlN)=(4.50,3.75)
  coordinate 2 (KH—SiO$_2$,KH—AlN)=(5.10,2.75)
  coordinate 3 (KH—SiO$_2$,KH—AlN)=(5.72,1.79)
  coordinate 4 (KH—SiO$_2$,KH—AlN)=(5.50,3.00)
  coordinate 5 (KH—SiO$_2$,KH—AlN)=(5.00,3.83)
  coordinate 6 (KH—SiO$_2$,KH—AlN)=(4.50,4.75)

Within this area, the conditions in which the delay time temperature coefficient (TCD) is in a range of −5 ppm/° C. to +5 ppm/° C. and the electromechanical coupling coefficient K$^2$ is equal to or greater than 0.1% can be satisfied, and a high acoustic speed equal to or higher than 5650 m/s can be realized. Therefore, it is possible to realize a surface acoustic wave device appropriate to an oscillator in a high frequency band in which high-definition temperature characteristics are necessary.

Application Example 12

In the surface acoustic wave device according to the application example of the invention, it is preferred that the surface acoustic waves which are excited by the comb-like electrodes are the fundamental mode of Rayleigh waves.

With this application example, since the sapphire substrate having a C-plane main surface (hereinafter, also referred to as a C-plane sapphire substrate) is used as a substrate, a high acoustic speed is obtained compared to a case where quartz, glass, or the like is used as a substrate. That is, it is possible to realize a high-frequency device.

The aluminum nitride film and the silicon dioxide film are set to have different signs of delay time temperature coefficients (TCD), making it possible to obtain satisfactory frequency temperature characteristics.

The aluminum nitride has an electromechanical coupling coefficient (K$^2$) greater than the sapphire substrate, and when the aluminum nitride is formed on the sapphire substrate, the crystallinity of the aluminum nitride is satisfactory. Therefore, it is possible to further increase the electromechanical coupling coefficient and to increase the excitation efficiency of surface acoustic waves.

The acoustic speed of the C-plane sapphire substrate is substantially the same as the acoustic speed of the aluminum nitride, such that it is possible to suppress frequency fluctuation due to the difference in the acoustic speed.

The fundamental mode of Rayleigh waves are easily generated when the film thickness of the aluminum nitride film is small compared to a case where a high-order mode such as the first-order or second order-mode of Sezawa waves is used. Therefore, since variations in the film thickness do not easily occur, high stability can be achieved, and a higher acoustic speed can be obtained.

Application Example 13

In the surface acoustic wave device according to the application example of the invention, it is preferred that, when the thickness of the aluminum nitride film is ta, the thickness of the silicon dioxide film is ts, and the wavelength of the surface acoustic waves is λ, and when the relationship between the normalized film thickness of the aluminum nitride film expressed by KH—AlN=$(2\pi/\lambda)\cdot ta$ and the normalized film thickness of the silicon dioxide film expressed by KH—SiO$_2$=$(2\pi/\lambda)\cdot ts$ is represented in the following coordinates, KH—AlN and KH—SiO$_2$ within an area defined by connecting the coordinates in order of the coordinate 1 to the coordinate 10 and connecting the coordinate 10 and the coordinate 1 are used.

coordinate 1 (KH—SiO$_2$,KH—AlN)=(0.50,1.25)
  coordinate 2 (KH—SiO$_2$,KH—AlN)=(0.65,0.50)
  coordinate 3 (KH—SiO$_2$,KH—AlN)=(1.67,0.50)
  coordinate 4 (KH—SiO$_2$,KH—AlN)=(1.44,1.83)
  coordinate 5 (KH—SiO$_2$,KH—AlN)=(1.29,3.00)
  coordinate 6 (KH—SiO$_2$,KH—AlN)=(1.22,4.00)
  coordinate 7 (KH—SiO$_2$,KH—AlN)=(1.20,5.29)
  coordinate 8 (KH—SiO$_2$,KH—AlN)=(1.18,6.00)
  coordinate 9 (KH—SiO$_2$,KH—AlN)=(1.18,10.00)
  coordinate 10 (KH—SiO$_2$,KH—AlN)=(0.50,10.00)

Within this area, the delay time temperature coefficient (TCD) in a range of −40 ppm/° C. to +40 ppm/° C. and a high acoustic speed equal to or higher than 4800 m/s can be realized.

Application Example 14

In the surface acoustic wave device according to the application example of the invention, it is preferred that, when the thickness of the aluminum nitride film is ta, the thickness of the silicon dioxide film is ts, and the wavelength of the surface acoustic waves is λ, and when the relationship between the normalized film thickness of the aluminum nitride film expressed by KH—AlN=$(2\pi/\lambda)\cdot ta$ and the normalized film thickness of the silicon dioxide film expressed by KH—SiO$_2$=$(2\pi/\lambda)\cdot ts$ is represented in the following coordinates, KH—AlN and KH—SiO$_2$ within an area defined by connecting the coordinates in order of the coordinate 1 to the coordinate 9 and connecting the coordinate 9 and the coordinate 1 are used.

coordinate 1 (KH—SiO$_2$,KH—AlN)=(0.50,2.37)
  coordinate 2 (KH—SiO$_2$,KH—AlN)=(0.89,1.00)
  coordinate 3 (KH—SiO$_2$,KH—AlN)=(0.98,0.50)
  coordinate 4 (KH—SiO$_2$,KH—AlN)=(1.43,0.50)
  coordinate 5 (KH—SiO$_2$,KH—AlN)=(1.00,3.00)
  coordinate 6 (KH—SiO$_2$,KH—AlN)=(0.85,4.00)
  coordinate 7 (KH—SiO$_2$,KH—AlN)=(0.72,6.00)
  coordinate 8 (KH—SiO$_2$,KH—AlN)=(0.70,10.00)
  coordinate 9 (KH—SiO$_2$,KH—AlN)=(0.50,10.00)

Within this area, the delay time temperature coefficient (TCD) in a range of −20 ppm/° C. to +20 ppm/° C. and a high acoustic speed equal to or higher than 5000 m/s can be realized.

Application Example 15

In the surface acoustic wave device according to the application example of the invention, it is preferred that, when the thickness of the aluminum nitride film is ta, the thickness of the silicon dioxide film is ts, and the wavelength of the surface acoustic waves is λ, and when the relationship between the normalized film thickness of the aluminum nitride film expressed by KH—AlN=$(2\pi/\lambda)\cdot ta$ and the normalized film thickness of the silicon dioxide film expressed by KH—SiO$_2$=$(2\pi/\lambda)\cdot ts$ is represented in the following coordinates, KH—AlN and KH—SiO$_2$ within an area defined by connecting the coordinates in order of the coordinate 1 to the coordinate 8 and connecting the coordinate 8 and the coordinate 1 are used.

coordinate 1 (KH—SiO$_2$,KH—AlN)=(0.50,3.00)
  coordinate 2 (KH—SiO$_2$,KH—AlN)=(1.02,1.00)

coordinate 3 (KH—SiO$_2$,KH—AlN)=(1.10,0.50)
coordinate 4 (KH—SiO$_2$,KH—AlN)=(1.32,0.50)
coordinate 5 (KH—SiO$_2$,KH—AlN)=(1.06,2.00)
coordinate 6 (KH—SiO$_2$,KH—AlN)=(0.76,3.29)
coordinate 7 (KH—SiO$_2$,KH—AlN)=(0.59,4.67)
coordinate 8 (KH—SiO$_2$,KH—AlN)=(0.50,6.38)

Within this area, the delay time temperature coefficient (TCD) in a range of −10 ppm/° C. to +10 ppm/° C. and a high acoustic speed equal to or higher than 5000 m/s can be realized. Therefore, it is appropriate to an oscillator in a high frequency band.

Application Example 16

In the surface acoustic wave device according to the application example of the invention, it is preferred that, when the thickness of the aluminum nitride film is ta, the thickness of the silicon dioxide film is ts, and the wavelength of the surface acoustic waves is λ, and when the relationship between the normalized film thickness of the aluminum nitride film expressed by KH—AlN=(2π/λ)·ta and the normalized film thickness of the silicon dioxide film expressed by KH—SiO$_2$=(2π/λ)·ts is represented in the following coordinates, KH—AlN and KH—SiO$_2$ within an area defined by connecting the coordinates in order of the coordinate 1 to the coordinate 7 and connecting the coordinate 7 and the coordinate 1 are used.

coordinate 1 (KH—SiO$_2$,KH—AlN)=(0.50,3.33)
coordinate 2 (KH—SiO$_2$,KH—AlN)=(1.07,1.04)
coordinate 3 (KH—SiO$_2$,KH—AlN)=(1.16,0.50)
coordinate 4 (KH—SiO$_2$,KH—AlN)=(1.27,0.50)
coordinate 5 (KH—SiO$_2$,KH—AlN)=(1.10,1.58)
coordinate 6 (KH—SiO$_2$,KH—AlN)=(0.68,3.25)
coordinate 7 (KH—SiO$_2$,KH—AlN)=(0.50,4.46)

Within this area, the delay time temperature coefficient (TCD) in a range of −5 ppm/° C. to +5 ppm/° C. and a high acoustic speed equal to or higher than 5100 m/s can be realized. Therefore, it is possible to realize a surface acoustic wave device appropriate to an oscillator in a high frequency band in which high-definition temperature characteristics are necessary.

Application Example 17

In the surface acoustic wave device according to the application example of the invention, it is preferred that, when the thickness of the aluminum nitride film is ta, the thickness of the silicon dioxide film is ts, and the wavelength of the surface acoustic waves is λ, and when the relationship between the normalized film thickness of the aluminum nitride film expressed by KH—AlN=(2π/λ)·ta and the normalized film thickness of the silicon dioxide film expressed by KH—SiO$_2$=(2π/λ)·ts is represented in the following coordinates, KH—AlN and KH—SiO$_2$ within an area defined by connecting the coordinates in order of the coordinate 1 to the coordinate 4 and connecting the coordinate 4 and the coordinate 1 are used.

coordinate 1 (KH—SiO$_2$,KH—AlN)=(0.50,0.83)
coordinate 2 (KH—SiO$_2$,KH—AlN)=(0.62,1.00)
coordinate 3 (KH—SiO$_2$,KH—AlN)=(0.70,1.58)
coordinate 4 (KH—SiO$_2$,KH—AlN)=(0.50,2.50)

Within this area, the electromechanical coupling coefficient K$^2$ necessary for exciting the surface acoustic waves is equal to or greater than 0.1%, and a high acoustic speed equal to or higher than 5400 m/s can be realized.

Application Example 18

This application example of the invention provides an oscillator using the above-described surface acoustic wave device.

The above-described surface acoustic wave device is combined with a SAW filter or an integrated circuit device to constitute an oscillator, realizing an oscillator having high acoustic speed and satisfactory frequency temperature characteristics.

Application Example 19

This application example of the invention provides a module apparatus using the above-described surface acoustic wave device.

The above-described surface acoustic wave device is sealed with a package, allowing protection from the external environment, such as moisture or dust, and further increasing reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described with reference to the drawings.

First Embodiment

Figure 1:
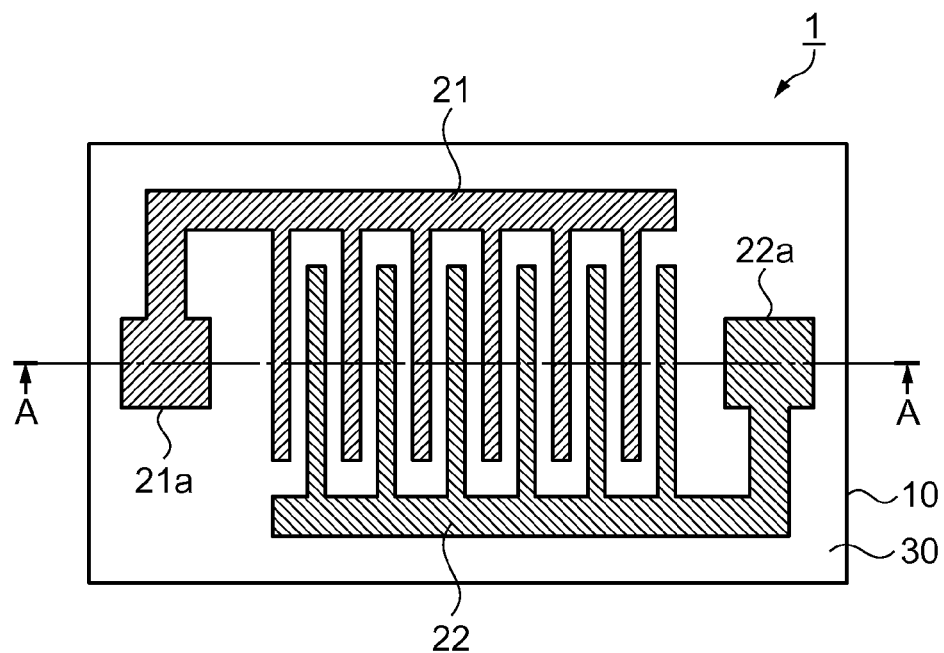
FIG. 1 is a top view of a surface acoustic wave device according to a first embodiment.
Figure 2:
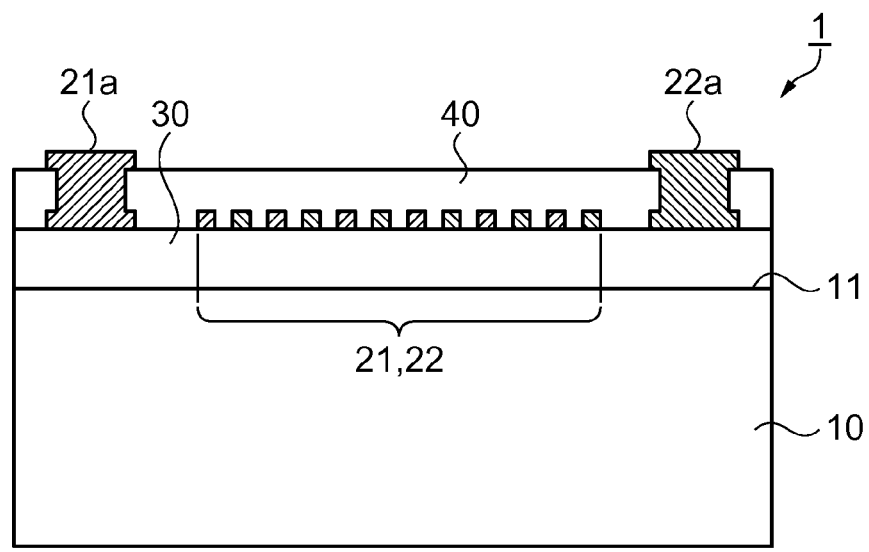
FIG. 2 is a sectional view taken along the line A-A of FIG. 1.

FIG. 1 is a top view of a surface acoustic wave device according to a first embodiment. FIG. 2 is a sectional view taken along the line A-A of FIG. 1. For convenience, FIGS. 1 and 2 are schematic views where the vertical and horizontal scales of vertical and horizontal members and portions are different from the actual members and portions.

In FIGS. 1 and 2, a surface acoustic wave device 1 includes a sapphire substrate 10 having a C-plane main surface, an aluminum nitride (AlN) film 30 which is formed on the entire main surface 11 of the sapphire substrate 10, comb-like electrodes (IDT: Interdigital Transducer) 21 and 22 which are formed on the surface of the aluminum nitride (AlN) film 30, and a silicon dioxide (SiO$_2$) film 40 which serves as a silicon dioxide film to cover the comb-like electrodes 21 and 22 and the surface of the aluminum nitride film 30. The C plane has the Miller index of (0001). The aluminum nitride (AlN) film 30 is a piezoelectric film.

The comb-like electrodes 21 and 22 are made of aluminum or aluminum alloy and are configured such that interdigitated electrodes are alternately arranged. An electrode pad 21a is formed at one end of the comb-like electrode 21, and an electrode pad 22a is formed at one end of the comb-like electrode 22. The electrode pads 21a and 22a pass through the silicon dioxide film 40 and are exposed from the surface of the silicon dioxide film 40.

The configuration of the comb-like electrodes 21 and 22 shown in FIGS. 1 and 2 is just an example and, in the drawings, the configuration of the comb-like electrode and the number of interdigitated electrodes are simplified.

The material for the comb-like electrodes 21 and 22 is not particularly limited insofar as the material has conductivity.

Next, a main process of a method of manufacturing the surface acoustic wave device 1 will be described with reference to FIG. 2. First, the aluminum nitride film 30 is formed on the main surface 11 of the sapphire substrate 10 by sputtering. Then, an aluminum film (or an aluminum alloy film) is formed on the surface of the aluminum nitride film 30 by vapor deposition. Photoresist is coated on the surface of the aluminum film and exposed by using a stepper, and development, etching, and resist delamination are carried out. Thus, the comb-like electrodes 21 and 22 are formed.

Subsequently, the silicon dioxide film 40 is formed by sputtering. Next, openings are formed to pass through the silicon dioxide film 40 by photolithography. In etching the silicon dioxide film 40, CF$_4$ is used as an etching gas. The silicon dioxide film 40 in the openings is removed by dry etching. Subsequently, a film is formed of aluminum (or aluminum alloy) by vapor deposition, and the electrode pads 21a and 22a are formed by photolithography.

Next, the driving of the surface acoustic wave device configured as described above will be described. The comb-like electrode 21 and the comb-like electrode 22 correspond to an input-side electrode and an output-side electrode. Alternating-current power applied to the input-side electrode is converted into mechanical energy on the surface of the aluminum nitride film 30 serving as a piezoelectric film. In this case, since the electrodes are comb-like, coarseness occurs in the aluminum nitride film 30 and acoustic waves are generated. The acoustic waves propagate on the surface of the aluminum nitride film 30 and reach the output-side electrode. The surface acoustic waves having reached the output-side electrode are converted again to electrical energy by the output-side electrode and output. The acoustic waves to be generated are Sezawa waves which are the high-order modes of Rayleigh waves. In this embodiment, the first-order mode of Sezawa waves is used.

The surface acoustic wave device 1 configured as described above is driven and the impedance characteristics are measured by using a network analyzer. The measurement result is shown in FIG. 3.

Figure 3:
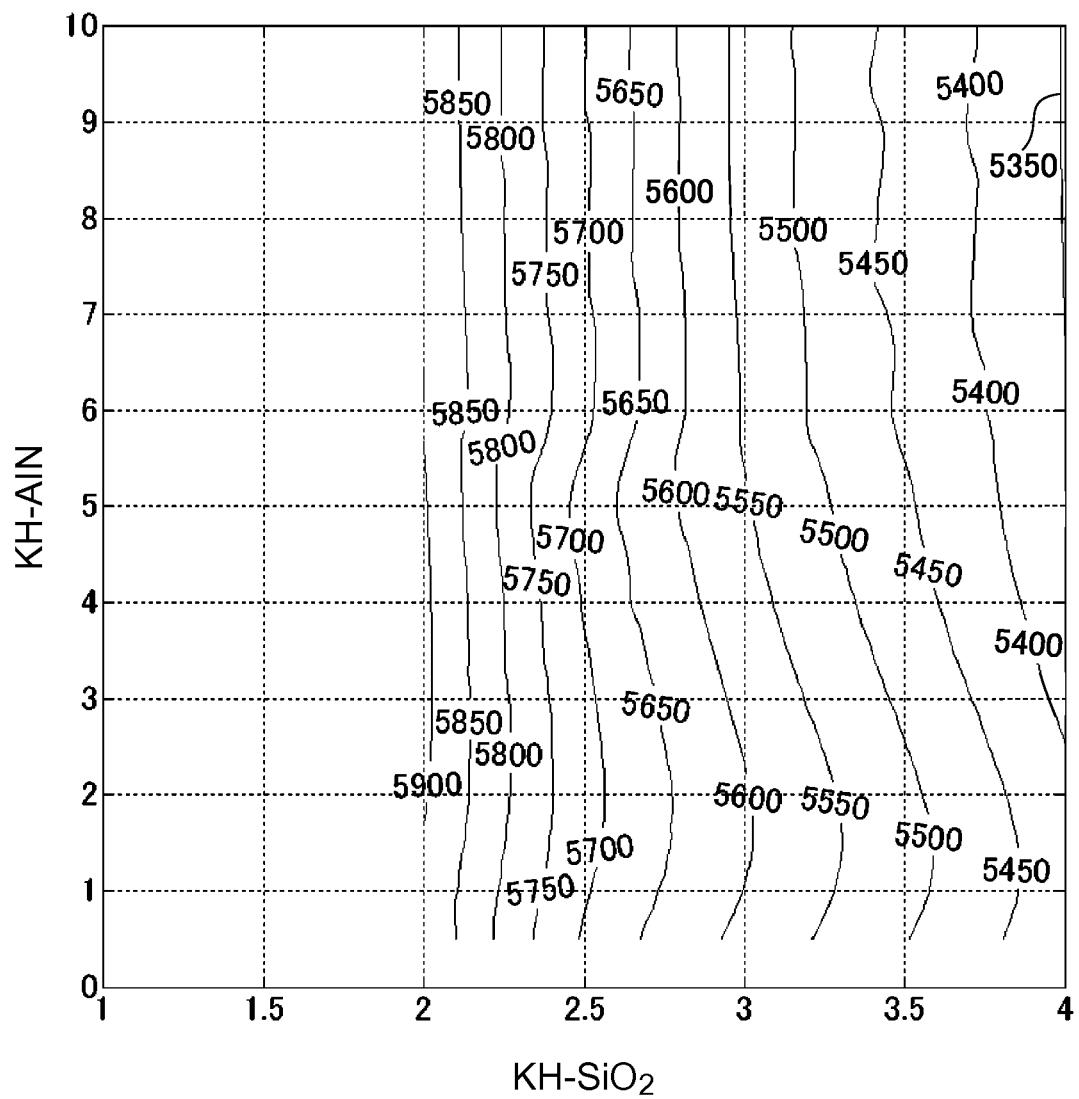
FIG. 3 is a graph showing a relationship between KH—AlN and KH—SiO$_2$, and an acoustic speed in the surface acoustic wave device according to the first embodiment.

FIG. 3 is a graph showing a relationship between the normalized film thickness (hereinafter, expressed by KH—AlN: vertical axis) of the aluminum nitride film 30 and the normalized film thickness (hereinafter, expressed by KH—SiO$_2$: horizontal axis) of the silicon dioxide film 40, and an acoustic speed in the surface acoustic wave device of this embodiment. When the thickness of the aluminum nitride film 30 is ta, the thickness of the silicon dioxide film 40 is ts, and the wavelength of the surface acoustic waves is λ, the normalized film thickness of the aluminum nitride film 30 is expressed by KH—AlN=(2π/λ)·ta and the normalized film thickness of the silicon dioxide film 40 is expressed by KH—SiO$_2$=(2π/λ)·ts. In FIG. 3, the vertical axis represents KH—AlN and the horizontal axis represents KH—SiO$_2$. As shown in FIG. 3, in the measurement range in which KH—SiO$_2$ is in a range of 2.00 to 4.00, a sufficiently high acoustic speed substantially equal to or higher than 5400 m/s is obtained.

Figure 4:
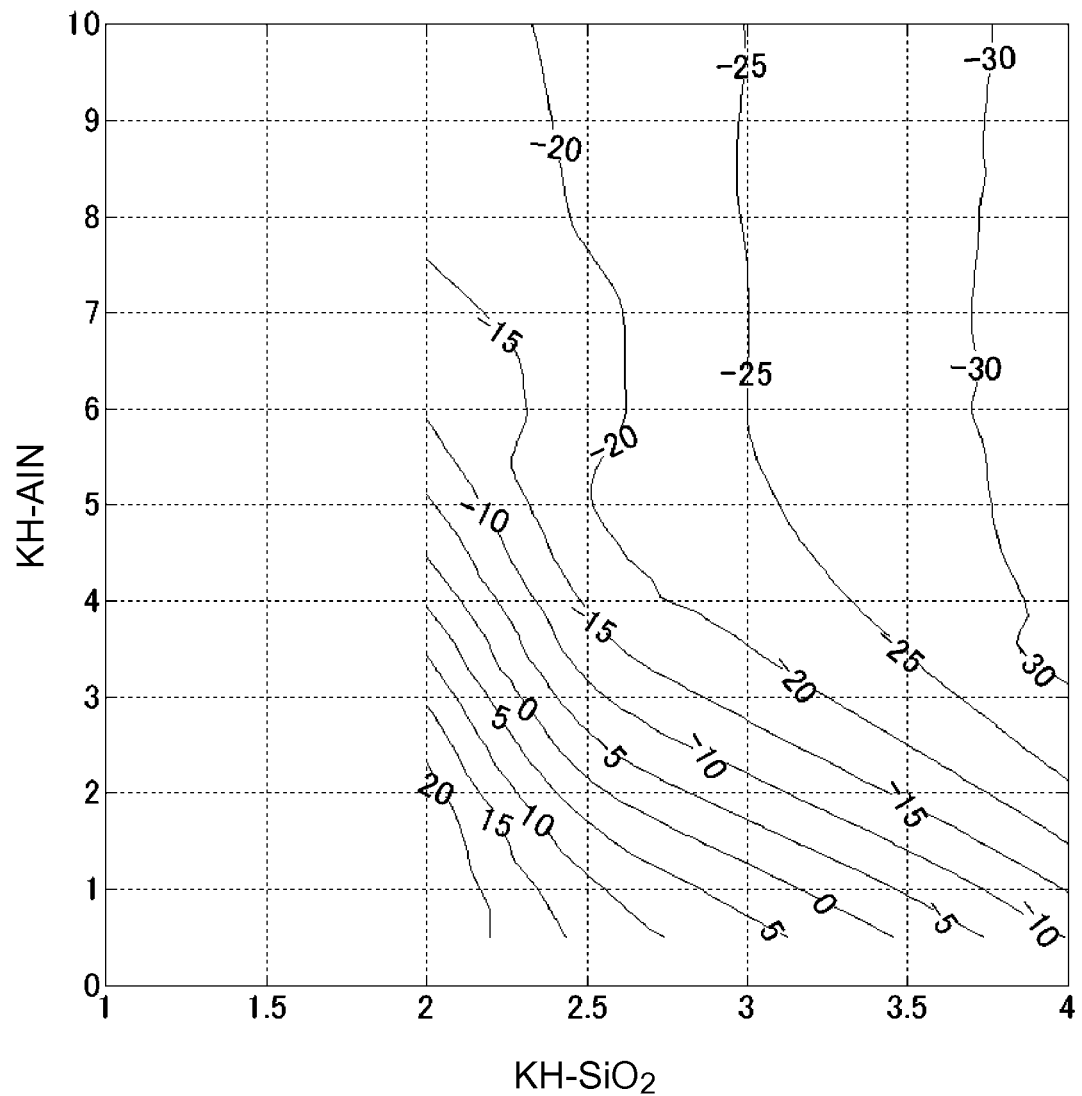
FIG. 4 is a graph showing a relationship between KH—AlN and KH—SiO$_2$, and a delay time temperature coefficient (TCD) in the surface acoustic wave device according to the first embodiment.

FIG. 4 is a graph showing a relationship between KH—AlN and KH—SiO$_2$, and a delay time temperature coefficient (TCD) in the surface acoustic wave device of this embodiment. As shown in FIG. 4, in the inspected range (KH—SiO$_2$ is in a range of 2.00 to 4.00), a satisfactory delay time temperature coefficient (TCD) in a range of +20 ppm/° C. to −30 ppm/° C. is obtained.

According to this embodiment, a C-plane sapphire substrate is used as a substrate. While the acoustic speed of quartz is limited to about 3100 m/s, the sapphire substrate can have an acoustic speed equal to or higher than 4500 m/s. Thus, a high acoustic speed is obtained compared to a case where quartz is used as a substrate. That is, a high-frequency device can be realized.

The aluminum nitride has an electromechanical coupling coefficient (K$^2$) greater than the sapphire substrate, and when the aluminum nitride is formed on the sapphire substrate, the crystallinity of the aluminum nitride is satisfactory. Therefore, it is possible to further increase the electromechanical coupling coefficient and to increase the excitation efficiency of surface acoustic waves.

The acoustic speed of the aluminum nitride is 5600 m/s, and the acoustic speed of the C-plane sapphire substrate is close to the acoustic speed of the aluminum nitride, thereby suppressing frequency fluctuation due to the difference in the acoustic speed. As in the related art, if a zinc oxide (ZnO) film is used as a piezoelectric film, the acoustic speed of the zinc oxide (ZnO) film is 3100 m/s, and the difference from the acoustic speed of the C-plane sapphire substrate is large, causing an increase in frequency fluctuation due to the difference in the acoustic speed at the time of a higher frequency.

The silicon dioxide and the aluminum nitride have different signs of delay time temperature coefficients (TCD), making it possible to obtain satisfactory frequency temperature characteristics.

When the first-order mode of Sezawa waves is used, the aluminum nitride can be reduced in film thickness. Therefore, it is possible to suppress variations in the film thickness distribution, making it easy to suppress variations in the acoustic speed (frequency).

The surface acoustic wave device 1 is used in a band-pass filter for a communication instrument, a resonator serving as a reference clock, or the like because of a unique transmission band, reduction in size, and a small number of components. When a surface acoustic wave device is used in a filter or a resonator, it is necessary that a frequency temperature coefficient (TCF) or a delay time temperature coefficient (TCD) representing temperature dependency or an electromechanical coupling coefficient (K$^2$) representing performance of electromechanical conversion are satisfactory.

Example 1

Figure 5:
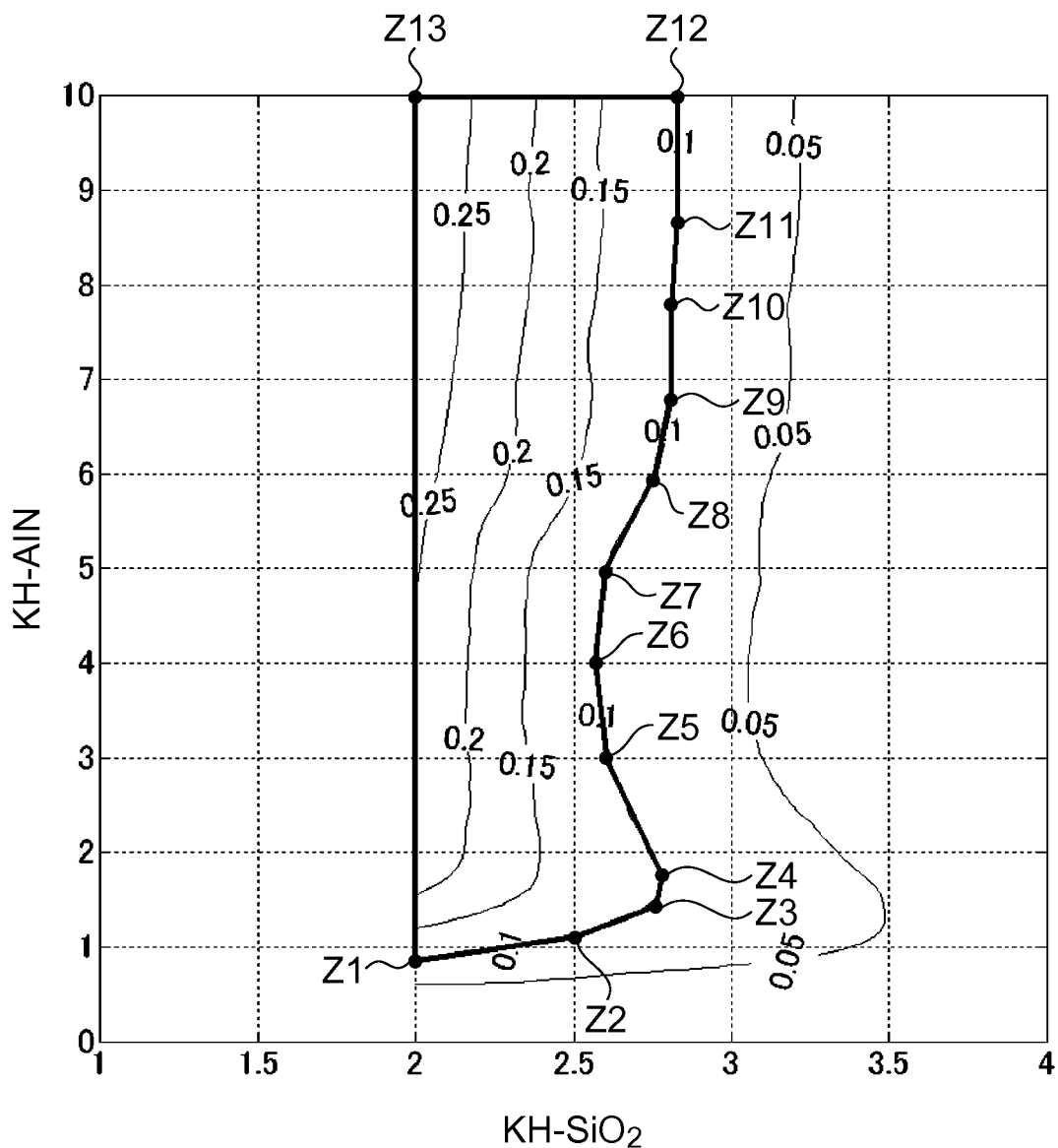
FIG. 5 is a graph showing a relationship between KH—AlN and KH—SiO$_2$, and an electromechanical coupling coefficient K$^2$ according to Example 1.

A specific example of this embodiment will be described.
FIG. 5 is a graph showing a relationship between KH—AlN and KH—SiO$_2$, and an electromechanical coupling coefficient K$^2$ according to Example 1. When the thickness of the aluminum nitride film 30 is ta, the thickness of the silicon dioxide film 40 is ts, and the wavelength of the surface acoustic waves is λ, the normalized film thickness of the aluminum nitride film 30 is expressed by KH—AlN=(2π/λ)·ta and the normalized film thickness of the silicon dioxide film 40 is expressed by KH—SiO$_2$=(2π/λ)·ts. When the relationship between the normalized film thicknesses is represented in coordinates, an appropriate area can be represented in the following coordinates. In FIG. 5, coordinate 1, coordinate 2, coordinate 3, . . . are represented by Z1, Z2, Z3, . . . .

coordinate 1 (KH—SiO$_2$,KH—AlN)=(2.00,0.88)
coordinate 2 (KH—SiO$_2$,KH—AlN)=(2.50,1.13)
coordinate 3 (KH—SiO$_2$,KH—AlN)=(2.76,1.42)
coordinate 4 (KH—SiO$_2$,KH—AlN)=(2.77,1.75)
coordinate 5 (KH—SiO$_2$,KH—AlN)=(2.60,3.00)
coordinate 6 (KH—SiO$_2$,KH—AlN)=(2.57,4.00)
coordinate 7 (KH—SiO$_2$,KH—AlN)=(2.60,5.00)
coordinate 8 (KH—SiO$_2$,KH—AlN)=(2.74,5.96)
coordinate 9 (KH—SiO$_2$,KH—AlN)=(2.80,6.83)
coordinate 10 (KH—SiO$_2$,KH—AlN)=(2.80,7.83)
coordinate 11 (KH—SiO$_2$,KH—AlN)=(2.82,8.67)
coordinate 12 (KH—SiO$_2$,KH—AlN)=(2.82,10.00)
coordinate 13 (KH—SiO$_2$,KH—AlN)=(2.00,10.00)

The first-order mode of Sezawa waves is used which is generated within an area defined by connecting the coordinates in order of the coordinate 1 to the coordinate 13 and connecting the coordinate 13 and the coordinate 1. Hereinafter, the measurement result of the delay time temperature coefficient (TCD) is shown as temperature characteristics.

Within this area, the electromechanical coupling coefficient K$^2$ is equal to or greater than 0.1%, and the electromechanical coupling coefficient K$^2$ necessary for exciting the surface acoustic waves can be obtained.

If the areas defined by the respective coordinate systems of FIGS. 3 and 4 are combined, within this area, the acoustic speed equal to or higher than 5600 m/s is obtained.

Example 2

Next, Example 2 will be described. Example 2 presents a range in which the delay time temperature coefficient (TCD) is further improved compared to Example 1 described above.

Figure 6:
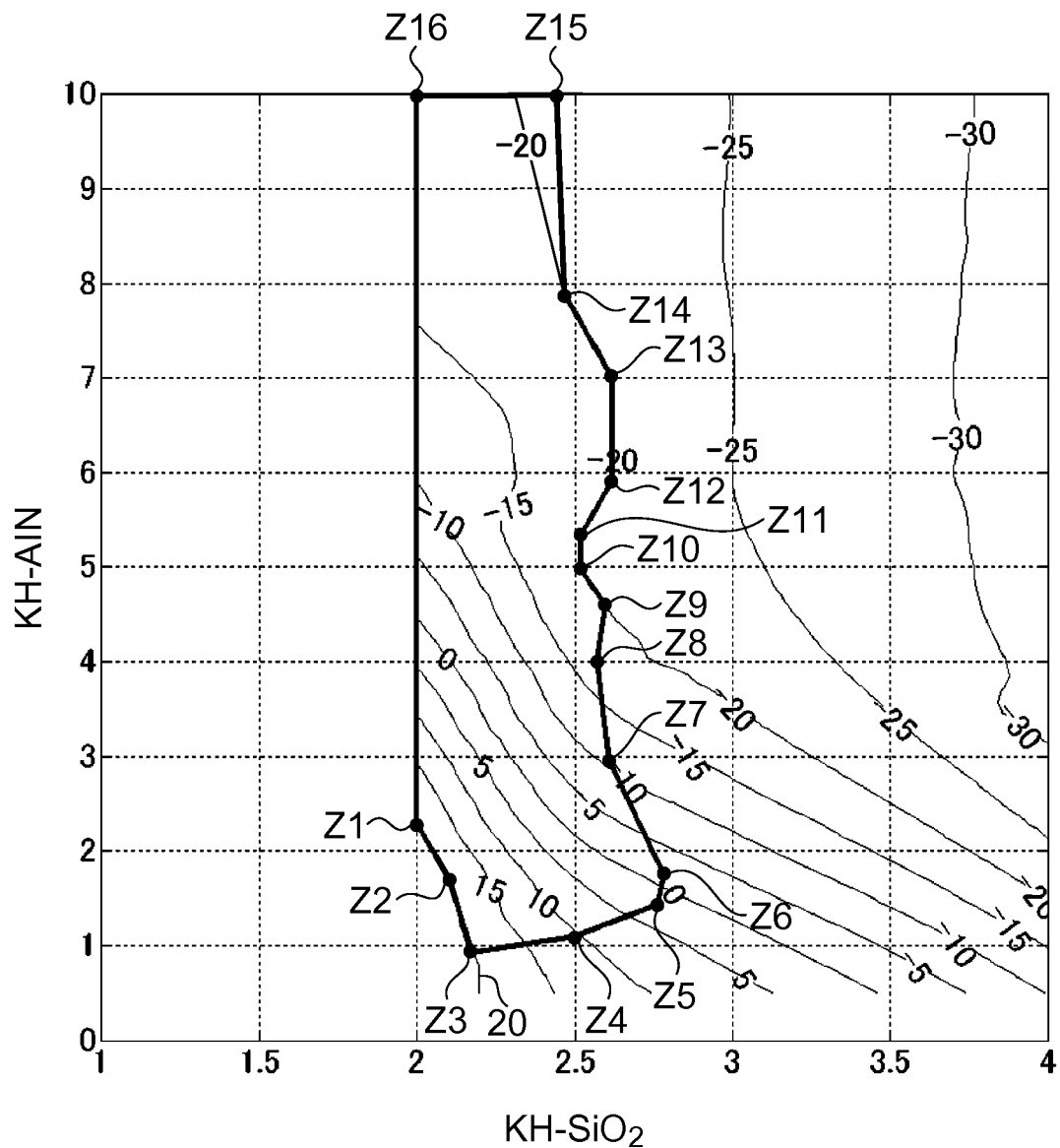
FIG. 6 is a graph showing a relationship between KH—AlN and KH—SiO$_2$, and a delay time temperature coefficient (TCD) according to Example 2.
Figure 7:
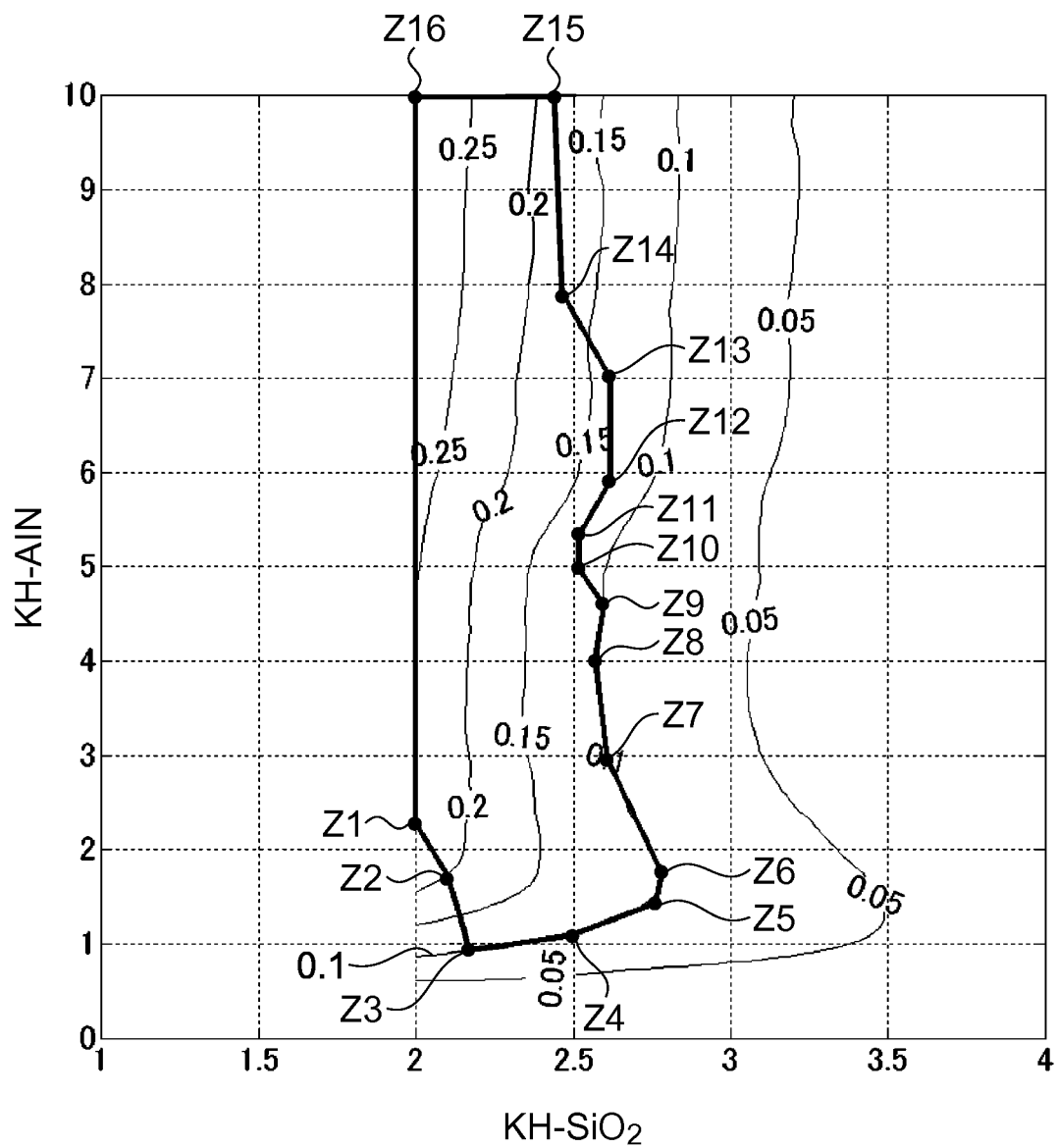
FIG. 7 is a graph showing a relationship with an electromechanical coupling coefficient K$^2$.

FIG. 6 is a graph showing a relationship between KH—AlN and KH—SiO$_2$, and a delay time temperature coefficient (TCD) according to Example 2. FIG. 7 is a graph showing a relationship with an electromechanical coupling coefficient K$^2$. When the thickness of the aluminum nitride film 30 is ta, the thickness of the silicon dioxide film 40 is ts, and the wavelength of the surface acoustic waves is λ, the normalized film thickness of the aluminum nitride film 30 is expressed by KH—AlN=(2π/λ)·ta and the normalized film thickness of the silicon dioxide film 40 is expressed by KH—SiO$_2$=(2π/λ)·ts. When the relationship between the normalized film thicknesses is represented in coordinates, an appropriate area can be represented in the following coordinates. In FIGS. 6 and 7, coordinate 1, coordinate 2, coordinate 3, . . . are represented by Z1, Z2, Z3, . . . .

coordinate 1 (KH—SiO$_2$,KH—AlN)=(2.00,2.25)
    coordinate 2 (KH—SiO$_2$,KH—AlN)=(2.10,1.75)
    coordinate 3 (KH—SiO$_2$,KH—AlN)=(2.17,0.96)
    coordinate 4 (KH—SiO$_2$,KH—AlN)=(2.50,1.13)
    coordinate 5 (KH—SiO$_2$,KH—AlN)=(2.76,1.42)
    coordinate 6 (KH—SiO$_2$,KH—AlN)=(2.77,1.75)
    coordinate 7 (KH—SiO$_2$,KH—AlN)=(2.60,3.00)
    coordinate 8 (KH—SiO$_2$,KH—AlN)=(2.57,4.00)
    coordinate 9 (KH—SiO$_2$,KH—AlN)=(2.60,4.67)
    coordinate 10 (KH—SiO$_2$,KH—AlN)=(2.51,5.00)
    coordinate 11 (KH—SiO$_2$,KH—AlN)=(2.51,5.33)
    coordinate 12 (KH—SiO$_2$,KH—AlN)=(2.61,5.92)
    coordinate 13 (KH—SiO$_2$,KH—AlN)=(2.61,7.00)
    coordinate 14 (KH—SiO$_2$,KH—AlN)=(2.46,7.83)
    coordinate 15 (KH—SiO$_2$,KH—AlN)=(2.45,10.00)
    coordinate 16 (KH—SiO$_2$,KH—AlN)=(2.00,10.00)

The first-order mode of Sezawa waves is used which is generated within an area defined by connecting the coordinates in order of the coordinate 1 to the coordinate 16 and connecting the coordinate 16 and the coordinate 1.

Within this area, as shown in FIGS. 6 and 7, the delay time temperature coefficient (TCD) in a range of −20 ppm/° C. to +20 ppm/° C. can be obtained. That is, the conditions in which a satisfactory frequency temperature coefficient (TCF) representing temperature dependency can be obtained and the electromechanical coupling coefficient $K^2$ is equal to or greater than 0.1% can be satisfied.

If the areas defined by the respective coordinate systems of FIGS. 3 and 6 are combined, within this area, a high acoustic speed equal to or higher than 5650 m/s can be realized. Therefore, it is appropriate to an oscillator in a high frequency band.

Example 3

Next, Example 3 will be described. Example 3 presents a range in which the delay time temperature coefficient (TCD) is further improved compared to Example 2 described above.

Figure 8:
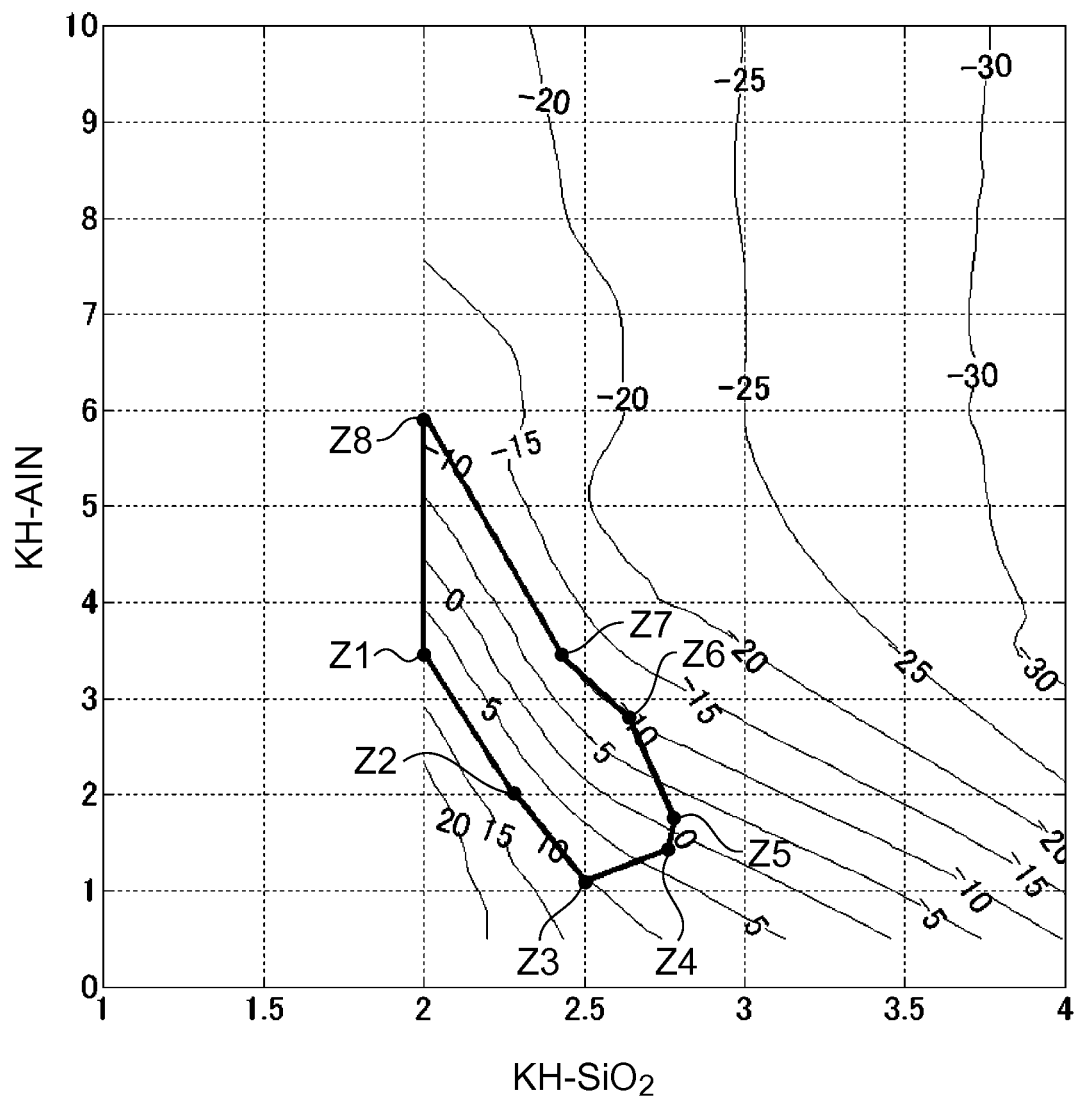
FIG. 8 is a graph showing a relationship between KH—AlN and KH—SiO$_2$, and a delay time temperature coefficient (TCD) according to Example 3.
Figure 9:
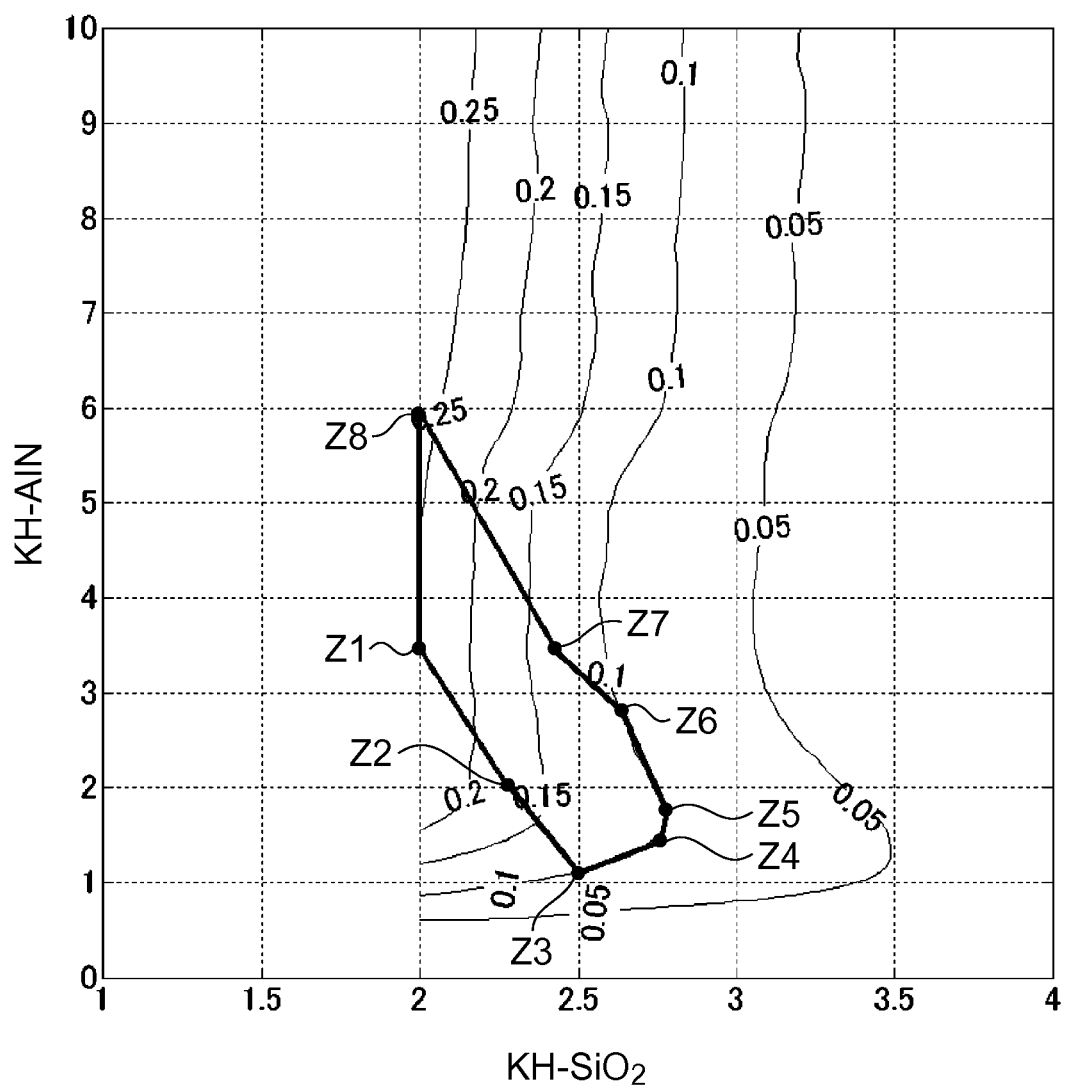
FIG. 9 is a graph showing a relationship with an electromechanical coupling coefficient K$^2$.

FIG. 8 is a graph showing a relationship between KH—AlN and KH—SiO$_2$, and a delay time temperature coefficient (TCD) according to Example 3. FIG. 9 is a graph showing a relationship with an electromechanical coupling coefficient $K^2$. When the thickness of the aluminum nitride film 30 is ta, the thickness of the silicon dioxide film 40 is ts, and the wavelength of the surface acoustic waves is λ, the normalized film thickness of the aluminum nitride film 30 is expressed by KH—AlN=(2π/λ)·ta and the normalized film thickness of the silicon dioxide film 40 is expressed by KH—SiO$_2$=(2π/λ)·ts. When the relationship between the normalized film thicknesses is represented in coordinates, an appropriate area can be represented in the following coordinates. In FIGS. 8 and 9, coordinate 1, coordinate 2, coordinate 3, . . . are represented by Z1, Z2, Z3, . . . .

coordinate 1 (KH—SiO$_2$,KH—AlN)=(2.00,3.46)
    coordinate 2 (KH—SiO$_2$,KH—AlN)=(2.27,2.00)
    coordinate 3 (KH—SiO$_2$,KH—AlN)=(2.50,1.13)
    coordinate 4 (KH—SiO$_2$,KH—AlN)=(2.76,1.42)
    coordinate 5 (KH—SiO$_2$,KH—AlN)=(2.77,1.75)
    coordinate 6 (KH—SiO$_2$,KH—AlN)=(2.62,2.83)
    coordinate 7 (KH—SiO$_2$,KH—AlN)=(2.41,3.50)
    coordinate 8 (KH—SiO$_2$,KH—AlN)=(2.00,5.92)

The first-order mode of Sezawa waves is used which is generated within an area defined by connecting the coordinates in order of the coordinate 1 to the coordinate 8 and connecting the coordinate 8 and the coordinate 1.

Within this area, as shown in FIGS. 8 and 9, the conditions in which the delay time temperature coefficient (TCD) is in a range of −10 ppm/° C. to +10 ppm/° C. and the electromechanical coupling coefficient $K^2$ is equal to or greater than 0.1% can be satisfied.

If the areas defined by the respective coordinate systems of FIGS. 3 and 8 are combined, it is understood that, within this area, a high acoustic speed equal to or higher than 5650 m/s can be realized. Therefore, it is appropriate to an oscillator in a high frequency band.

Example 4

Next, Example 4 will be described. When a surface acoustic wave device is used as a resonator for an oscillator, it is necessary that the delay time temperature coefficient (TCD) is in a small range while the electromechanical coupling coefficient $K^2$ is secured to be equal to or greater than 0.1%. In Example 4, it is presented that the delay time temperature coefficient (TCD) is in a smaller range compared to Examples 2 and 3 described above while the electromechanical coupling coefficient $K^2$ is maintained to be equal to or greater than 0.1%.

Figure 10:
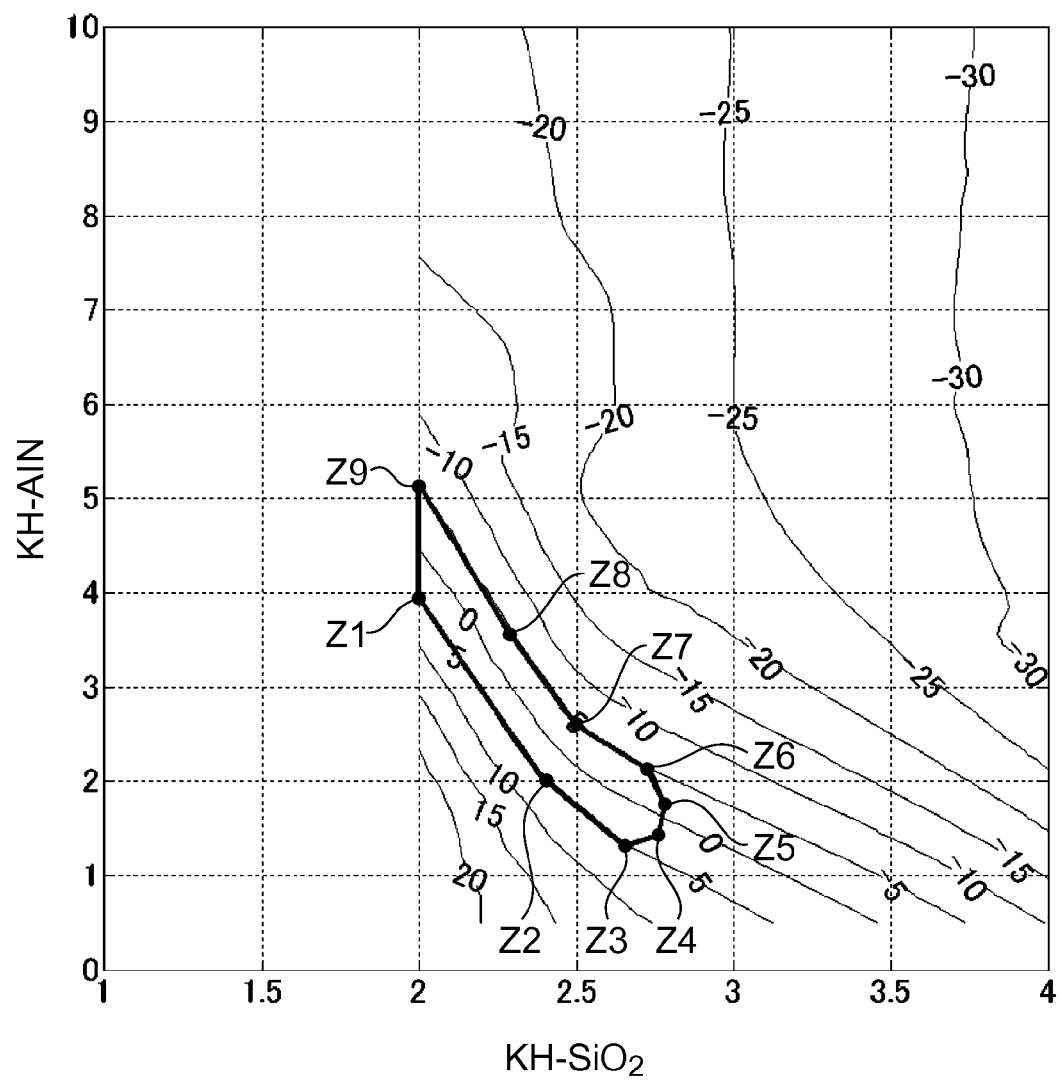
FIG. 10 is a graph showing a relationship between KH—AlN and KH—SiO$_2$, and a delay time temperature coefficient (TCD) according to Example 4.
Figure 11:
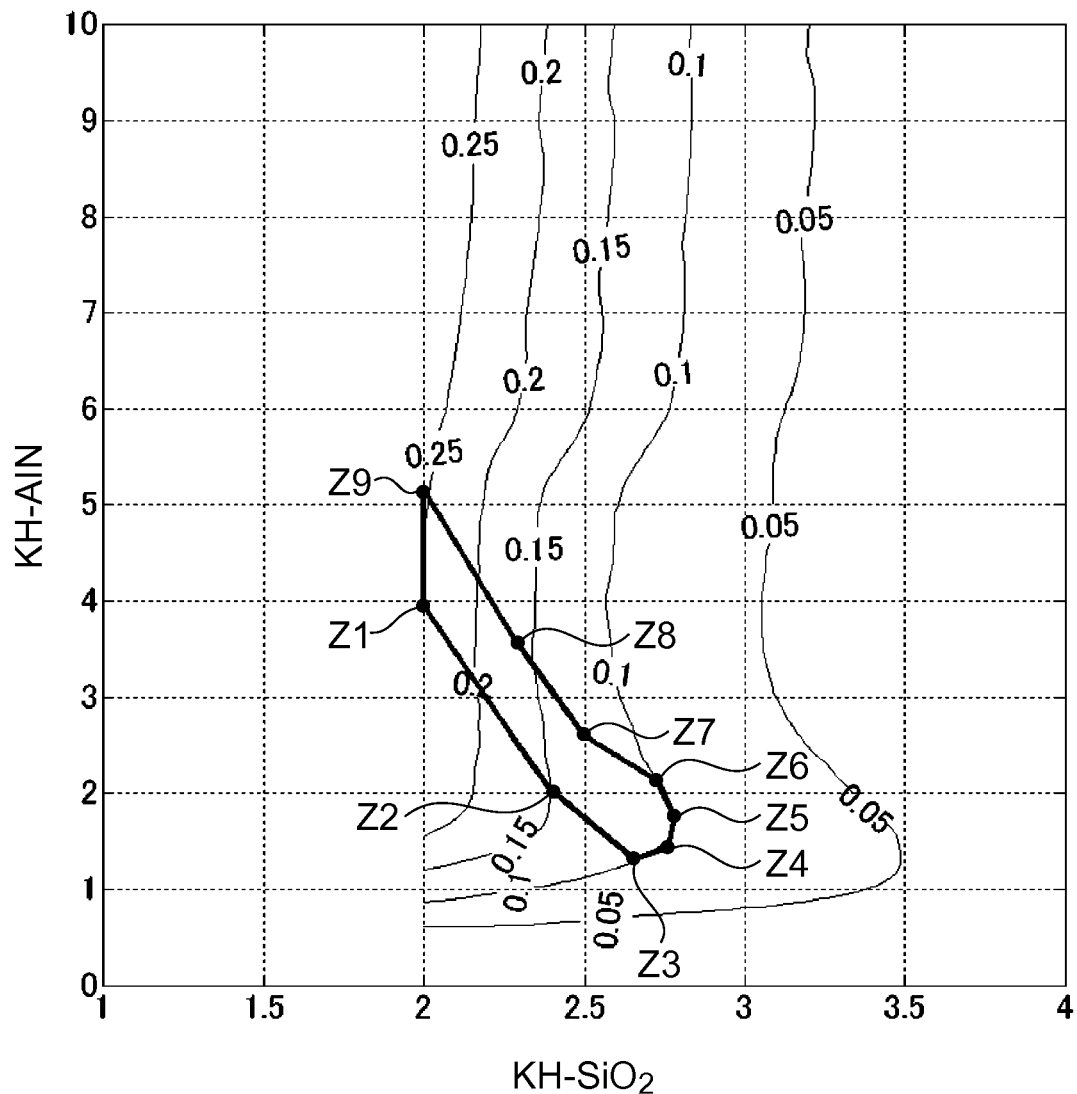
FIG. 11 is a graph showing a relationship with an electromechanical coupling coefficient K$^2$.

FIG. 10 is a graph showing a relationship between KH–AlN and KH—SiO$_2$, and a delay time temperature coefficient (TCD) according to Example 4. FIG. 11 is a graph showing a relationship with an electromechanical coupling coefficient $K^2$. When the thickness of the aluminum nitride film 30 is ta, the thickness of the silicon dioxide film 40 is ts, and the wavelength of the surface acoustic waves is λ, the normalized film thickness of the aluminum nitride film 30 is expressed by KH—AlN=(2π/λ)·ta and the normalized film thickness of the silicon dioxide film 40 is expressed by KH—SiO$_2$=(2π/λ)·ts. When the relationship between the normalized film thicknesses is represented in coordinates, an appropriate area can be represented in the following coordinates. In FIGS. 10 and 11, coordinate 1, coordinate 2, coordinate 3, . . . are represented by Z1, Z2, Z3, . . . .

coordinate 1 (KH—SiO$_2$,KH—AlN)=(2.00,3.96)
    coordinate 2 (KH—SiO$_2$,KH—AlN)=(2.39,2.00)
    coordinate 3 (KH—SiO$_2$,KH—AlN)=(2.64,1.33)
    coordinate 4 (KH—SiO$_2$,KH—AlN)=(2.76,1.42)
    coordinate 5 (KH—SiO$_2$,KH—AlN)=(2.77,1.75)
    coordinate 6 (KH—SiO$_2$,KH—AlN)=(2.72,2.13)
    coordinate 7 (KH—SiO$_2$,KH—AlN)=(2.50,2.58)
    coordinate 8 (KH—SiO$_2$,KH—AlN)=(2.28,3.58)
    coordinate 9 (KH—SiO$_2$,KH—AlN)=(2.00,5.13)

The first-order mode of Sezawa waves is used which is generated within an area defined by connecting the coordinates in order of the coordinate 1 to the coordinate 9 and connecting the coordinate 9 and the coordinate 1.

Within this area, as shown in FIGS. 10 and 11, the conditions in which the delay time temperature coefficient (TCD) is in a range of −5 ppm/° C. to +5 ppm/° C. and the electromechanical coupling coefficient $K^2$ is equal to or greater than 0.1% can be satisfied.

If the areas defined by the respective coordinate systems of FIGS. 3 and 10 are combined, it is understood that, within this area, a high acoustic speed equal to or higher than 5650 m/s can be realized. Therefore, it is appropriate to an oscillator in a high frequency band.

According to Examples 1 to 4 described above, while the electromechanical coupling coefficient $K^2$ necessary for exciting the surface acoustic waves is secured to be equal to or greater than 0.1%, the acoustic speed is equal to or higher than 5600 m/s, thereby realizing a surface acoustic wave device having satisfactory temperature characteristics.

Second Embodiment

Although in the first embodiment, the first-order mode of Sezawa waves is used as acoustic waves, in this embodiment, a case will be described below where the second-order mode of Sezawa waves is used as acoustic waves. The structure of a surface acoustic wave device of this embodiment is the same as in the surface acoustic wave device 1 shown in FIG. 1, thus description thereof will be omitted.

Figure 12:
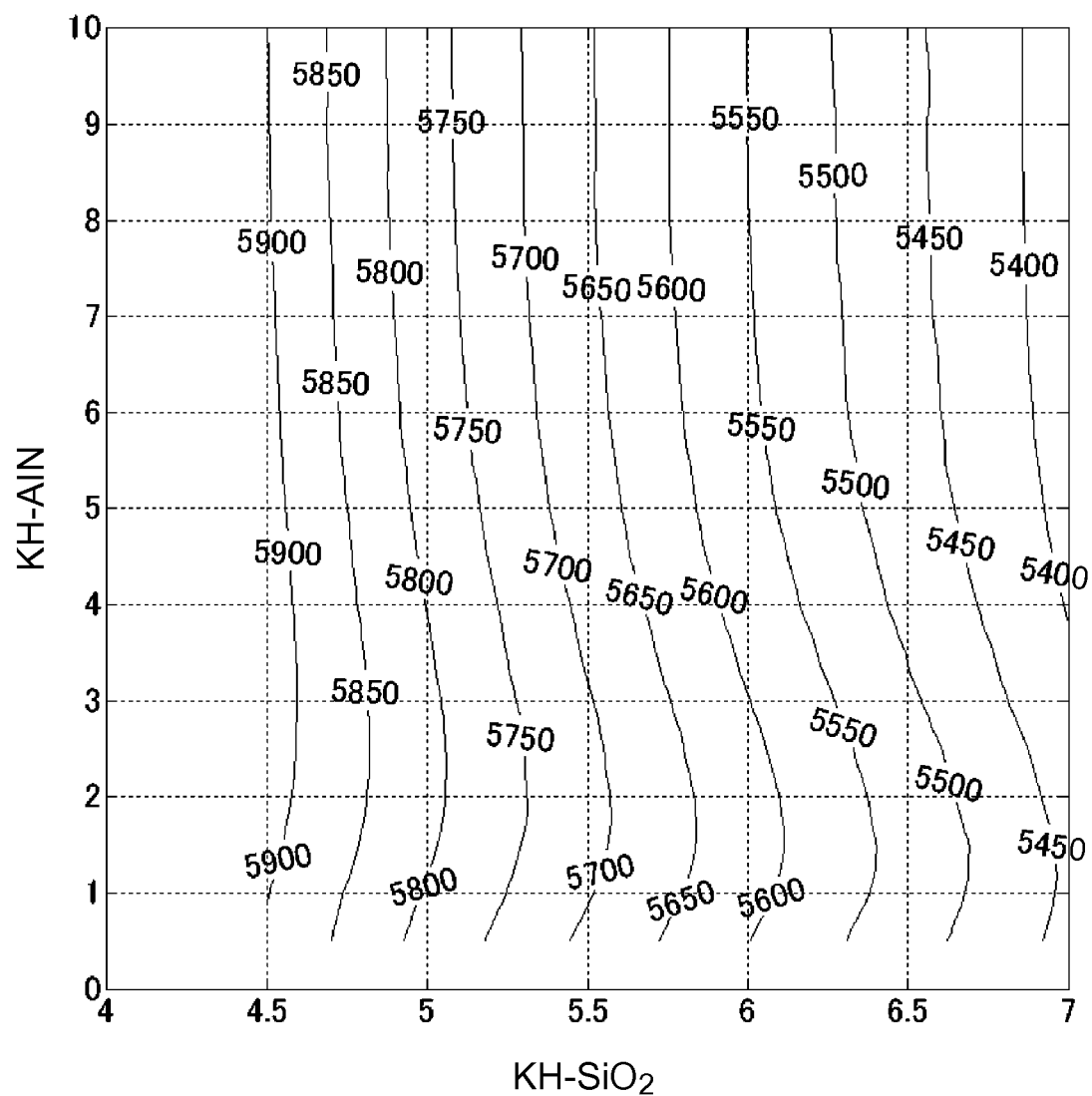
FIG. 12 is a graph showing a relationship between the normalized film thickness (KH—AlN) of an aluminum nitride film and the normalized film thickness (KH—SiO$_2$) of a silicon dioxide film, and an acoustic speed in a surface acoustic wave device according to a second embodiment.
Figure 13:
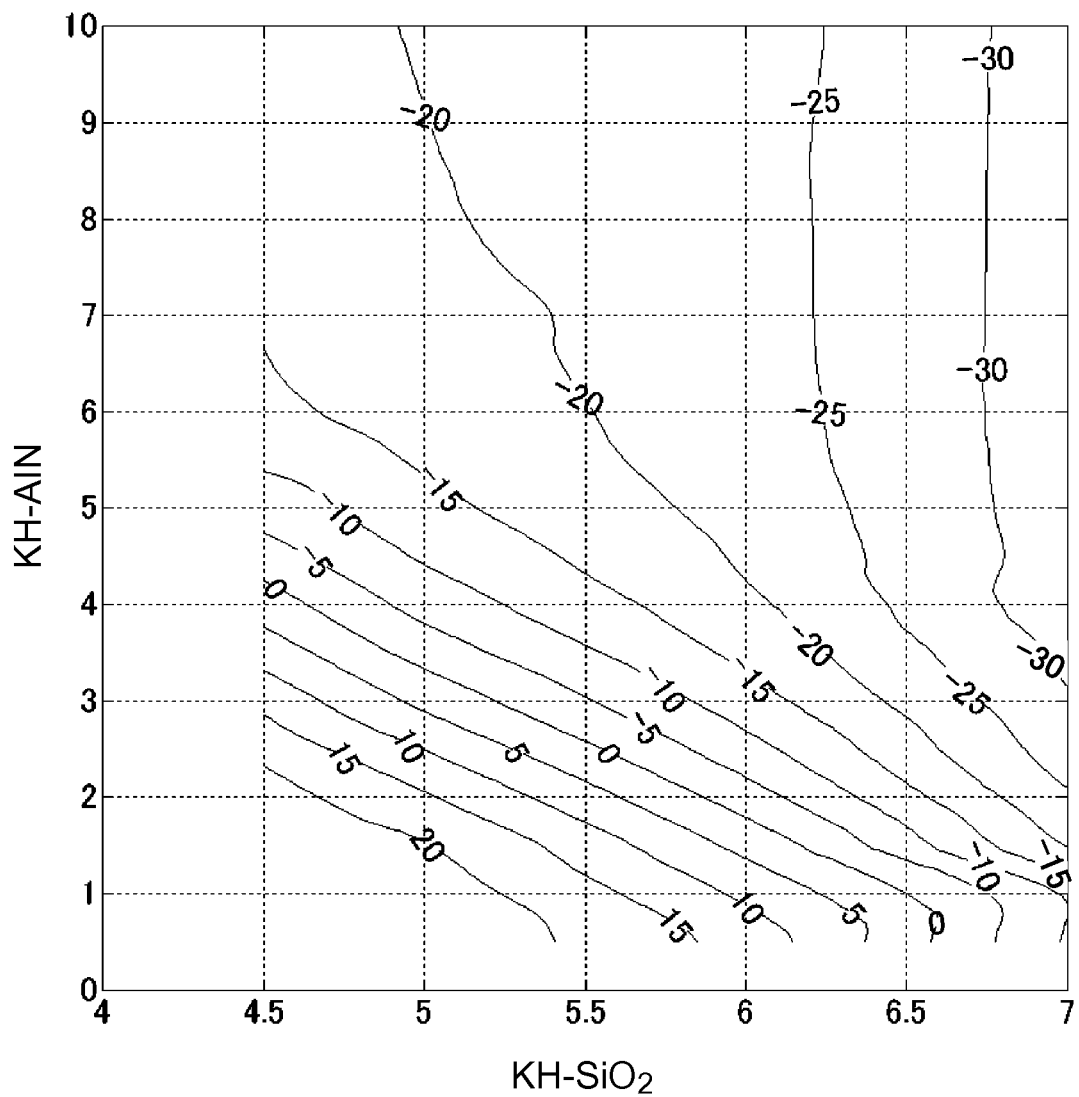
FIG. 13 is a graph showing a relationship between KH—AlN and KH—SiO$_2$, and an electromechanical coupling coefficient K$^2$ according to the second embodiment.

FIG. 12 is a graph showing a relationship between the normalized film thickness (hereinafter, expressed by KH—AlN: vertical axis) of the aluminum nitride film 30 and the normalized film thickness (hereinafter, expressed by KH—SiO$_2$: horizontal axis) of the silicon dioxide film 40, and the acoustic speed [m/s] of Rayleigh waves propagating on the sapphire substrate 10 in the surface acoustic wave device of this embodiment. FIG. 13 is a graph showing a delay time temperature coefficient (TCD). When the thickness of the aluminum nitride film 30 is ta, the thickness of the silicon dioxide film 40 is ts, and the wavelength of the surface acoustic waves is λ, the normalized film thickness of the aluminum nitride film 30 is expressed by KH—AlN=($2\pi/\lambda$)·ta and the normalized film thickness of the silicon dioxide film 40 is expressed by KH—SiO$_2$=($2\pi/\lambda$)·ts. In the graphs of FIGS. 12 and 13, the vertical axis represents KH—AlN and the horizontal axis represents KH—SiO$_2$.

As shown in FIG. 12, in the measurement range in which KH—SiO$_2$ is in a range of 4.5 to 7, it is understood that a sufficiently high acoustic speed equal to or higher than 5450 m/s is obtained.

As shown in FIG. 13, in the measurement range in which KH—SiO$_2$ is in a range of 4.5 to 7, it is understood that there is a range in which the delay time temperature coefficient (TCD) is suppressed in a range of −20 ppm/° C. to +20 ppm/° C.

According to this embodiment, a C-plane sapphire substrate is used as a substrate. While the acoustic speed of Rayleigh waves propagating on a quartz substrate is limited to 3100 m/s, the sapphire substrate has an acoustic speed equal to or higher than 4500 m/s. Thus, a high acoustic speed is obtained compared to a case where quartz is used as a substrate. That is, a high-frequency device can be realized.

The acoustic speed of the aluminum nitride is about 5600 m/s and is close to the acoustic speed of the C-plane sapphire substrate, such that it is possible to suppress frequency fluctuation due to the difference in the acoustic speed. Meanwhile, as in the related art, if a zinc oxide (ZnO) film is used as a piezoelectric film, the acoustic speed of the zinc oxide (ZnO) film is about 3100 m/s and is lower than the acoustic speed of the C-plane sapphire substrate. Accordingly, at the time of a higher frequency, the difference from the acoustic speed of the C-plane sapphire substrate increases, causing an increase in frequency fluctuation due to the difference in the acoustic speed.

However, since the acoustic speed of the aluminum nitride is close to the acoustic speed of the C-plane sapphire substrate, it is possible to suppress frequency fluctuation due to the difference in the acoustic speed compared to a case where a zinc oxide (ZnO) film is used.

The silicon dioxide and the aluminum nitride have different signs of delay time temperature coefficients (TCD), making it possible to obtain satisfactory frequency temperature characteristics.

In this embodiment, the second-order mode of Sezawa waves is used. The second-order mode of Sezawa waves is likely to be generated when the film thickness of the aluminum nitride film is large compared to a case where the first-order mode is used. Therefore, high stability can be achieved against variations in the film thickness and a higher acoustic speed can be obtained.

The material for the comb-like electrodes 21 and 22 is not particularly limited insofar as the material has conductivity, and preferably, aluminum or aluminum alloy is used since, when a film is formed on the sapphire substrate, crystallinity is satisfactory with respect to the crystalline system of the sapphire substrate.

The surface acoustic wave device 1 is used in a band-pass filter for a communication instrument, a resonator serving as a reference clock, or the like because of a unique resonance frequency or transmission characteristics, reduction in size, and a small number of components. When a surface acoustic wave device is used in a filter or a resonator, it is necessary that a frequency temperature coefficient (TCF) or a delay time temperature coefficient (TCD) representing temperature dependency or an electromechanical coupling coefficient $K^2$ representing performance of electromechanical conversion are satisfactory.

Example 5

A specific example of this embodiment will be described.

Figure 14:
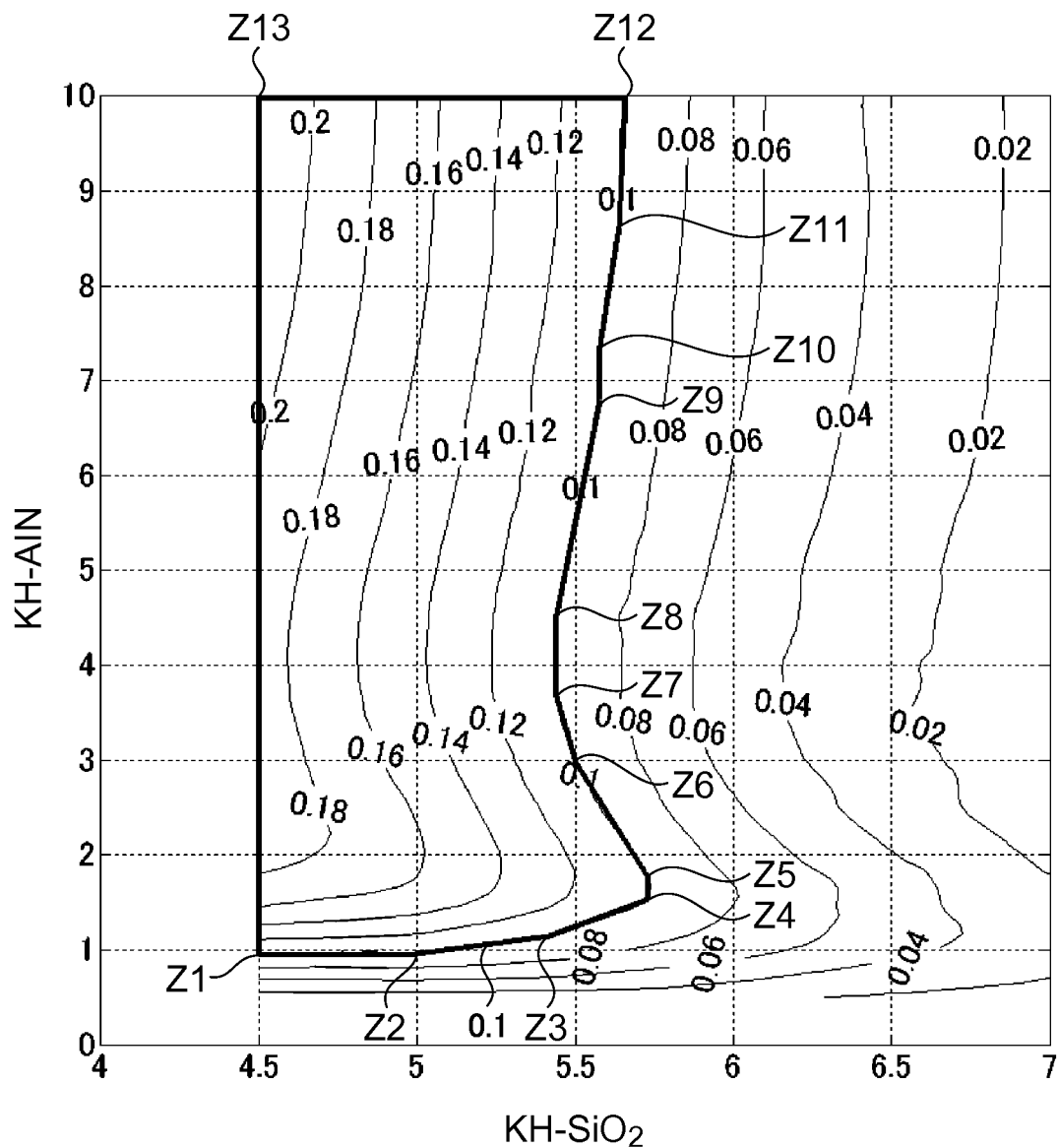
FIG. 14 is a graph showing a relationship between KH—AlN and KH—SiO$_2$, and an electromechanical coupling coefficient K$^2$ according to Example 5.

FIG. 14 is a graph showing a relationship between KH—AlN and KH—SiO$_2$, and an electromechanical coupling coefficient $K^2$ according to Example 5. The numeral described on the contour of FIG. 14 is the electromechanical coupling coefficient $K^2$(%). For example, when KH—SiO$_2$=5 and KH—AlN=3, the electromechanical coupling coefficient $K^2$ is equal to or greater than 0.14%. When the thickness of the aluminum nitride film 30 is ta, the thickness of the silicon dioxide film 40 is ts, and the wavelength of the surface acoustic waves is λ, the normalized film thickness of the aluminum nitride film 30 is expressed by KH—AlN=($2\pi/\lambda$)·ta and the normalized film thickness of the silicon dioxide film 40 is expressed by KH—SiO$_2$=($2\pi/\lambda$)·ts. In the numerical expressions, the symbol "·" represents multiplication and the symbol "/" represents division. When the relationship between the normalized film thicknesses is represented in coordinates, an appropriate area can be represented in the following coordinates. In FIG. 14, coordinate 1, coordinate 2, coordinate 3, . . . are represented by Z1, Z2, Z3, . . . .

coordinate 1 (KH—SiO$_2$,KH—AlN)=(4.50,1.00)
coordinate 2 (KH—SiO$_2$,KH—AlN)=(5.00,1.00)
coordinate 3 (KH—SiO$_2$,KH—AlN)=(5.41,1.17)
coordinate 4 (KH—SiO$_2$,KH—AlN)=(5.72,1.50)
coordinate 5 (KH—SiO$_2$,KH—AlN)=(5.72,1.79)
coordinate 6 (KH—SiO$_2$,KH—AlN)=(5.50,3.00)
coordinate 7 (KH—SiO$_2$,KH—AlN)=(5.44,3.67)
coordinate 8 (KH—SiO$_2$,KH—AlN)=(5.44,4.54)
coordinate 9 (KH—SiO$_2$,KH—AlN)=(5.57,6.75)
coordinate 10 (KH—SiO$_2$,KH—AlN)=(5.57,7.38)
coordinate 11 (KH—SiO$_2$,KH—AlN)=(5.63,8.63)
coordinate 12 (KH—SiO$_2$,KH—AlN)=(5.66,10.00)
coordinate 13 (KH—SiO$_2$,KH—AlN)=(4.50,10.00)

KH—AlN and KH—SiO$_2$ within an area defined by connecting the coordinates in order of the coordinate 1 to the coordinate 13 and connecting the coordinate 13 and the coordinate 1 are used.

Within this area, the electromechanical coupling coefficient $K^2$ equal to or greater than 0.1% which is necessary for exciting the surface acoustic waves can be obtained, obtaining high excitation efficiency.

If the areas defined by the respective coordinate systems of FIGS. 12 and 14 are combined, it is understood that, within this area, the acoustic speed equal to or higher than 5650 m/s is obtained.

Example 6

Next, Example 6 will be described. Example 6 presents a range in which an excellent delay time temperature coefficient (TCD) is obtained.

Figure 15:
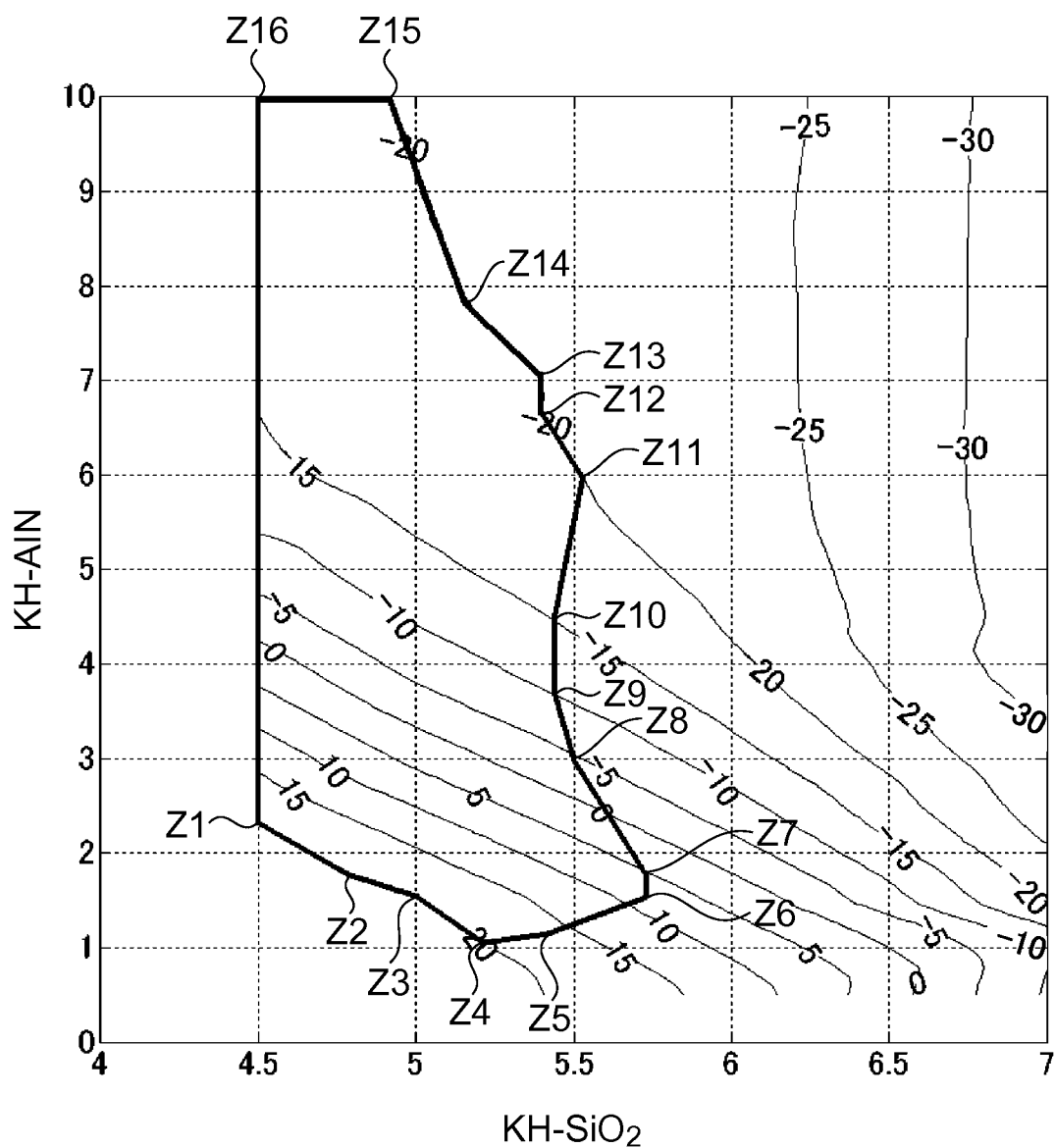
FIG. 15 is a graph showing a relationship between KH—AlN and KH—SiO$_2$, and a delay time temperature coefficient (TCD) according to Example 6.
Figure 16:
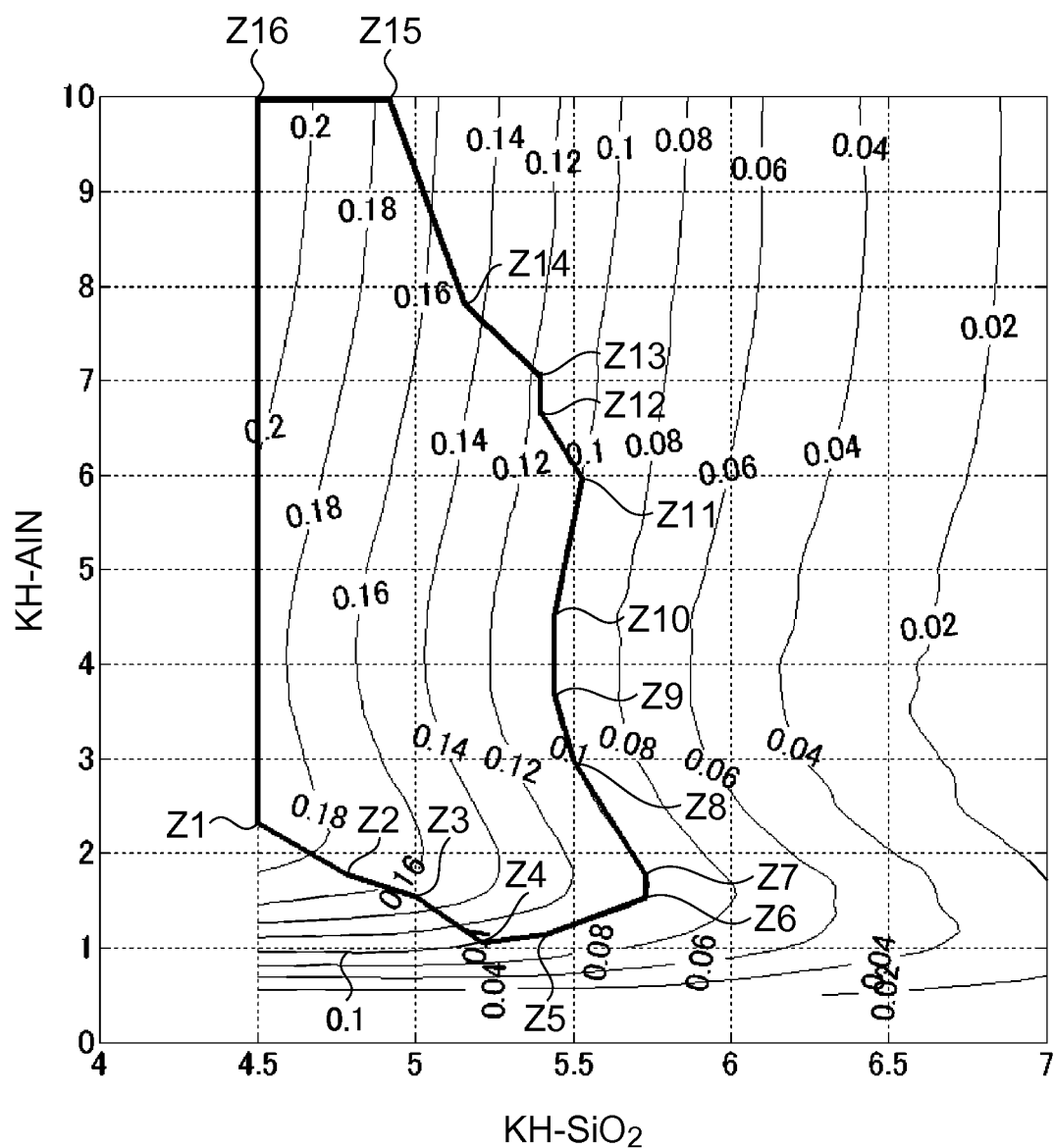
FIG. 16 is a graph showing a relationship with an electromechanical coupling coefficient ($K^2$).

FIG. 15 is a graph showing a relationship between KH—AlN and KH—SiO$_2$, and a delay time temperature coefficient (TCD) according to Example 6. FIG. 16 is a graph showing a relationship with an electromechanical coupling coefficient ($K^2$). The numeral described on the contour of FIG. 15 is the delay time temperature coefficient (ppm/° C.). For example, when KH—SiO$_2$=6 and KH—AlN=3, the delay time temperature coefficient is in a range of −15 to −10 ppm/° C.

When the thickness of the aluminum nitride film 30 is ta, the thickness of the silicon dioxide film 40 is ts, and the wavelength of the surface acoustic waves is λ, the normalized film thickness of the aluminum nitride film 30 is expressed by KH—AlN=$(2\pi/\lambda)$·ta and the normalized film thickness of the silicon dioxide film 40 is expressed by KH—SiO$_2$=$(2\pi/\lambda)$·ts When the relationship between the normalized film thicknesses is represented in coordinates, an appropriate area can be represented in the following coordinates. In FIGS. 15 and 16, coordinate 1, coordinate 2, coordinate 3, . . . are represented by Z1, Z2, Z3, . . . .

coordinate 1 (KH—SiO$_2$,KH—AlN)=(4.50,2.33)
    coordinate 2 (KH—SiO$_2$,KH—AlN)=(4.77,1.83)
    coordinate 3 (KH—SiO$_2$,KH—AlN)=(5.00,1.54)
    coordinate 4 (KH—SiO$_2$,KH—AlN)=(5.21,1.08)
    coordinate 5 (KH—SiO$_2$,KH—AlN)=(5.41,1.17)
    coordinate 6 (KH—SiO$_2$,KH—AlN)=(5.72,1.50)
    coordinate 7 (KH—SiO$_2$,KH—AlN)=(5.72,1.79)
    coordinate 8 (KH—SiO$_2$,KH—AlN)=(5.50,3.00)
    coordinate 9 (KH—SiO$_2$,KH—AlN)=(5.44,3.67)
    coordinate 10 (KH—SiO$_2$,KH—AlN)=(5.44,4.54)
    coordinate 11 (KH—SiO$_2$,KH—AlN)=(5.52,6.00)
    coordinate 12 (KH—SiO$_2$,KH—AlN)=(5.39,6.67)
    coordinate 13 (KH—SiO$_2$,KH—AlN)=(5.39,7.08)
    coordinate 14 (KH—SiO$_2$,KH—AlN)=(5.15,7.83)
    coordinate 15 (KH—SiO$_2$,KH—AlN)=(4.91,10.00)
    coordinate 16 (KH—SiO$_2$,KH—AlN)=(4.50,10.00)

KH—AlN and KH—SiO$_2$ within an area defined by connecting the coordinates in order of the coordinate 1 to the coordinate 16 and connecting the coordinate 16 and the coordinate 1 are used.

Within this area, the conditions in which the delay time temperature coefficient (TCD) is in a range of −20 ppm/° C. to +20 ppm/° C. and the electromechanical coupling coefficient $K^2$ is equal to or greater than 0.1% can be satisfied.

If the areas defined by the respective coordinate systems of FIGS. 12 and 15 are combined, it is understood that, within this area, the acoustic speed equal to or higher than 5650 m/s is obtained.

Example 7

Next, Example 7 will be described. When a surface acoustic wave device is used as a resonator for an oscillator, it is necessary that the delay time temperature coefficient (TCD) is in a small range while the electromechanical coupling coefficient $K^2$ is secured to be equal to or greater than 0.1%. In Example 7, it is presented that the delay time temperature coefficient (TCD) is in a smaller range compared to Example 2 described above while the electromechanical coupling coefficient $K^2$ is maintained to be equal to or greater than 0.1%.

Figure 17:
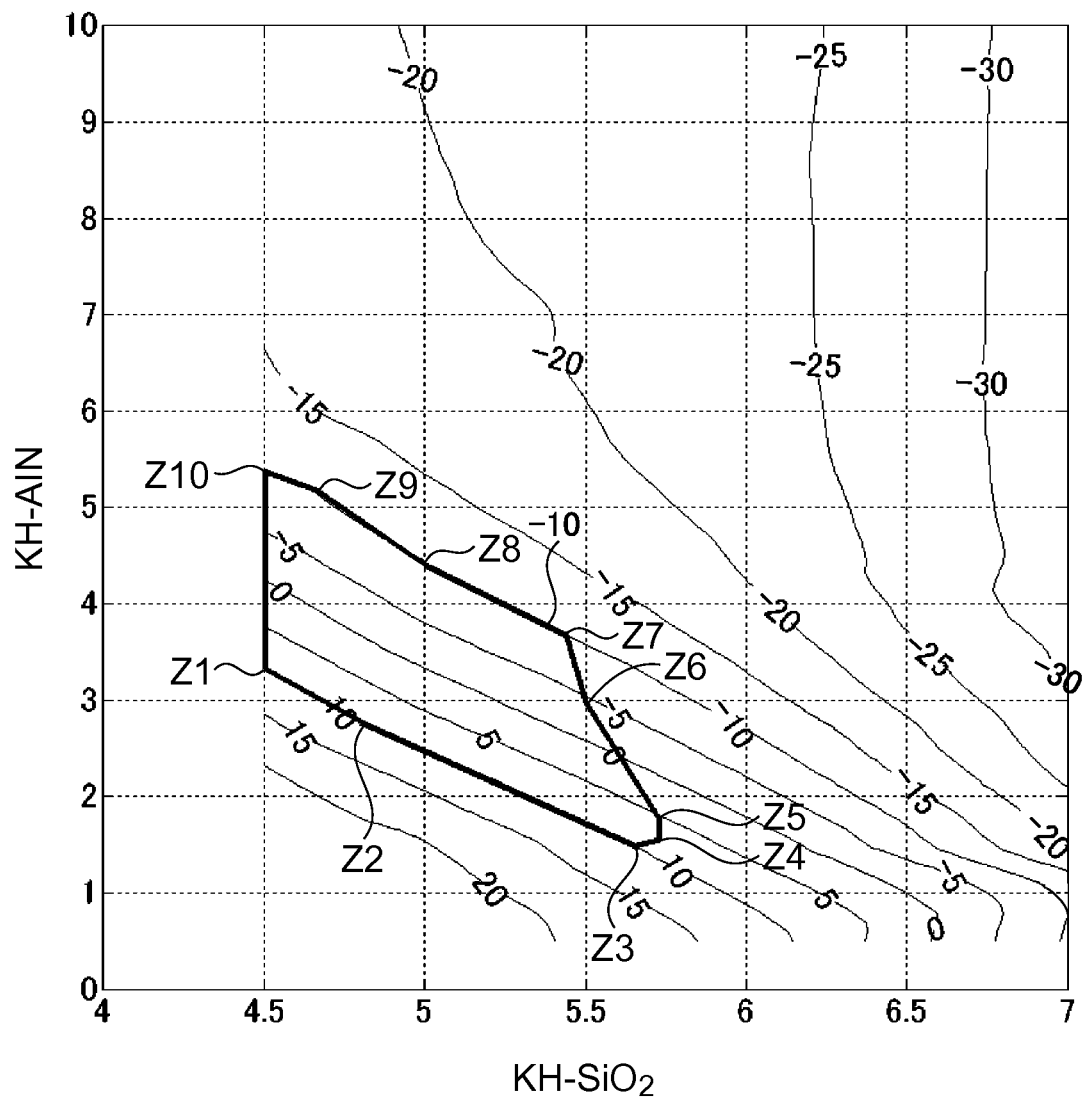
FIG. 17 is a graph showing a relationship between KH—AlN and KH—SiO$_2$, and a delay time temperature coefficient (TCD) according to Example 7.
Figure 18:
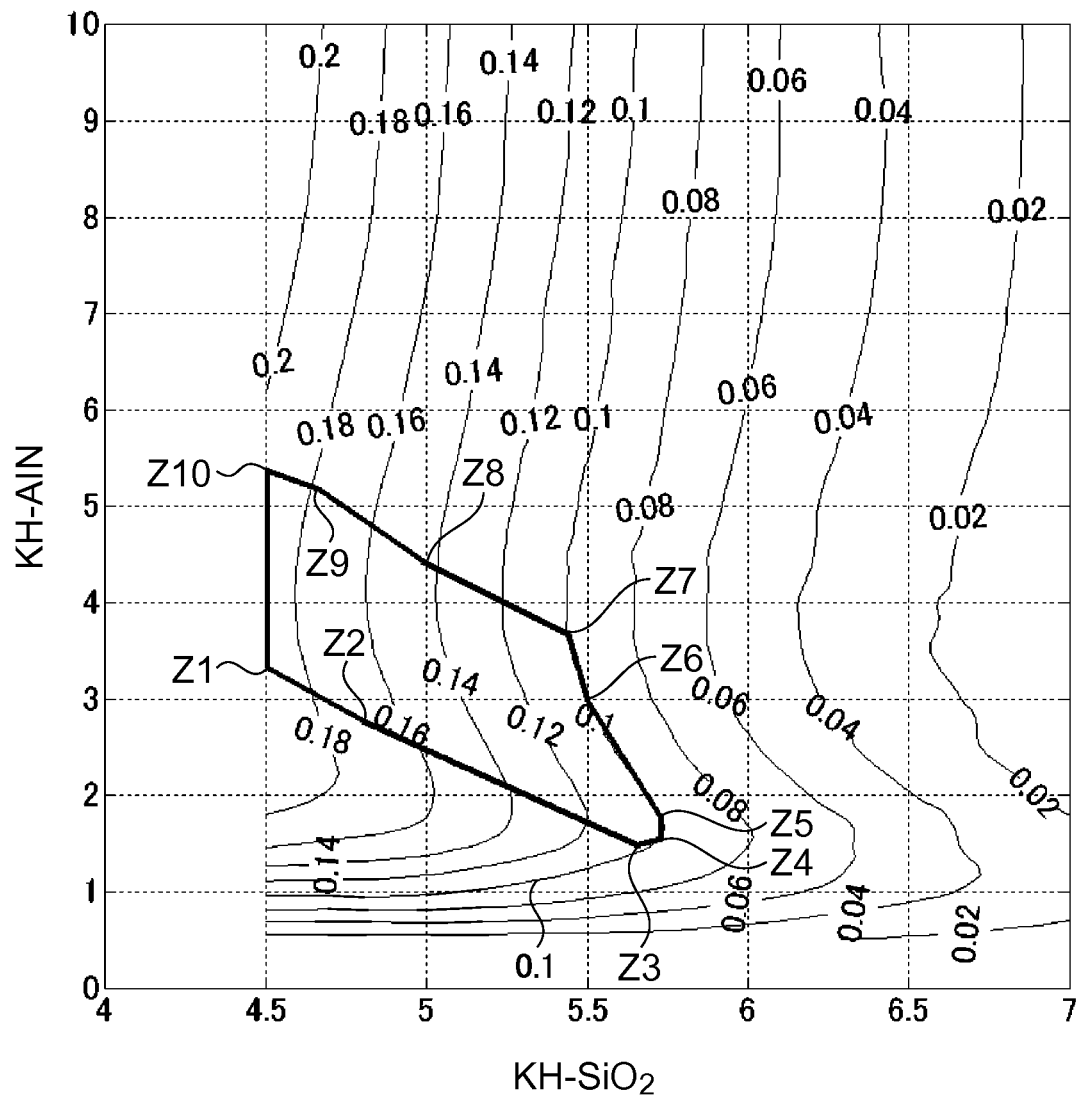
FIG. 18 is a graph showing a relationship with an electromechanical coupling coefficient $K^2$.

FIG. 17 is a graph showing a relationship between KH—AlN and KH—SiO$_2$, and a delay time temperature coefficient (TCD) according to Example 3. FIG. 18 is a graph showing a relationship with an electromechanical coupling coefficient $K^2$. The numeral described on the contour of FIG. 17 is the delay time temperature coefficient (ppm/° C.). The numeral described on the contour of FIG. 18 is the electromechanical coupling coefficient $K^2$(%). When the thickness of the aluminum nitride film 30 is ta, the thickness of the silicon dioxide film 40 is ts, and the wavelength of the surface acoustic waves is λ, the normalized film thickness of the aluminum nitride film 30 is expressed by KH—AlN=$(2\pi/\lambda)$·ta and the normalized film thickness of the silicon dioxide film 40 is expressed by KH—SiO$_2$=$(2\pi/\lambda)$·ts. When the relationship between the normalized film thicknesses is represented in coordinates, an appropriate area can be represented in the following coordinates. In FIGS. 17 and 18, coordinate 1, coordinate 2, coordinate 3, . . . are represented by Z1, Z2, Z3, . . . .

coordinate 1 (KH—SiO$_2$,KH—AlN)=(4.50,3.33)
    coordinate 2 (KH—SiO$_2$,KH—AlN)=(4.84,2.71)
    coordinate 3 (KH—SiO$_2$,KH—AlN)=(5.65,1.48)
    coordinate 4 (KH—SiO$_2$,KH—AlN)=(5.72,1.50)
    coordinate 5 (KH—SiO$_2$,KH—AlN)=(5.72,1.79)
    coordinate 6 (KH—SiO$_2$,KH—AlN)=(5.50,3.00)
    coordinate 7 (KH—SiO$_2$,KH—AlN)=(5.44,3.67)
    coordinate 8 (KH—SiO$_2$,KH—AlN)=(5.00,4.42)
    coordinate 9 (KH—SiO$_2$,KH—AlN)=(4.66,5.17)
    coordinate 10 (KH—SiO$_2$,KH—AlN)=(4.50,5.38)

KH—AlN and KH—SiO$_2$ within an area defined by connecting the coordinates in order of the coordinate 1 to the coordinate 10 and connecting the coordinate 10 and the coordinate 1 are used.

Within this area, the conditions in which the delay time temperature coefficient (TCD) is in a range of −10 ppm/° C. to +10 ppm/° C. and the electromechanical coupling coefficient $K^2$ is equal to or greater than 0.1% can be satisfied.

If the areas defined by the respective coordinate systems of FIGS. 12 and 17 are combined, it is understood that, within this area, the acoustic speed equal to or higher than 5650 m/s can be realized, thereby realizing a surface acoustic wave device appropriate to an oscillator in a high frequency band.

Example 8

Next, Example 8 will be described. When a surface acoustic wave device is used as a resonator of an oscillator for a communication instrument, it is necessary that the delay time temperature coefficient (TCD) is in a small range while the electromechanical coupling coefficient $K^2$ is secured to be equal to or greater than 0.1%. In Example 8, it is presented that the delay time temperature coefficient (TCD) is in a smaller range compared to Example 3 described above while the electromechanical coupling coefficient $K^2$ is maintained to be equal to or greater than 0.1%.

Figure 19:
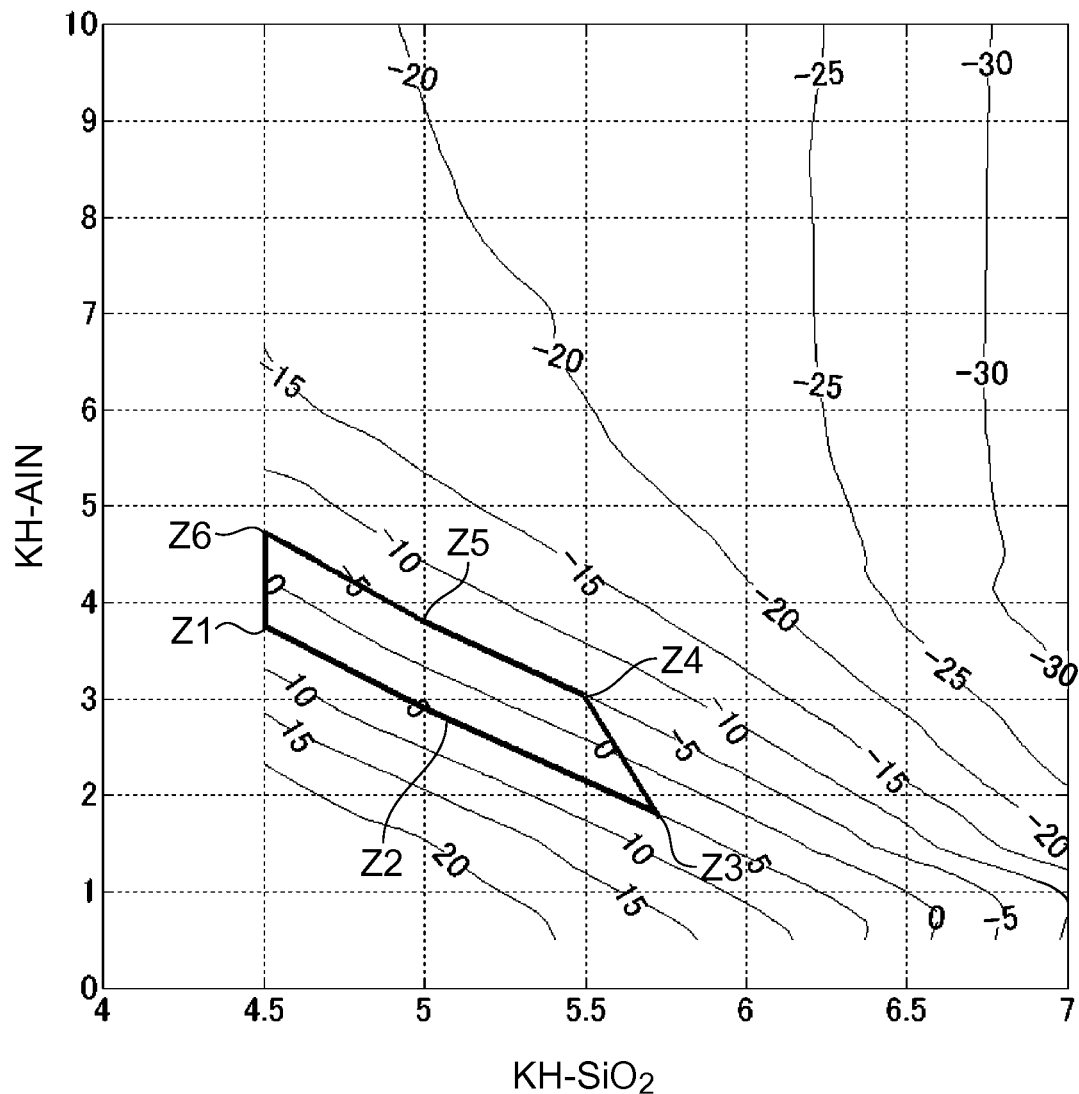
FIG. 19 is a graph showing a relationship between KH—AlN and KH—SiO$_2$, and a delay time temperature coefficient (TCD) according to Example 8.
Figure 20:
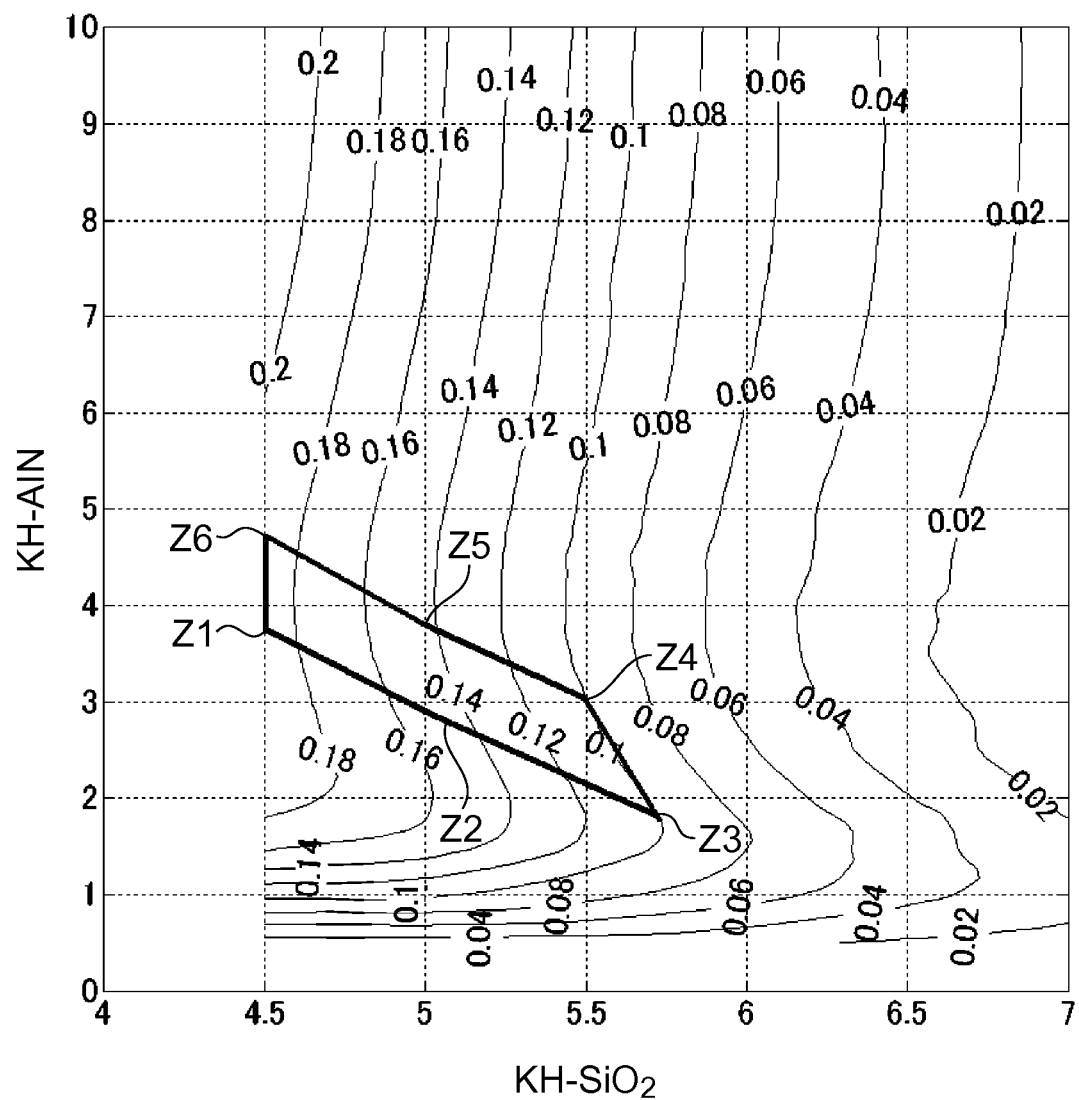
FIG. 20 is a graph showing a relationship with an electromechanical coupling coefficient $K^2$.

FIG. 19 is a graph showing a relationship between KH—AlN and KH—SiO$_2$, and a delay time temperature coefficient (TCD) according to Example 8. FIG. 20 is a graph showing a relationship with an electromechanical coupling coefficient $K^2$. The numeral described on the contour of FIG. 19 is the delay time temperature coefficient (ppm/° C.). The numeral described on the contour of FIG. 20 is the electromechanical coupling coefficient $K^2$(%). When the thickness of the aluminum nitride film 30 is ta, the thickness of the silicon dioxide film 40 is ts, and the wavelength of the surface acoustic waves is λ, the normalized film thickness of the aluminum nitride film 30 is expressed by KH—AlN=$(2\pi/\lambda)$·ta and the normalized film thickness of the silicon dioxide film 40 is expressed by KH—SiO$_2$=$(2\pi/\lambda)$·ts. When the relationship between the normalized film thicknesses is represented in coordinates, an appropriate area can be represented in the following coordinates. In FIGS. 19 and 20, coordinate 1, coordinate 2, coordinate 3, . . . are represented by Z1, Z2, Z3, . . . .

coordinate 1 (KH—SiO$_2$,KH—AlN)=(4.50,3.75)
  coordinate 2 (KH—SiO$_2$,KH—AlN)=(5.10,2.75)
  coordinate 3 (KH—SiO$_2$,KH—AlN)=(5.72,1.79)
  coordinate 4 (KH—SiO$_2$,KH—AlN)=(5.50,3.00)
  coordinate 5 (KH—SiO$_2$,KH—AlN)=(5.00,3.83)
  coordinate 6 (KH—SiO$_2$,KH—AlN)=(4.50,4.75)

KH—AlN and KH—SiO$_2$ within an area defined by connecting the coordinates in order of the coordinate 1 to the coordinate 6 and connecting the coordinate 6 and the coordinate 1 are used.

Within this area, the conditions in which the delay time temperature coefficient (TCD) is in a range of −5 ppm/° C. to +5 ppm/° C. and the electromechanical coupling coefficient $K^2$ is equal to or greater than 0.1% can be satisfied.

If the areas defined by the respective coordinate systems of FIGS. 12 and 19 are combined, it is understood that, within this area, the acoustic speed equal to or higher than 5650 m/s can be realized, thereby realizing a surface acoustic wave device appropriate to an oscillator in a high frequency band.

Third Embodiment

Although in the first embodiment, the first-order mode of Sezawa waves is used as acoustic waves and in the second embodiment, the second-order mode of Sezawa waves is used as acoustic waves, in this embodiment, a case will be described below where the fundamental mode of Rayleigh waves is used as acoustic waves. The structure of a surface acoustic wave device of this embodiment is the same as in the surface acoustic wave device 1 shown in FIG. 1, thus description thereof will be omitted.

Figure 21:
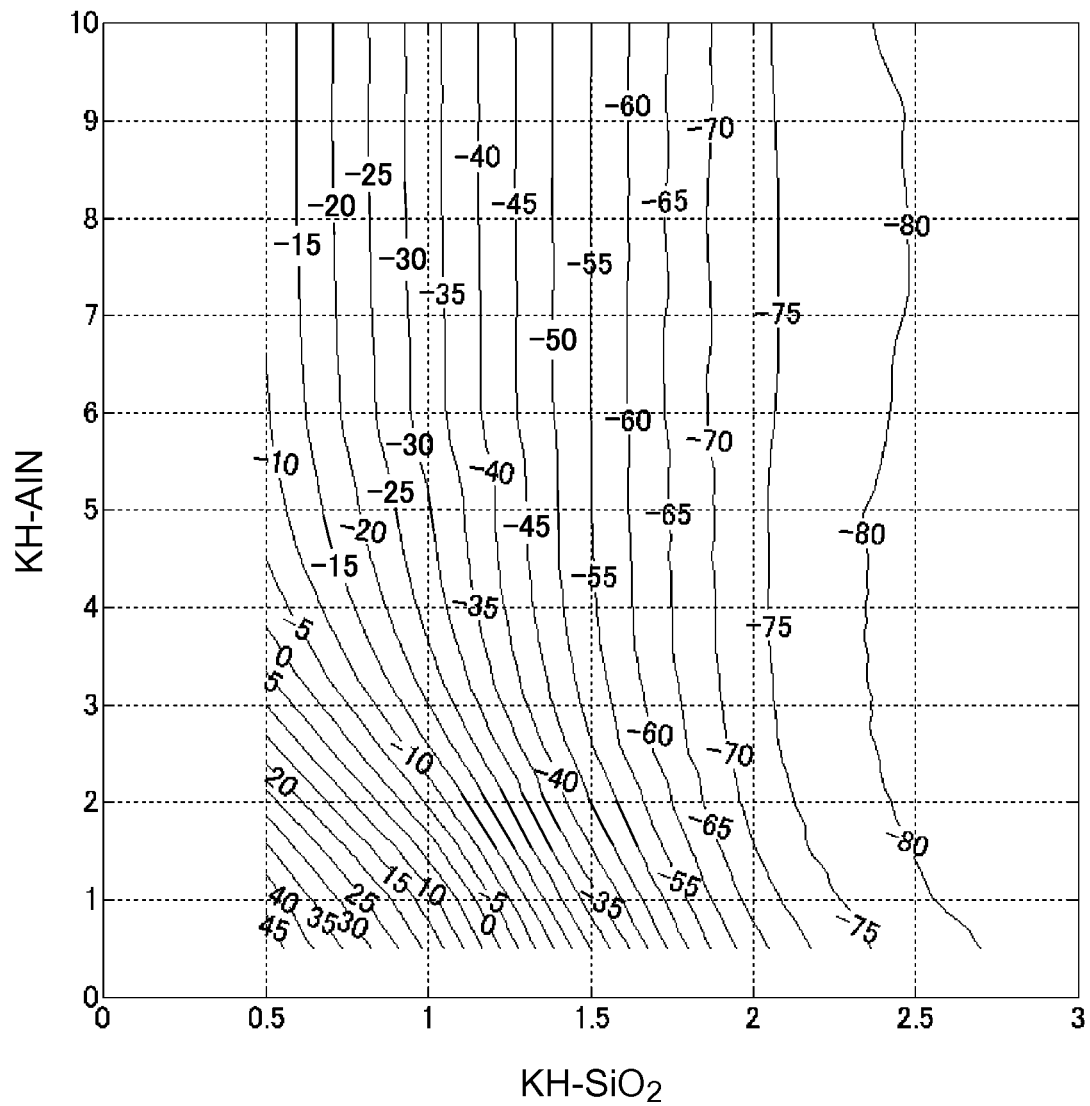
FIG. 21 is a graph showing a relationship between the normalized film thickness (KH—AlN) of an aluminum nitride film and the normalized film thickness (KH—SiO$_2$) of a silicon dioxide film, and a delay time temperature coefficient (TCD) in a surface acoustic wave device according to a third embodiment.
Figure 22:
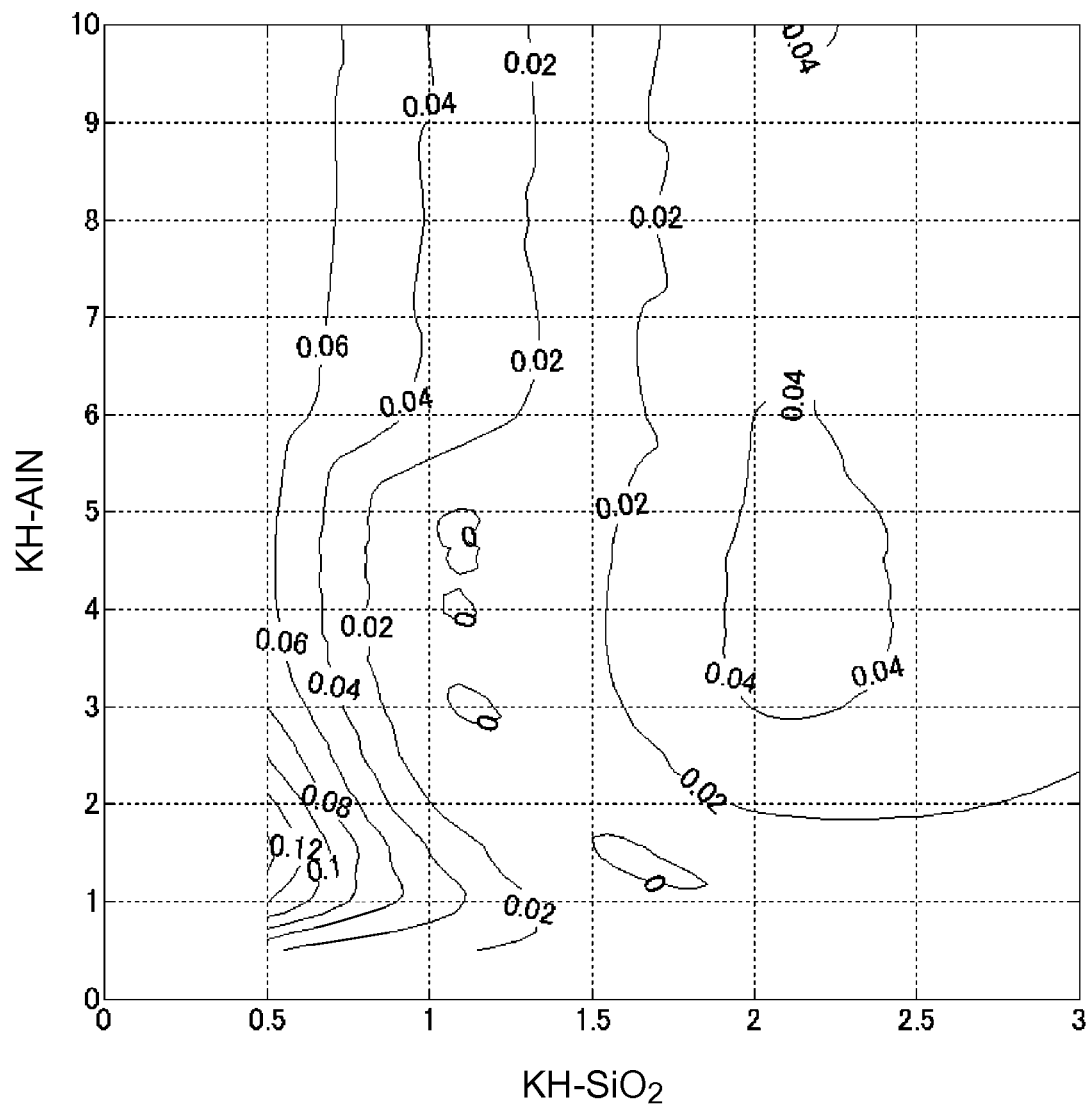
FIG. 22 is a graph showing a relationship between KH—AlN and KH—SiO$_2$, and an electromechanical coupling coefficient $K^2$ according to a third embodiment.
Figure 23:
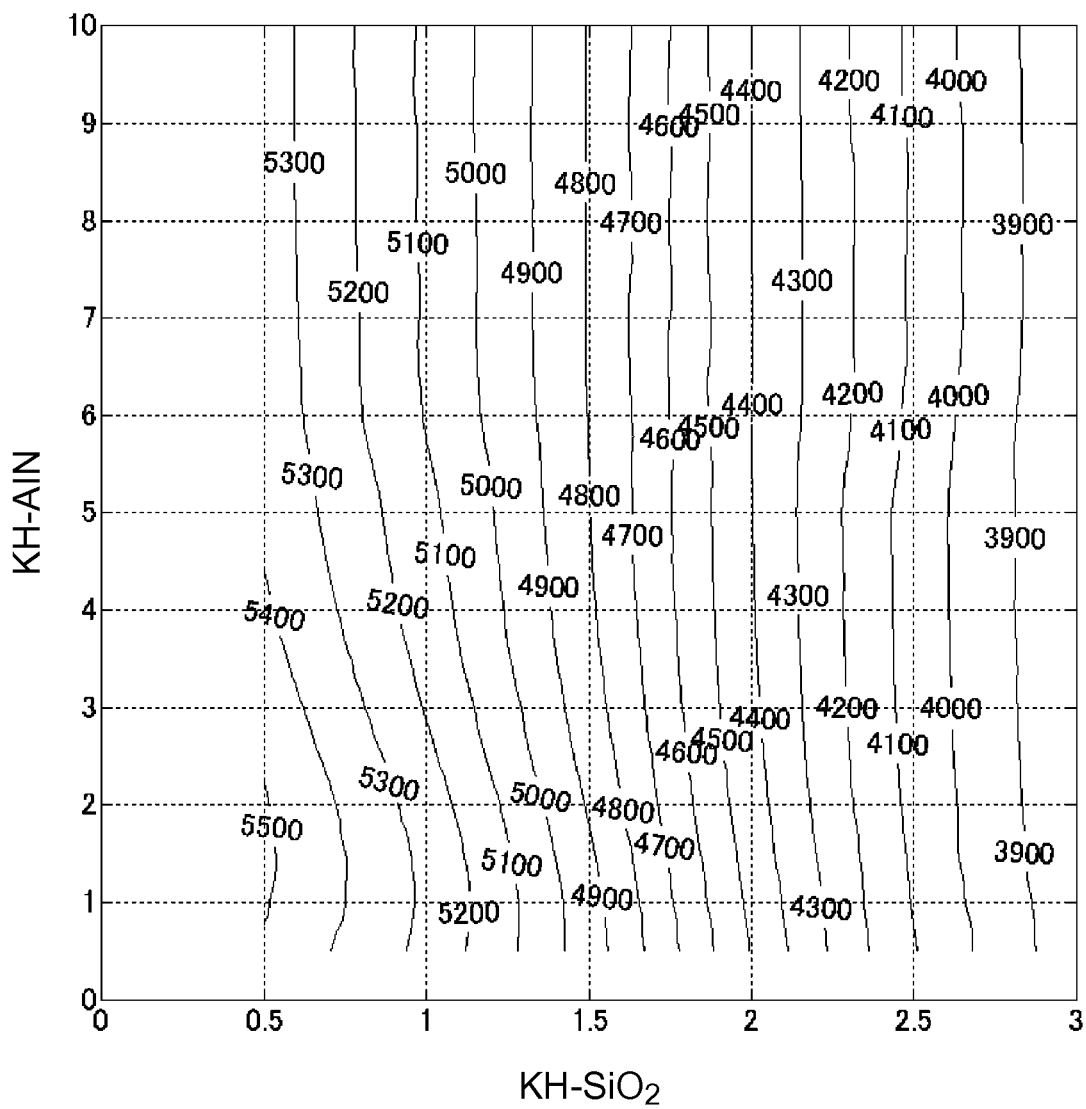
FIG. 23 is a graph showing a relationship between KH—AlN and KH—SiO$_2$, and the acoustic speed of Rayleigh waves propagating on a sapphire substrate according to the third embodiment.

FIG. 21 is a graph showing a relationship between the normalized film thickness (hereinafter, expressed by KH—AlN) of the aluminum nitride film 30 and the normalized film thickness (hereinafter, expressed by KH—SiO$_2$) of the silicon dioxide film 40, and a delay time temperature coefficient (TCD) in the surface acoustic wave device of this embodiment. FIG. 22 is a graph showing a relationship with an electromechanical coupling coefficient $K^2$. FIG. 23 is a graph showing a relationship with the acoustic speed [m/s] of Rayleigh waves propagating on the sapphire substrate 10. When the thickness of the aluminum nitride film 30 is ta, the thickness of the silicon dioxide film 40 is ts, and the wavelength of the surface acoustic waves is λ, the normalized film thickness of the aluminum nitride film 30 is expressed by KH—AlN=$(2\pi/\lambda)$·ta and the normalized film thickness of the silicon dioxide film 40 is expressed by KH—SiO$_2$=$(2\pi/\lambda)$·ts. In the graphs of FIGS. 21 to 23, the vertical axis represents KH—AlN and the horizontal axis represents KH—SiO$_2$.

As shown in FIG. 21, in the measurement range in which KH—SiO$_2$ is in a range of 0.5 to 3, it is understood that the delay time temperature coefficient (TCD) is suppressed in a range of −80 ppm/° C. to +45 ppm/° C.

As shown in FIG. 22, it is understood that there is a range in which the electromechanical coupling coefficient $K^2$ is equal to or greater than 0.02%, and when KH—SiO$_2$ is around 0.5%, there is a range in which the electromechanical coupling coefficient $K^2$ is preferably equal to or greater than 0.1% through excitation.

As shown in FIG. 23, in the measurement range in which KH—SiO$_2$ is in a range of 0.5 to 3, it is understood that a high acoustic speed equal to or higher than 3900 m/s is obtained.

According to this embodiment, a C-plane sapphire substrate is used as a substrate. While the acoustic speed of Rayleigh waves propagating on a quartz substrate is limited to 3100 m/s, the sapphire substrate has an acoustic speed equal to or higher than 4500 m/s. Thus, a high acoustic speed can be obtained compared to a case where quartz is used as a substrate.

The acoustic speed of the aluminum nitride is about 5600 m/s and is close to the acoustic speed of the C-plane sapphire substrate, such that it is possible to suppress frequency fluctuation due to the difference in the acoustic speed. Meanwhile, as in the related art, if a zinc oxide (ZnO) film is used as a piezoelectric film, the acoustic speed of the zinc oxide (ZnO) film is about 3100 m/s and is lower than the acoustic speed of the C-plane sapphire substrate. Accordingly, at the time of a higher frequency, the difference from the acoustic speed of the C-plane sapphire substrate increases, causing an increase in frequency fluctuation due to the difference in the acoustic speed.

However, since the acoustic speed of the aluminum nitride is close to the acoustic speed of the C-plane sapphire substrate, it is possible to suppress frequency fluctuation due to the difference in the acoustic speed compared to a case where a zinc oxide (ZnO) film is used.

The silicon dioxide and the aluminum nitride have different signs of delay time temperature coefficients (TCD), making it possible to obtain satisfactory frequency temperature characteristics.

In this embodiment, the fundamental mode of Rayleigh waves is used as acoustic waves. The fundamental mode of Rayleigh waves are easily generated when the film thickness of the aluminum nitride film is small compared to a case where a high-order mode, such as the first-order or second order-mode of Sezawa waves, is used. Therefore, since variations in the film thickness do not easily occur, high stability can be achieved, and a higher acoustic speed can be obtained.

The material for the comb-like electrodes 21 and 22 is not particularly limited insofar as the material has conductivity, and preferably, aluminum or aluminum alloy is used since, when a film is formed on the sapphire substrate, crystallinity is satisfactory with respect to the crystalline system of the sapphire substrate.

The surface acoustic wave device 1 is used in a band-pass filter for a communication instrument, a resonator serving as a reference clock, or the like because of a unique resonance frequency or transmission characteristics, reduction in size, and a small number of components. When a surface acoustic wave device is used in a filter or a resonator, it is necessary that a frequency temperature coefficient (TCF) or a delay time temperature coefficient (TCD) representing temperature dependency or an electromechanical coupling coefficient $K^2$ representing performance of electromechanical conversion are satisfactory.

Example 9

A specific example of this embodiment will be described.

Figure 24:
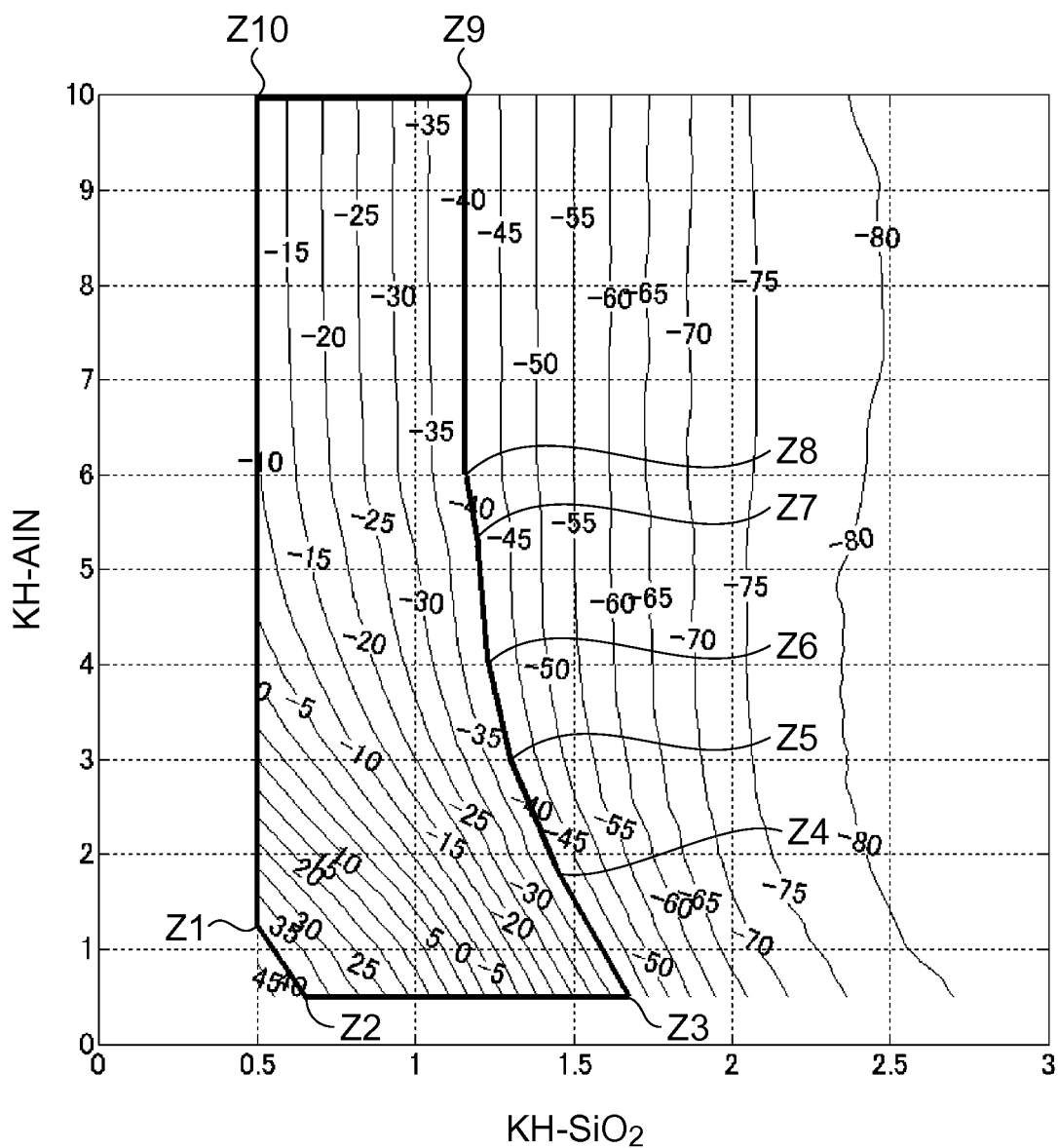
FIG. 24 is a graph showing a relationship between KH—AlN and KH—SiO$_2$, and a delay time temperature coefficient according to Example 9.
Figure 25:
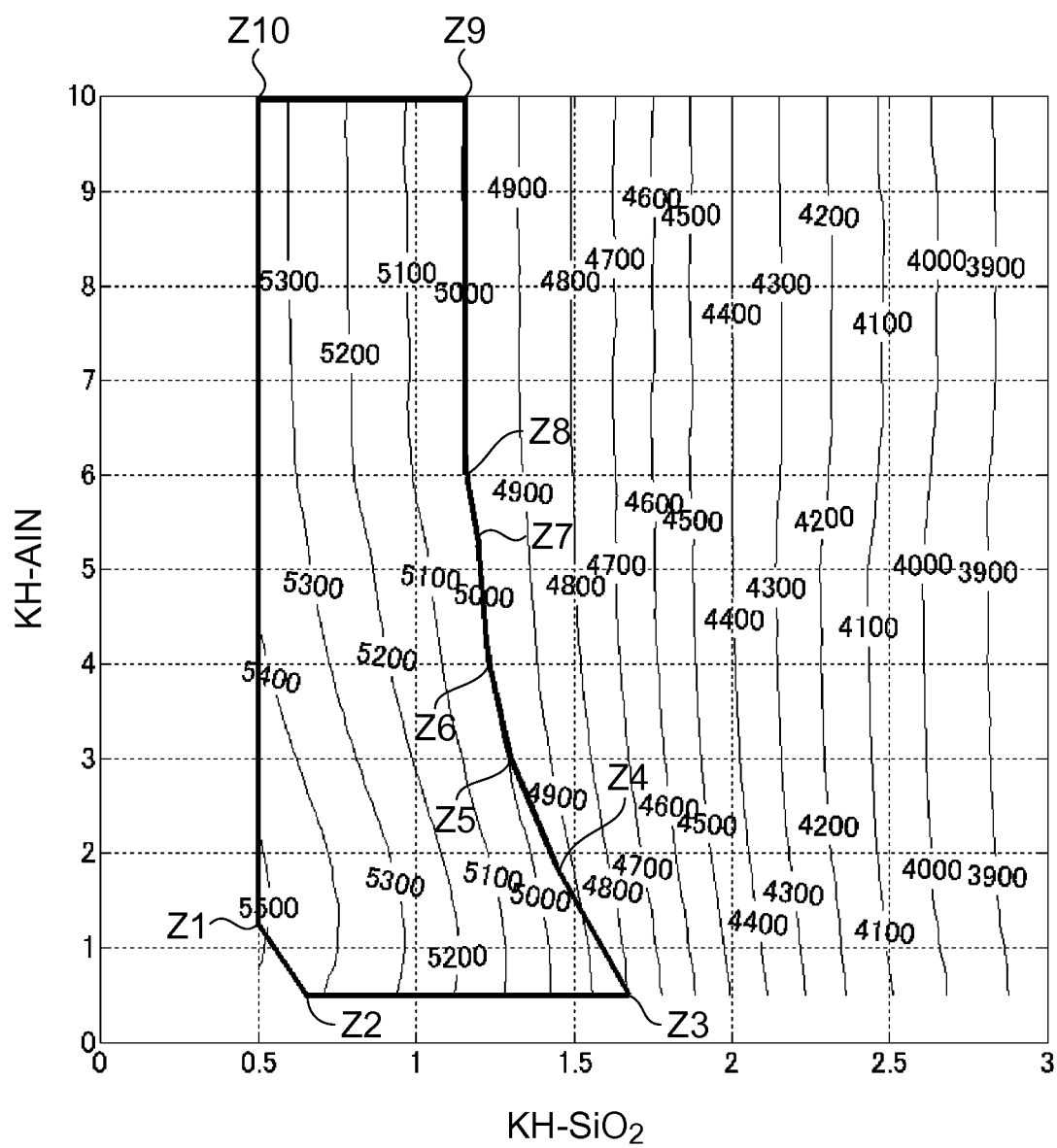
FIG. 25 is a graph showing a relationship between KH—AlN and KH—SiO$_2$, and the acoustic speed of Rayleigh waves propagating on a sapphire substrate according to Example 9.

FIG. 24 is a graph showing a relationship between KH—AlN and KH—SiO₂, and a delay time temperature coefficient according to Example 9. FIG. 25 is a graph showing a relationship with the acoustic speed of Rayleigh waves propagating on a sapphire substrate. The numeral described on the contour of FIG. 24 is the delay time temperature coefficient (ppm/° C.). For example, when KH—SiO₂=1 and KH—AlN=3, the delay time temperature coefficient is −20 ppm/° C. The numeral described on the contour of FIG. 25 is the acoustic speed (m/s) of Rayleigh waves propagating on a sapphire substrate. For example, when KH—SiO₂=1 and KH—AlN=3, the acoustic speed is 5200 m/s.

When the thickness of the aluminum nitride film 30 is ta, the thickness of the silicon dioxide film 40 is ts, and the wavelength of the surface acoustic waves is λ, the normalized film thickness of the aluminum nitride film 30 is expressed by KH—AlN=(2π/λ)·ta and the normalized film thickness of the silicon dioxide film 40 is expressed by KH—SiO₂=(2π/λ)·ts. In the numerical expressions, the symbol "·" represents multiplication and the symbol "/" represents division. When the relationship between the normalized film thicknesses is represented in coordinates, an appropriate area can be represented in the following coordinates. In FIGS. 24 and 25, coordinate 1, coordinate 2, coordinate 3, . . . are represented by Z1, Z2, Z3, . . . .

coordinate 1 (KH—SiO₂,KH—AlN)=(0.50,1.25)
coordinate 2 (KH—SiO₂,KH—AlN)=(0.65,0.50)
coordinate 3 (KH—SiO₂,KH—AlN)=(1.67,0.50)
coordinate 4 (KH—SiO₂,KH—AlN)=(1.44,1.83)
coordinate 5 (KH—SiO₂,KH—AlN)=(1.29,3.00)
coordinate 6 (KH—SiO₂,KH—AlN)=(1.22,4.00)
coordinate 7 (KH—SiO₂,KH—AlN)=(1.20,5.29)
coordinate 8 (KH—SiO₂,KH—AlN)=(1.18,6.00)
coordinate 9 (KH—SiO₂,KH—AlN)=(1.18,10.00)
coordinate 10 (KH—SiO₂,KH—AlN)=(0.50,10.00)

KH—AlN and KH—SiO₂ within an area defined by connecting the coordinates in order of the coordinate 1 to the coordinate 10 and connecting the coordinate 10 and the coordinate 1 are used.

Within this area, the delay time temperature coefficient (TCD) is in a range of −40 ppm/° C. to +40 ppm/° C., and a high acoustic speed equal to or higher than 4800 m/s can be realized.

Example 10

Next, Example 10 will be described. Example 10 presents a range in which an excellent delay time temperature coefficient (TCD) is obtained.

Figure 26:
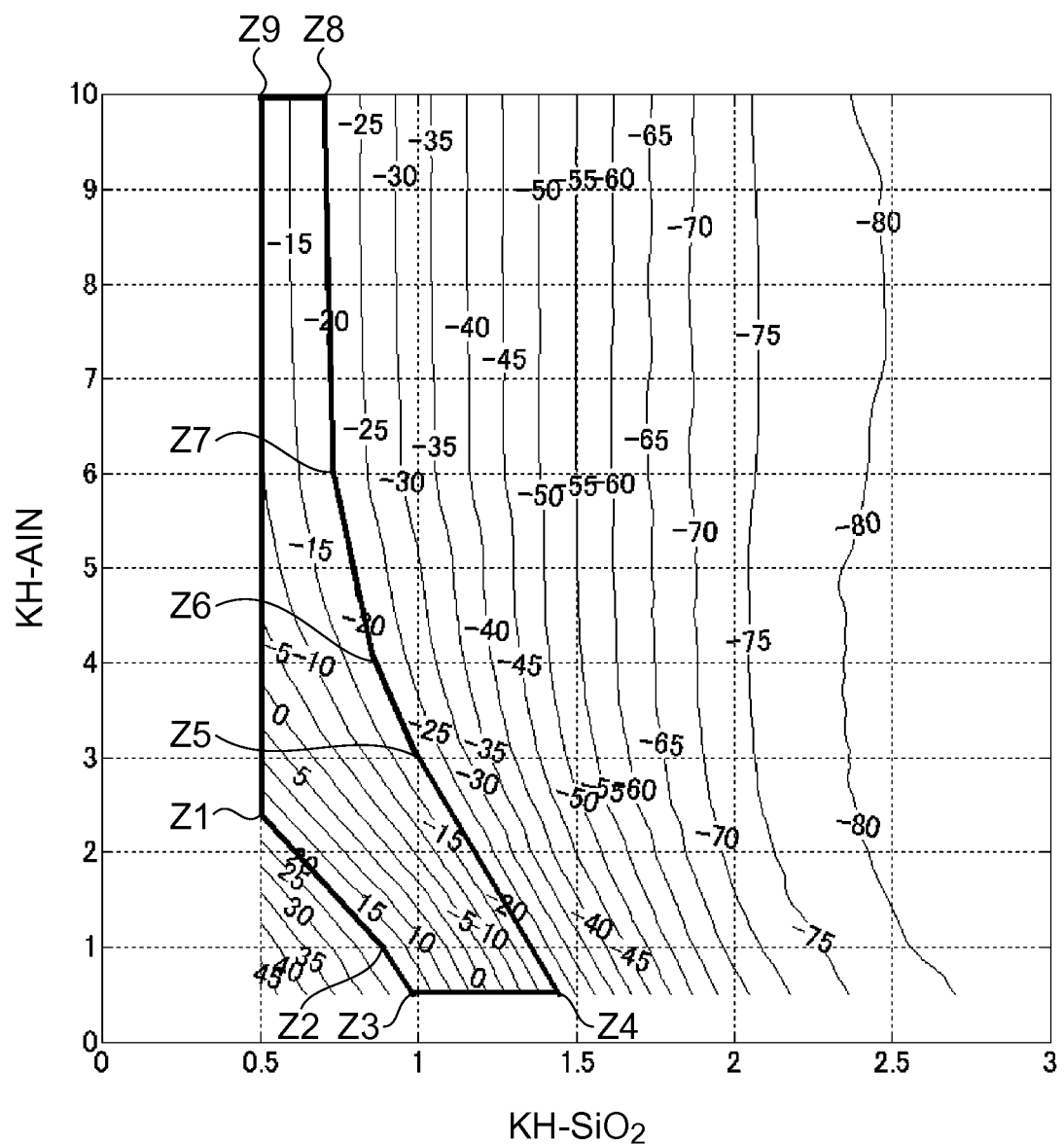
FIG. 26 is a graph showing a relationship between KH—AlN and KH—SiO$_2$, and a delay time temperature coefficient according to Example 10.
Figure 27:
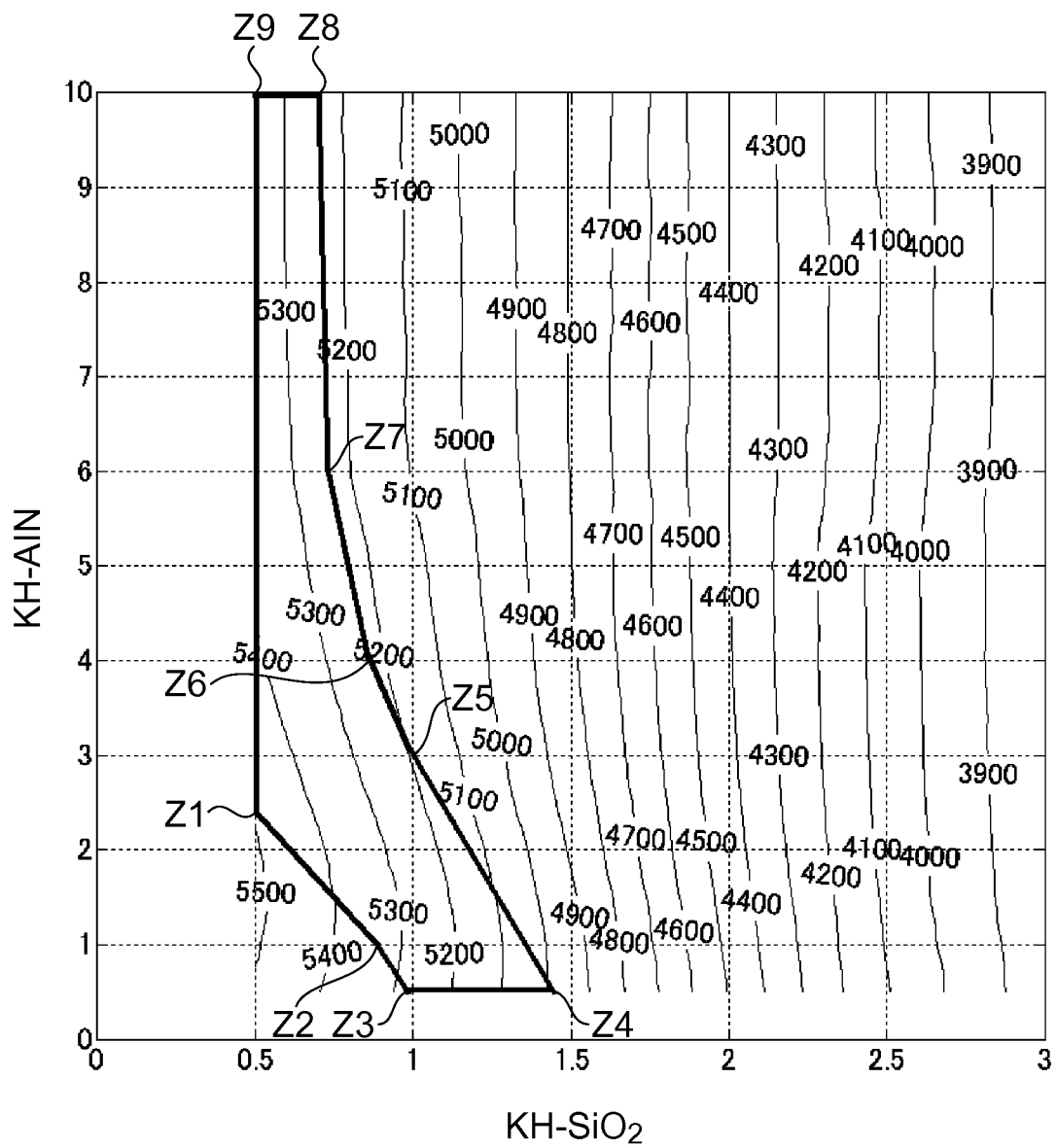
FIG. 27 is a graph showing a relationship between KH—AlN and KH—SiO$_2$, and the acoustic speed of Rayleigh waves propagating on a sapphire substrate according to Example 10.

FIG. 26 is a graph showing a relationship between KH—AlN and KH—SiO₂, and a delay time temperature coefficient (TCD) according to Example 10. FIG. 27 is a graph showing a relationship with the acoustic speed of Rayleigh waves propagating on a sapphire substrate.

When the thickness of the aluminum nitride film 30 is ta, the thickness of the silicon dioxide film 40 is ts, and the wavelength of the surface acoustic waves is λ, the normalized film thickness of the aluminum nitride film 30 is expressed by KH—AlN=(2π/λ)·ta and the normalized film thickness of the silicon dioxide film 40 is expressed by KH—SiO₂=(2π/λ)·ts. When the relationship between the normalized film thicknesses is represented in coordinates, an appropriate area can be represented in the following coordinates. In FIGS. 26 and 27, coordinate 1, coordinate 2, coordinate 3, . . . are represented by Z1, Z2, Z3, . . . .

coordinate 1 (KH—SiO₂,KH—AlN)=(0.50,2.37)
coordinate 2 (KH—SiO₂,KH—AlN)=(0.89,1.00)
coordinate 3 (KH—SiO₂,KH—AlN)=(0.98,0.50)
coordinate 4 (KH—SiO₂,KH—AlN)=(1.43,0.50)
coordinate 5 (KH—SiO₂,KH—AlN)=(1.00,3.00)
coordinate 6 (KH—SiO₂,KH—AlN)=(0.85,4.00)
coordinate 7 (KH—SiO₂,KH—AlN)=(0.72,6.00)
coordinate 8 (KH—SiO₂,KH—AlN)=(0.70,10.00)
coordinate 9 (KH—SiO₂,KH—AlN)=(0.50,10.00)

KH—AlN and KH—SiO₂ within an area defined by connecting the coordinates in order of the coordinate 1 to the coordinate 9 and connecting the coordinate 9 and the coordinate 1 are used.

Within this area, the delay time temperature coefficient (TCD) is in a range of −20 ppm/° C. to +20 ppm/° C., and a high acoustic speed equal to or higher than 5000 m/s can be realized.

Example 11

Next, Example 11 will be described. Example 11 presents a range in which a more excellent delay time temperature coefficient (TCD) is obtained.

Figure 28:
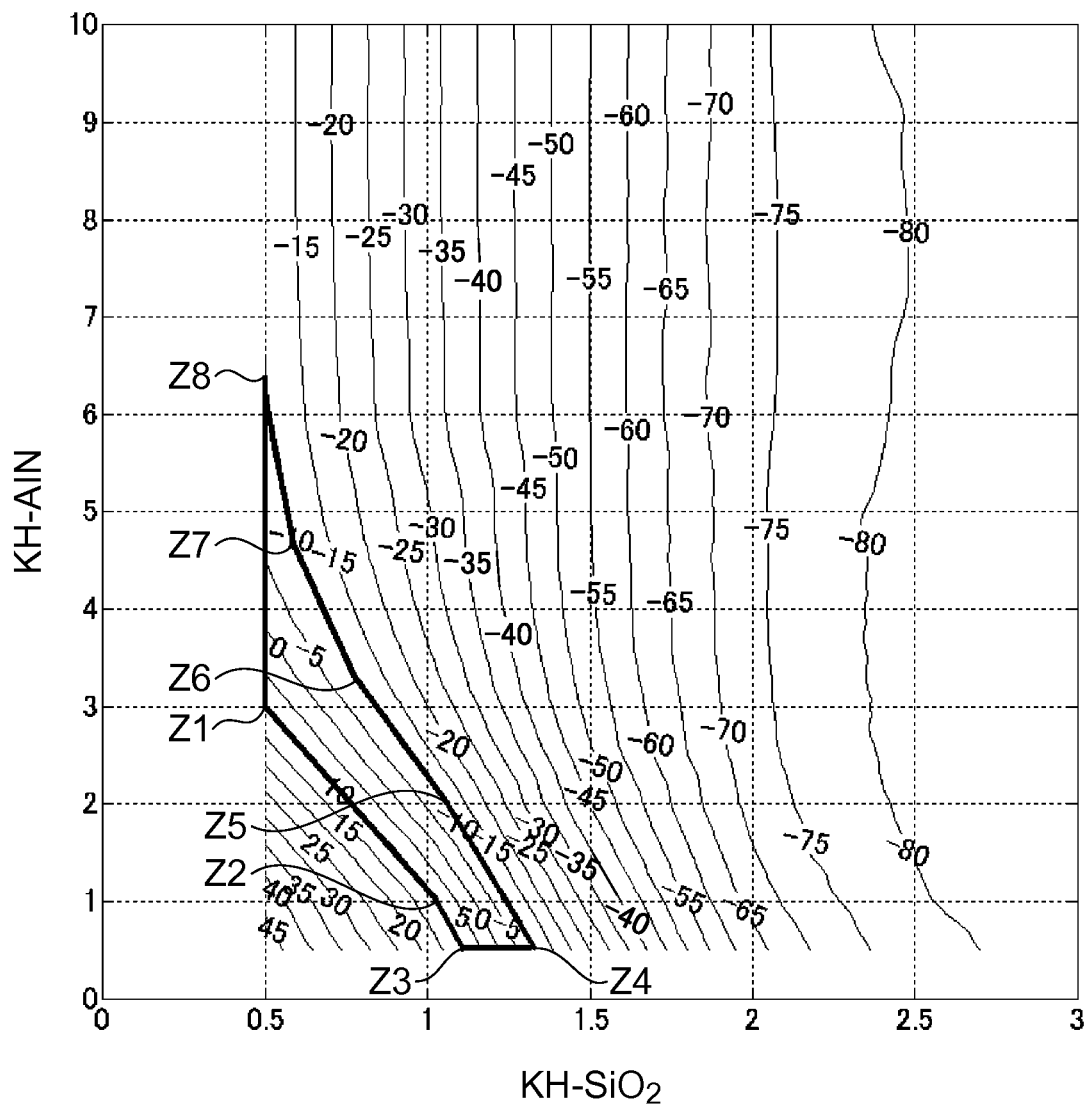
FIG. 28 is a graph showing a relationship between KH—AlN and KH—SiO$_2$, and a delay time temperature coefficient (TCD) according to Example 11.
Figure 29:
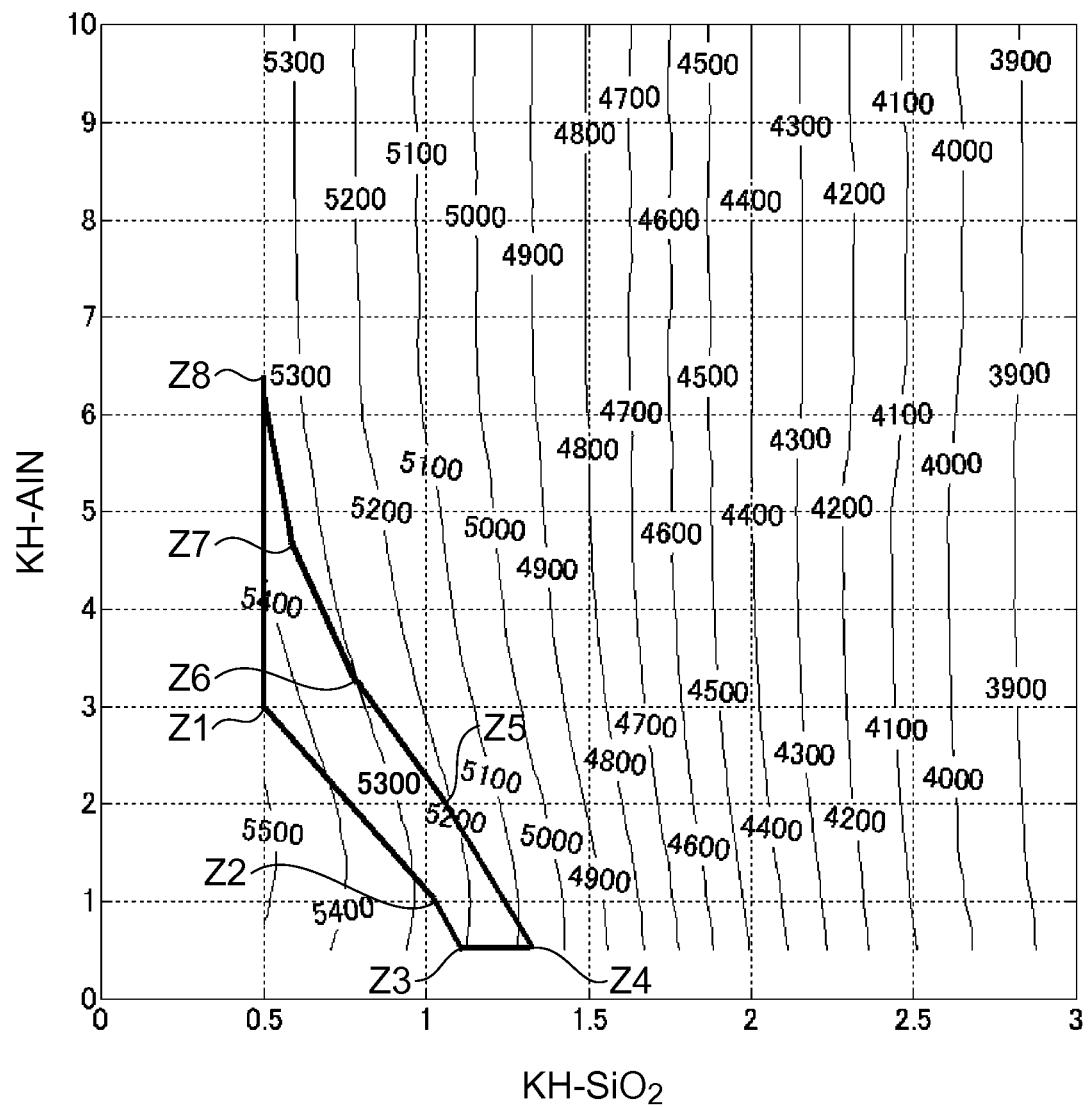
FIG. 29 is a graph showing a relationship between KH—AlN and KH—SiO$_2$, and the acoustic speed of Rayleigh waves propagating on a sapphire substrate according to Example 11.

FIG. 28 is a graph showing a relationship between KH—AlN and KH—SiO₂, and a delay time temperature coefficient (TCD) according to Example 11. FIG. 29 is a graph showing a relationship with the acoustic speed of Rayleigh waves propagating on a sapphire substrate.

When the thickness of the aluminum nitride film 30 is ta, the thickness of the silicon dioxide film 40 is ts, and the wavelength of the surface acoustic waves is λ, the normalized film thickness of the aluminum nitride film 30 is expressed by KH—AlN=(2π/λ)·ta and the normalized film thickness of the silicon dioxide film 40 is expressed by KH—SiO₂=(2π/λ)·ts. When the relationship between the normalized film thicknesses is represented in coordinates, an appropriate area can be represented in the following coordinates. In FIGS. 28 and 29, coordinate 1, coordinate 2, coordinate 3, . . . are represented by Z1, Z2, Z3, . . . .

coordinate 1 (KH—SiO₂,KH—AlN)=(0.50,3.00)
coordinate 2 (KH—SiO₂,KH—AlN)=(1.02,1.00)
coordinate 3 (KH—SiO₂,KH—AlN)=(1.10,0.50)
coordinate 4 (KH—SiO₂,KH—AlN)=(1.32,0.50)
coordinate 5 (KH—SiO₂,KH—AlN)=(1.06,2.00)
coordinate 6 (KH—SiO₂,KH—AlN)=(0.76,3.29)
coordinate 7 (KH—SiO₂,KH—AlN)=(0.59,4.67)
coordinate 8 (KH—SiO₂,KH—AlN)=(0.50,6.38)

KH—AlN and KH—SiO₂ within an area defined by connecting the coordinates in order of the coordinate 1 to the coordinate 8 and connecting the coordinate 8 and the coordinate 1 are used.

It is understood that, within this area, the delay time temperature coefficient (TCD) in a range of −10 ppm/° C. to +10 ppm/° C., and a high acoustic speed equal to or higher than 5000 m/s (equal to or higher than 5100 m/s in most of the range) can be realized, thereby realizing a surface acoustic wave device appropriate to an oscillator in a high frequency band.

Example 12

Next, Example 12 will be described. Example 12 presents a range in which a more excellent delay time temperature coefficient (TCD) is obtained.

Figure 30:
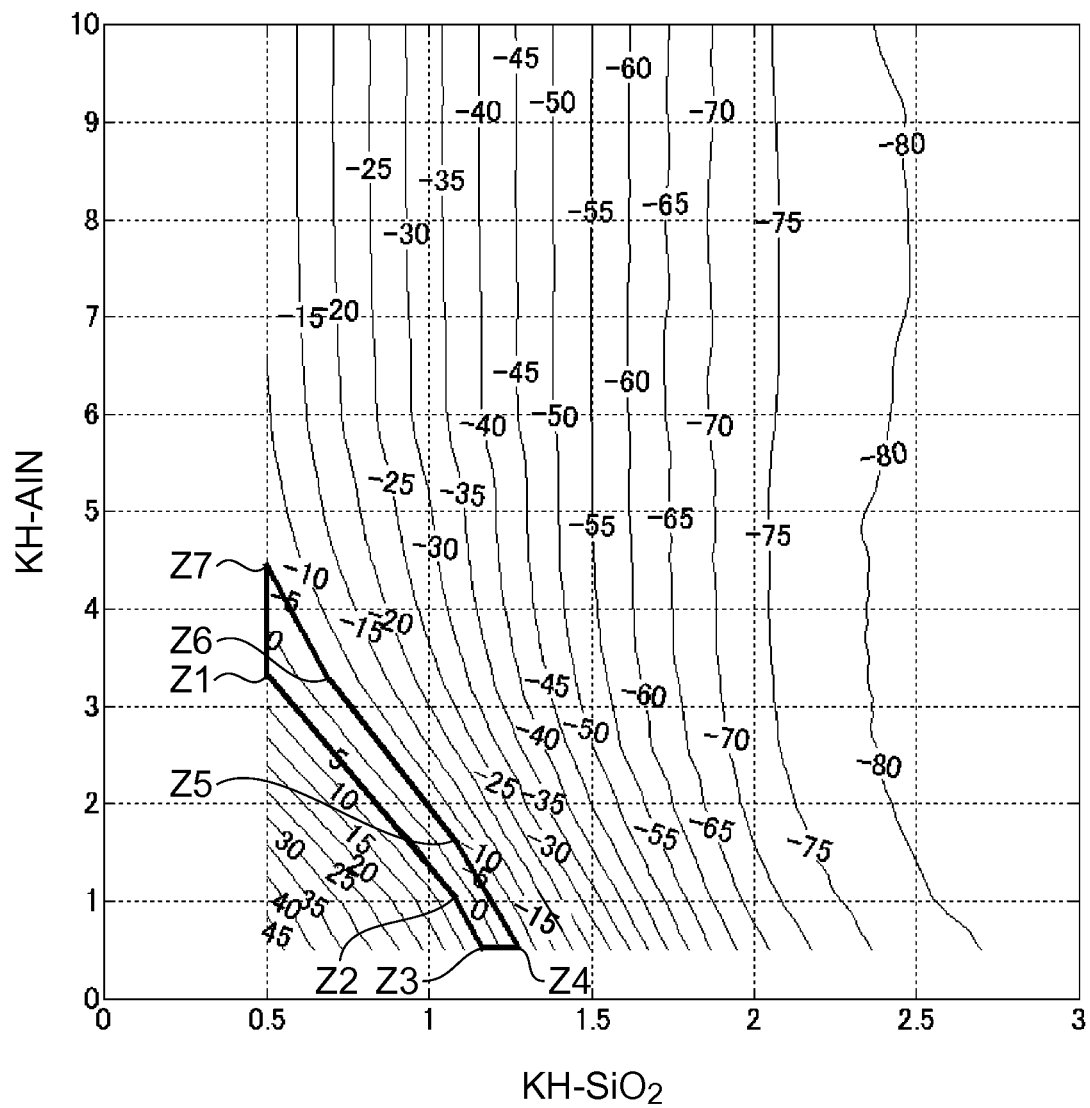
FIG. 30 is a graph showing a relationship between KH—AlN and KH—SiO$_2$, and a delay time temperature coefficient (TCD) according to Example 12.
Figure 31:
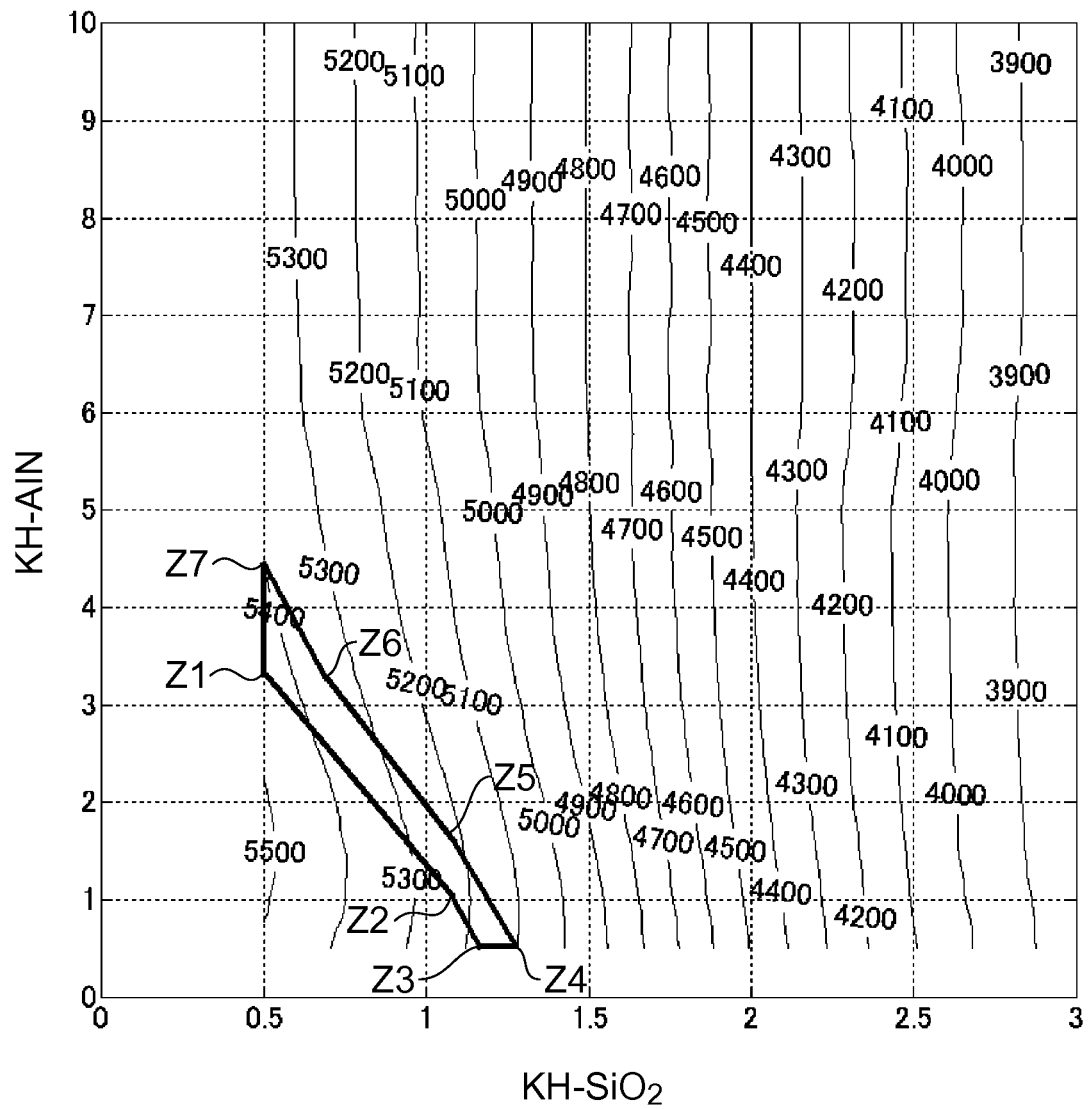
FIG. 31 is a graph showing a relationship between KH—AlN and KH—SiO$_2$, and the acoustic speed of Rayleigh waves propagating on a sapphire substrate according to Example 12.

FIG. 30 is a graph showing a relationship between KH—AlN and KH—SiO$_2$, and a delay time temperature coefficient (TCD) according to Example 12. FIG. 31 is a graph showing a relationship with the acoustic speed of Rayleigh waves propagating on a sapphire substrate.

When the thickness of the aluminum nitride film 30 is ta, the thickness of the silicon dioxide film 40 is ts, and the wavelength of the surface acoustic waves is λ, the normalized film thickness of the aluminum nitride film 30 is expressed by KH—AlN=(2π/λ)·ta and the normalized film thickness of the silicon dioxide film 40 is expressed by KH—SiO$_2$=(2π/λ)·ts. When the relationship between the normalized film thicknesses is represented in coordinates, an appropriate area can be represented in the following coordinates. In FIGS. 30 and 31, coordinate 1, coordinate 2, coordinate 3, . . . are represented by Z1, Z2, Z3, . . . .

coordinate 1 (KH—SiO$_2$,KH—AlN)=(0.50,3.33)
    coordinate 2 (KH—SiO$_2$,KH—AlN)=(1.07,1.04)
    coordinate 3 (KH—SiO$_2$,KH—AlN)=(1.16,0.50)
    coordinate 4 (KH—SiO$_2$,KH—AlN)=(1.27,0.50)
    coordinate 5 (KH—SiO$_2$,KH—AlN)=(1.10,1.58)
    coordinate 6 (KH—SiO$_2$,KH—AlN)=(0.68,3.25)
    coordinate 7 (KH—SiO$_2$,KH—AlN)=(0.50,4.46)

KH—AlN and KH—SiO$_2$ within an area defined by connecting the coordinates in order of the coordinate 1 to the coordinate 7 and connecting the coordinate 7 and the coordinate 1 are used.

Within this area, the delay time temperature coefficient (TCD) is in a range of −5 ppm/°C. to +5 ppm/°C., and a high acoustic speed equal to or higher than 5100 m/s can be realized, thereby realizing a surface acoustic wave device appropriate to an oscillator in a high frequency band in which higher definition is necessary.

Example 13

Next, Example 13 will be described. Example 13 presents a range in which the electromechanical coupling coefficient K$^2$ is preferably equal to or greater than 0.1% through excitation of the surface acoustic wave device.

Figure 32:
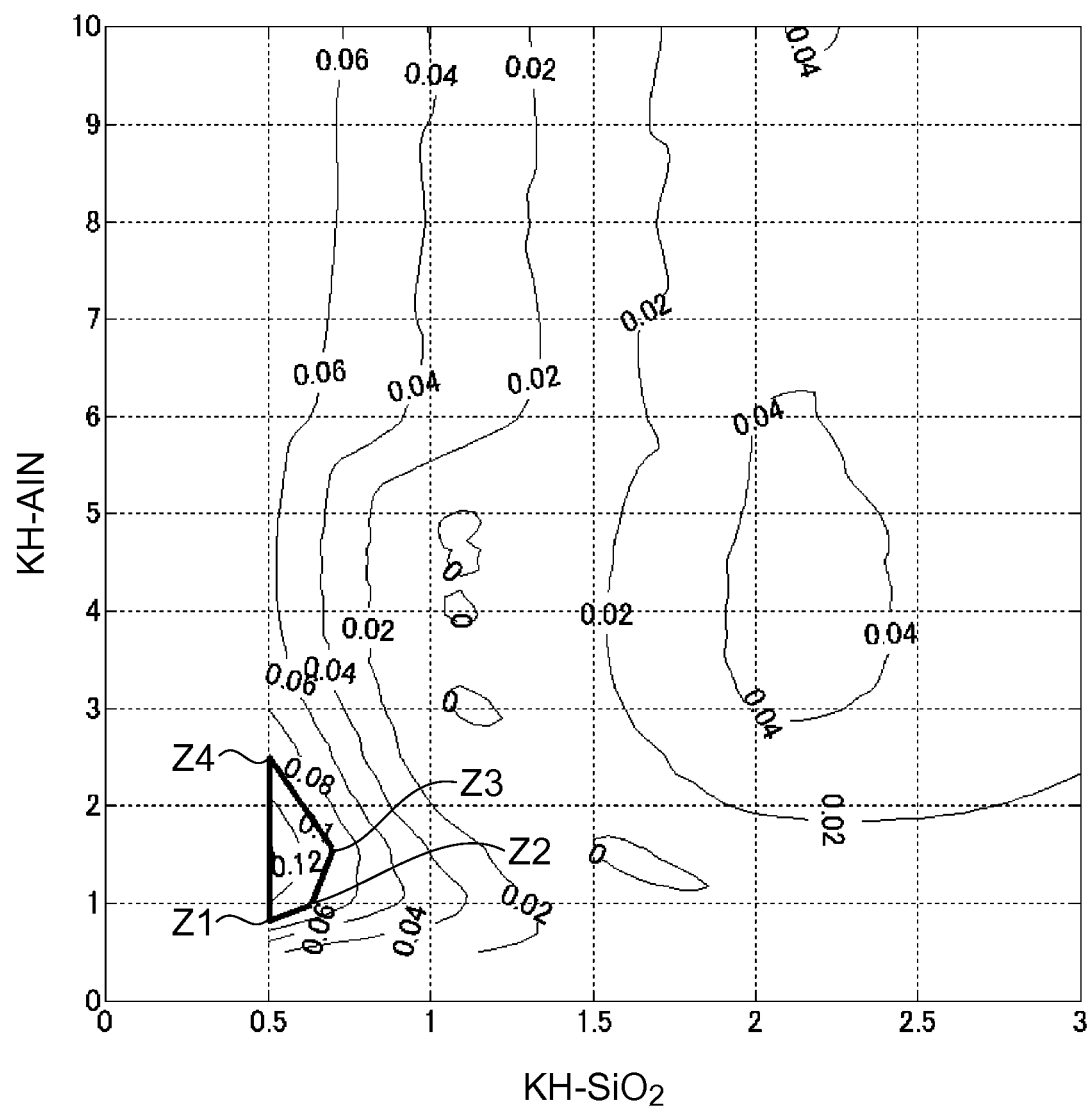
FIG. 32 is a graph showing a relationship between KH—AlN and KH—SiO$_2$, and an electromechanical coupling coefficient $K_2$ according to Example 13.

FIG. 32 is a graph showing a relationship between KH—AlN and KH—SiO$_2$, and an electromechanical coupling coefficient K$^2$ according to Example 13. The numeral described on the contour of FIG. 32 is the electromechanical coupling coefficient K$^2$(%). For example, when KH—SiO$_2$=0.5 and KH—AlN=2, the electromechanical coupling coefficient K$^2$ is equal to or greater than 0.12%.

When the thickness of the aluminum nitride film 30 is ta, the thickness of the silicon dioxide film 40 is ts, and the wavelength of the surface acoustic waves is λ, the normalized film thickness of the aluminum nitride film 30 is expressed by KH—AlN=(2π/λ)·ta and the normalized film thickness of the silicon dioxide film 40 is expressed by KH—SiO$_2$=(2π/λ)·ts. When the relationship between the normalized film thicknesses is represented in coordinates, an appropriate area can be represented in the following coordinates. In FIG. 32, coordinate 1, coordinate 2, coordinate 3, . . . are represented by Z1, Z2, Z3, and Z4.

coordinate 1 (KH—SiO$_2$,KH—AlN)=(0.50,0.83)
    coordinate 2 (KH—SiO$_2$,KH—AlN)=(0.62,1.00)
    coordinate 3 (KH—SiO$_2$,KH—AlN)=(0.70,1.58)
    coordinate 4 (KH—SiO$_2$,KH—AlN)=(0.50,2.50)

KH—AlN and KH—SiO$_2$ within an area defined by connecting the coordinates in order of the coordinate 1 to the coordinate 4 and connecting the coordinate 4 and the coordinate 1 are used.

Within this area, the condition that the electromechanical coupling coefficient K$^2$ is equal to or greater than 0.1% can be satisfied.

If the areas defined by the respective coordinate systems of FIGS. 23 and 32 are combined, within this area, the acoustic speed equal to or higher than 5400 m/s can be realized.

The above-described surface acoustic wave device 1 is sealed with a package, allowing protection from the external environment, such as moisture or dust, and further increasing reliability. Although in the above description, only a one-port resonator shown in FIG. 1 has been described, the invention may be applied to an oscillator in combination with a filter or an integrated circuit device, and a module.

The entire disclosure of Japanese Patent Application No. 2009-297056, filed Dec. 28, 2009 and No. 2010-028615, filed Feb. 12, 2010 and No. 2010-038404, filed Feb. 24, 2010 are expressly incorporated by reference herein.

What is claimed is:

1. A surface acoustic wave device comprising:
   a sapphire substrate having a C-plane main surface;
   an aluminum nitride film which is formed on the main surface of the sapphire substrate;
   comb-like electrodes which are formed on the surface of the aluminum nitride film to excite surface acoustic waves; and
   a silicon dioxide film which covers the comb-like electrodes and a surface of the aluminum nitride film,
   wherein the surface acoustic waves which are excited by the comb-like electrodes are first-order Sezawa waves;
   when a thickness of the aluminum nitride film is ta, a thickness of the silicon dioxide film is ts, and a wavelength of the surface acoustic waves is λ, a relationship between a normalized film thickness of the aluminum nitride film is expressed by KH—AlN=(2λ/λ)·ta and a normalized film thickness of the silicon dioxide film is expressed by KH—SiO$_2$=(2π/λ)·ts; and
   when the normalized film thicknesses are represented by the following coordinates:
   coordinate 1 (KH—SiO$_2$,KH—AlN)=(2.00,0.88)
   coordinate 2 (KH—SiO$_2$ KH—AlN)=(2.50,1.13)
   coordinate 3 (KH—SiO$_2$,KH—AlN)=(2.76,1.42)
   coordinate 4 (KH—SiO$_2$,KH—AlN)=(2.77,1.75)
   coordinate 5 (KH—SiO$_2$,KH—AlN)=(2.60,3.00)
   coordinate 6 (KH—SiO$_2$,KH—AlN)=(2.57,4.00)
   coordinate 7 (KH—SiO$_2$,KH—AlN)=(2.60,5.00)
   coordinate 8 (KH—SiO$_2$,KH—AlN)=(2.74,5.96)
   coordinate 9 (KH—SiO$_2$,KH—AlN)=(2.80,6.83)
   coordinate 10 (KH—SiO$_2$,KH—AlN)=(2.80,7.83)
   coordinate 11 (KH—SiO$_2$,KH—AlN)=(2.82,8.67)
   coordinate 12 (KH—SiO$_2$,KH—AlN)=(2.82,10.00)
   coordinate 13 (KH—SiO$_2$,KH—AlN)=(2.00,10.00),
   KH—AlN and KH—SiO$_2$ are within an area defined by connecting the coordinates in order of the coordinate 1 to the coordinate 13 and connecting the coordinate 13 and the coordinate 1.

2. The surface acoustic wave device according to claim 1, wherein, when the normalized film thicknesses are represented by the following coordinates:
   coordinate 1 (KH—SiO$_2$,KH—AlN)=(2.00,2.25)
   coordinate 2 (KH—SiO$_2$,KH—AlN)=(2.10,1.75)
   coordinate 3 (KH—SiO$_2$,KH—AlN)=(2.17,0.96)
   coordinate 4 (KH—SiO$_2$,KH—AlN)=(2.50,1.13)
   coordinate 5 (KH—SiO$_2$,KH—AlN)=(2.76,1.42)
   coordinate 6 (KH—SiO$_2$,KH—AlN)=(2.77,1.75)
   coordinate 7 (KH—SiO$_2$,KH—AlN)=(2.60,3.00)
   coordinate 8 (KH—SiO$_2$,KH—AlN)=(2.57,4.00)
   coordinate 9 (KH—SiO$_2$,KH—AlN)=(2.60,4.67)

coordinate 10 (KH—SiO$_2$,KH—AlN)=(2.51,5.00)
coordinate 11 (KH—SiO$_2$,KH—AlN)=(2.51,5.33)
coordinate 12 (KH—SiO$_2$,KH—AlN)=(2.61,5.92)
coordinate 13 (KH—SiO$_2$,KH—AlN)=(2.61,7.00)
coordinate 14 (KH—SiO$_2$,KH—AlN)=(2.46,7.83)
coordinate 15 (KH—SiO$_2$,KH—AlN)=(2.45,10.00)
coordinate 16 (KH—SiO$_2$,KH—AlN)=(2.00,10.00),
KH—AlN and KH—SiO$_2$ are within an area defined by connecting the coordinates in order of the coordinate 1 to the coordinate 16 and connecting the coordinate 16 and the coordinate 1.

3. The surface acoustic wave device according to claim 1, wherein, when the normalized film thicknesses are represented by the following coordinates:
coordinate 1 (KH—SiO$_2$,KH—AlN)=(2.00,3.46)
coordinate 2 (KH—SiO$_2$,KH—AlN)=(2.27,2.00)
coordinate 3 (KH—SiO$_2$,KH—AlN)=(2.50,1.13)
coordinate 4 (KH—SiO$_2$,KH—AlN)=(2.76,1.42)
coordinate 5 (KH—SiO$_2$,KH—AlN)=(2.77,1.75)
coordinate 6 (KH—SiO$_2$,KH—AlN)=(2.62,2.83)
coordinate 7 (KH—SiO$_2$,KH—AlN)=(2.41,3.50)
coordinate 8 (KH—SiO$_2$,KH—AlN)=(2.00,5.92),
KH—AlN and KH—SiO$_2$ are within an area defined by connecting the coordinates in order of the coordinate 1 to the coordinate 8 and connecting the coordinate 8 and the coordinate 1.

4. The surface acoustic wave device according to claim 1, wherein, when the normalized film thicknesses are represented by the following coordinates:
coordinate 1 (KH—SiO$_2$,KH—AlN)=(2.00,3.96)
coordinate 2 (KH—SiO$_2$,KH—AlN)=(2.39,2.00)
coordinate 3 (KH—SiO$_2$,KH—AlN)=(2.64,1.33)
coordinate 4 (KH—SiO$_2$,KH—AlN)=(2.76,1.42)
coordinate 5 (KH—SiO$_2$,KH—AlN)=(2.77,1.75)
coordinate 6 (KH—SiO$_2$,KH—AlN)=(2.72,2.13)
coordinate 7 (KH—SiO$_2$,KH—AlN)=(2.50,2.58)
coordinate 8 (KH—SiO$_2$,KH—AlN)=(2.28,3.58)
coordinate 9 (KH—SiO$_2$,KH—AlN)=(2.00,5.13),
KH—AlN and KH—SiO$_2$ are within an area defined by connecting the coordinates in order of the coordinate 1 to the coordinate 9 and connecting the coordinate 9 and the coordinate 1.

5. An oscillator using the surface acoustic wave device according to claim 1.

6. A module apparatus using the surface acoustic wave device according to claim 1.

7. A surface acoustic wave device comprising:
a sapphire substrate having a C-plane main surface;
an aluminum nitride film which is formed on the main surface of the sapphire substrate;
comb-like electrodes which are formed on the surface of the aluminum nitride film to excite surface acoustic waves; and
a silicon dioxide film which covers the comb-like electrodes and a surface of the aluminum nitride film,
wherein the surface acoustic waves which are excited by the comb-like electrodes are the second-order mode of Sezawa waves,
when a thickness of the aluminum nitride film is ta, a thickness of the silicon dioxide film is ts, and a wavelength of the surface acoustic waves is λ, a relationship between a normalized film thickness of the aluminum nitride film is expressed by KH—AlN=(2π/λ)·ta and a normalized film thickness of the silicon dioxide film is expressed by KH—SiO$_2$=(2π/λ)·ts; and when the normalized film thicknesses are represented in the following coordinates:
coordinate 1 (KH—SiO$_2$,KH—AlN)=(4.50,1.00)
coordinate 2 (KH—SiO$_2$,KH—AlN)=(5.00,1.00)
coordinate 3 (KH—SiO$_2$,KH—AlN)=(5.41,1.17)
coordinate 4 (KH—SiO$_2$,KH—AlN)=(5.72,1.50)
coordinate 5 (KH—SiO$_2$,KH—AlN)=(5.72,1.79)
coordinate 6 (KH—SiO$_2$,KH—AlN)=(5.50,3.00)
coordinate 7 (KH—SiO$_2$,KH—AlN)=(5.44,3.67)
coordinate 8 (KH—SiO$_2$,KH—AlN)=(5.44,4.54)
coordinate 9 (KH—SiO$_2$,KH—AlN)=(5.57,6.75)
coordinate 10 (KH—SiO$_2$,KH—AlN)=(5.57,7.38)
coordinate 11 (KH—SiO$_2$,KH—AlN)=(5.63,8.63)
coordinate 12 (KH—SiO$_2$,KH—AlN)=(5.66,10.00)
coordinate 13 (KH—SiO$_2$,KH—AlN)=(4.50,10.00),
KH—AlN and KH—SiO$_2$ are within an area defined by connecting the coordinates in order of the coordinate 1 to the coordinate 13 and connecting the coordinate 13 and the coordinate 1.

8. The surface acoustic wave device according to claim 7, when, the normalized film thicknesses are represented in the following coordinates:
coordinate 1 (KH—SiO$_2$,KH—AlN)=(4.50,2.33)
coordinate 2 (KH—SiO$_2$,KH—AlN)=(4.77,1.83)
coordinate 3 (KH—SiO$_2$,KH—AlN)=(5.00,1.54)
coordinate 4 (KH—SiO$_2$,KH—AlN)=(5.21,1.08)
coordinate 5 (KH—SiO$_2$,KH—AlN)=(5.41,1.17)
coordinate 6 (KH—SiO$_2$,KH—AlN)=(5.72,1.50)
coordinate 7 (KH—SiO$_2$,KH—AlN)=(5.72,1.79)
coordinate 8 (KH—SiO$_2$,KH—AlN)=(5.50,3.00)
coordinate 9 (KH—SiO$_2$,KH—AlN)=(5.44,3.67)
coordinate 10 (KH—SiO$_2$,KH—AlN)=(5.44,4.54)
coordinate 11 (KH—SiO$_2$,KH—AlN)=(5.52,6.00)
coordinate 12 (KH—SiO$_2$,KH—AlN)=(5.39,6.67)
coordinate 13 (KH—SiO$_2$,KH—AlN)=(5.39,7.08)
coordinate 14 (KH—SiO$_2$,KH—AlN)=(5.15,7.83)
coordinate 15 (KH—SiO$_2$,KH—AlN)=(4.91,10.00)
coordinate 16 (KH—SiO$_2$,KH—AlN)=(4.50,10.00),
KH—AlN and KH—SiO$_2$ are within an area defined by connecting the coordinates in order of the coordinate 1 to the coordinate 16 and connecting the coordinate 16 and the coordinate 1.

9. The surface acoustic wave device according to claim 7, wherein, when the normalized film thicknesses are represented in the following coordinates:
coordinate 1 (KH—SiO$_2$,KH—AlN)=(4.50,3.33)
coordinate 2 (KH—SiO$_2$,KH—AlN)=(4.84,2.71)
coordinate 3 (KH—SiO$_2$,KH—AlN)=(5.65,1.48)
coordinate 4 (KH—SiO$_2$,KH—AlN)=(5.72,1.50)
coordinate 5 (KH—SiO$_2$,KH—AlN)=(5.72,1.79)
coordinate 6 (KH—SiO$_2$,KH—AlN)=(5.50,3.00)
coordinate 7 (KH—SiO$_2$,KH—AlN)=(5.44,3.67)
coordinate 8 (KH—SiO$_2$,KH—AlN)=(5.00,4.42)
coordinate 9 (KH—SiO$_2$,KH—AlN)=(4.66,5.17)
coordinate 10 (KH—SiO$_2$,KH—AlN)=(4.50,5.38),
KH—AlN and KH—SiO$_2$ are within an area defined by connecting the coordinates in order of the coordinate 1 to the coordinate 10 and connecting the coordinate 10 and the coordinate 1.

10. The surface acoustic wave device according to claim 7, wherein, when the normalized film thicknesses are represented in the following coordinates:
coordinate 1 (KH—SiO$_2$,KH—AlN)=(4.50,3.75)
coordinate 2 (KH—SiO$_2$,KH—AlN)=(5.10,2.75)
coordinate 3 (KH—SiO$_2$,KH—AlN)=(5.72,1.79)
coordinate 4 (KH—SiO$_2$,KH—AlN)=(5.50,3.00)

coordinate 5 (KH—SiO$_2$,KH—AlN)=(5.00,3.83)
coordinate 6 (KH—SiO$_2$,KH—AlN)=(4.50,4.75),
KH—AlN and KH—SiO$_2$ are within an area defined by connecting the coordinates in order of the coordinate 1 to the coordinate 6 and connecting the coordinate 6 and the coordinate 1.

11. An oscillator using the surface acoustic wave device according to claim 7.

12. A module apparatus using the surface acoustic wave device according to claim 7.

13. A surface acoustic wave device comprising:
a sapphire substrate having a C-plane main surface;
an aluminum nitride film which is formed on the main surface of the sapphire substrate;
comb-like electrodes which are formed on the surface of the aluminum nitride film to excite surface acoustic waves; and
a silicon dioxide film which covers the comb-like electrodes and a surface of the aluminum nitride film,
wherein the surface acoustic waves which are excited by the comb-like electrodes are the fundamental mode of Rayleigh waves,
when a thickness of the aluminum nitride film is ta, a thickness of the silicon dioxide film is ts, and a wavelength of the surface acoustic waves is $\lambda$, a relationship between a normalized film thickness of the aluminum nitride film is expressed by KH—AlN=($2\pi/\lambda$)·ta and a normalized film thickness of the silicon dioxide film is expressed by KH—SiO$_2$=($2\pi/\lambda$)·ts; and
when the normalized film thicknesses are represented in the following coordinates:
coordinate 1 (KH—SiO$_2$,KH—AlN)=(0.50,1.25)
coordinate 2 (KH—SiO$_2$,KH—AlN)=(0.65,0.50)
coordinate 3 (KH—SiO$_2$,KH—AlN)=(1.67,0.50)
coordinate 4 (KH—SiO$_2$,KH—AlN)=(1.44,1.83)
coordinate 5 (KH—SiO$_2$,KH—AlN)=(1.29,3.00)
coordinate 6 (KH—SiO$_2$,KH—AlN)=(1.22,4.00)
coordinate 7 (KH—SiO$_2$,KH—AlN)=(1.20,5.29)
coordinate 8 (KH—SiO$_2$,KH—AlN)=(1.18,6.00)
coordinate 9 (KH—SiO$_2$,KH—AlN)=(1.18,10.00)
coordinate 10 (KH—SiO$_2$,KH—AlN)=(0.50,10.00),
KH—AlN and KH—SiO$_2$ are within an area defined by connecting the coordinates in order of the coordinate 1 to the coordinate 10 and connecting the coordinate 10 and the coordinate 1.

14. The surface acoustic wave device according to claim 13,
wherein, when the normalized film thicknesses are represented in the following coordinates:
coordinate 1 (KH—SiO$_2$,KH—AlN)=(0.50,2.37)
coordinate 2 (KH—SiO$_2$,KH—AlN)=(0.89,1.00)
coordinate 3 (KH—SiO$_2$,KH—AlN)=(0.98,0.50)
coordinate 4 (KH—SiO$_2$,KH—AlN)=(1.43,0.50)
coordinate 5 (KH—SiO$_2$,KH—AlN)=(1.00,3.00)
coordinate 6 (KH—SiO$_2$,KH—AlN)=(0.85,4.00)
coordinate 7 (KH—SiO$_2$,KH—AlN)=(0.72,6.00)
coordinate 8 (KH—SiO$_2$,KH—AlN)=(0.70,10.00)
coordinate 9 (KH—SiO$_2$,KH—AlN)=(0.50,10.00),
KH—AlN and KH—SiO$_2$ are within an area defined by connecting the coordinates in order of the coordinate 1 to the coordinate 9 and connecting the coordinate 9 and the coordinate 1.

15. The surface acoustic wave device according to claim 13,
wherein, when the normalized film thicknesses are represented in the following coordinates:
coordinate 1 (KH—SiO$_2$,KH—AlN)=(0.50,3.00)
coordinate 2 (KH—SiO$_2$,KH—AlN)=(1.02,1.00)
coordinate 3 (KH—SiO$_2$,KH—AlN)=(1.10,0.50)
coordinate 4 (KH—SiO$_2$,KH—AlN)=(1.32,0.50)
coordinate 5 (KH—SiO$_2$,KH—AlN)=(1.06,2.00)
coordinate 6 (KH—SiO$_2$,KH—AlN)=(0.76,3.29)
coordinate 7 (KH—SiO$_2$,KH—AlN)=(0.59,4.67)
coordinate 8 (KH—SiO$_2$,KH—AlN)=(0.50,6.38),
KH—AlN and KH—SiO$_2$ are within an area defined by connecting the coordinates in order of the coordinate 1 to the coordinate 8 and connecting the coordinate 8 and the coordinate 1.

16. The surface acoustic wave device according to claim 13,
wherein, when the normalized film thicknesses are represented in the following coordinates:
coordinate 1 (KH—SiO$_2$,KH—AlN)=(0.50,3.33)
coordinate 2 (KH—SiO$_2$,KH—AlN)=(1.07,1.04)
coordinate 3 (KH—SiO$_2$,KH—AlN)=(1.16,0.50)
coordinate 4 (KH—SiO$_2$,KH—AlN)=(1.27,0.50)
coordinate 5 (KH—SiO$_2$,KH—AlN)=(1.10,1.58)
coordinate 6 (KH—SiO$_2$,KH—AlN)=(0.68,3.25)
coordinate 7 (KH—SiO$_2$,KH—AlN)=(0.50,4.46),
KH—AlN and KH—SiO$_2$ are within an area defined by connecting the coordinates in order of the coordinate 1 to the coordinate 7 and connecting the coordinate 7 and the coordinate 1.

17. An oscillator using the surface acoustic wave device according to claim 13.

18. A module apparatus using the surface acoustic wave device according to claim 13.

* * * * *